(12) United States Patent
Suzuki et al.

(10) Patent No.: US 11,482,269 B2
(45) Date of Patent: Oct. 25, 2022

(54) SEMICONDUCTOR MEMORY DEVICE

(71) Applicant: Kioxia Corporation, Tokyo (JP)

(72) Inventors: Kunifumi Suzuki, Yokkaichi (JP); Kiwamu Sakuma, Yokkaichi (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/199,726

(22) Filed: Mar. 12, 2021

(65) Prior Publication Data
US 2022/0093151 A1 Mar. 24, 2022

(30) Foreign Application Priority Data
Sep. 23, 2020 (JP) .............................. JP2020-158205

(51) Int. Cl.
*G11C 11/22* (2006.01)
*H01L 27/11514* (2017.01)
*H01L 27/11597* (2017.01)

(52) U.S. Cl.
CPC ........ *G11C 11/2275* (2013.01); *G11C 11/221* (2013.01); *G11C 11/223* (2013.01); *G11C 11/2273* (2013.01); *G11C 11/2277* (2013.01); *H01L 27/11514* (2013.01); *H01L 27/11597* (2013.01)

(58) Field of Classification Search
None
See application file for complete search history.

(56) References Cited

U.S. PATENT DOCUMENTS

| 5,835,399 | A | 11/1998 | Jeon |
| 10,096,619 | B2 | 10/2018 | Ino et al. |
| 10,163,933 | B1 | 12/2018 | Richter et al. |
| 10,636,468 | B2 | 4/2020 | Higashi et al. |
| 2018/0033478 | A1* | 2/2018 | Tanaka ................ G11C 11/4091 |
| 2019/0295626 | A1* | 9/2019 | Ikeda .................. G11C 11/4094 |

FOREIGN PATENT DOCUMENTS

| JP | 2003-297073 A | 10/2003 |
| JP | 2004-303333 A | 10/2004 |
| JP | 2019-160374 A | 9/2019 |
| JP | 2020-098844 A | 6/2020 |

* cited by examiner

*Primary Examiner* — Tan T. Nguyen
(74) *Attorney, Agent, or Firm* — Oblon, McClelland, Maier & Neustadt, L.L.P.

(57) ABSTRACT

A semiconductor memory device includes a first memory transistor, a first memory capacitor, and a control circuit connected to them. The first memory transistor includes a first gate electrode, a first semiconductor layer, and a first insulating film containing an insulating material. The first memory capacitor includes a first electrode, a second electrode, and a second insulating film containing the insulating material of the first insulating film. The control circuit is configured to perform a first program operation that supplies the first gate electrode with a first program voltage, a second program operation that supplies the first gate electrode with a second program voltage larger than the first program voltage, and a first read operation that supplies at least one of the first electrode or the second electrode with a voltage. The control circuit performs the first or the second program operation after performing the first read operation.

6 Claims, 58 Drawing Sheets

SEMICONDUCTOR MEMORY DEVICE

CROSS-REFERENCE TO RELATED APPLICATIONS

This application is based upon and claims the benefit of Japanese Patent Application No. 2020-158205, filed on Sep. 23, 2020, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of gate electrodes stacked in a direction intersecting with a surface of this substrate, a semiconductor layer opposed to the plurality of gate electrodes, and a gate insulating film disposed between the gate electrodes and the semiconductor layer. For example, the gate insulating film includes a memory unit, such as a film of ferroelectric, that can store data.

DETAILED DESCRIPTION

Figure 1:
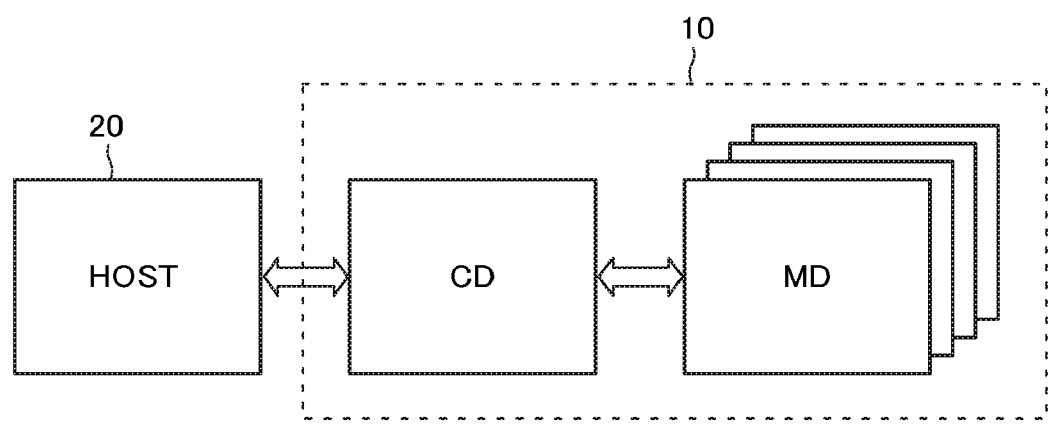
FIG. 1 is a schematic block diagram illustrating a configuration of a memory system 10 according to a first embodiment.

A semiconductor memory device according to one embodiment includes a first memory transistor, a first memory capacitor, and a control circuit connected to the first memory transistor and the first memory capacitor. The first memory transistor includes: a first gate electrode; a first semiconductor layer opposed to the first gate electrode; and a first insulating film disposed between the first gate electrode and the first semiconductor layer and containing an insulating material. The first memory capacitor includes: a first electrode; a second electrode opposed to the first electrode; and a second insulating film disposed between the first electrode and the second electrode, the second insulating film containing the insulating material of the first insulating film. The control circuit is configured to perform: a first program operation that supplies the first gate electrode with a first program voltage; a second program operation that supplies the first gate electrode with a second program voltage larger than the first program voltage; a first read operation that supplies at least one of the first electrode or the second electrode with a voltage. The control circuit performs the first program operation or the second program operation after performing the first read operation.

A semiconductor memory device according to one embodiment includes a first memory transistor, a first memory capacitor, and a control circuit connected to the first memory transistor and the first memory capacitor. The first memory transistor includes: a first gate electrode; a first semiconductor layer opposed to the first gate electrode; and a first insulating film disposed between the first gate electrode and the first semiconductor layer. The first memory capacitor includes: a first electrode; a second electrode opposed to the first electrode; and a second insulating film disposed between the first electrode and the second electrode, the second insulating film containing a material common to the first insulating film. The control circuit is configured to perform: a first erase operation that supplies the first memory transistor with a first erase voltage; a second erase operation that supplies the first memory transistor with a second erase voltage larger than the first erase voltage; and a first read operation that supplies at least one of the first electrode and the second electrode with a voltage. The control circuit performs the first erase operation or the second erase operation after performing the first read operation.

A semiconductor memory device according to one embodiment includes a first memory transistor, a second memory transistor, a first memory capacitor, and a control circuit connected to the first memory transistor, the second memory transistor, and the first memory capacitor. The first memory transistor includes: a first gate electrode; a first semiconductor layer opposed to the first gate electrode; and a first insulating film disposed between the first gate electrode and the first semiconductor layer. The second memory transistor includes: a second gate electrode; a second semiconductor layer opposed to the second gate electrode; and a second insulating film disposed between the second gate electrode and the second semiconductor layer. The first memory capacitor includes: a first electrode; a second electrode opposed to the first electrode; and a third insulating film disposed between the first electrode and the second electrode, the third insulating film containing a material common to the first insulating film. The control circuit performs: a first read operation that supplies at least one of the first electrode and the second electrode with a voltage; a second read operation that supplies the first gate electrode with a read voltage after performing the first read operation; a program operation that supplies the second gate electrode with a program voltage larger than the read voltage after performing the second read operation; and a refresh operation that supplies the first memory transistor with a voltage larger than the program voltage after performing the program operation.

Next, semiconductor memory devices according to embodiments are described in detail with reference to the accompanying drawings. The following embodiments are only examples, and are not described for the purpose of limiting the present invention. The following drawings are schematic, and forsake of convenience, apart of a configuration and the like is sometimes omitted. Parts common in a plurality of embodiments are attached by same reference numerals and their descriptions may be omitted.

In this specification, when referring to "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when referring to "control circuit", it may mean a peripheral circuit, such as a sequencer, disposed in a memory die, it may mean a controller die, a controller chip, or the like connected to a memory die, or it may mean a configuration including both of them.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

First Embodiment

[Memory System 10]

FIG. 1 is a schematic block diagram illustrating a configuration of the memory system 10 according to the first embodiment.

The memory system 10, for example, reads, writes, and erases user data in response to a signal transmitted from a host computer 20. The memory system 10 is, for example, any system that can store the user data including a memory chip, a memory card, and an SSD. The memory system 10 includes a plurality of memory dies MD that store the user data and a controller die CD connected to the plurality of memory dies MD and the host computer 20. The controller die CD includes, for example, a processor, a RAM, and the like, and performs a process, such as conversion between a logical address and a physical address, bit error detection/correction, a garbage collection (compaction), and a wear leveling.

Figure 2:
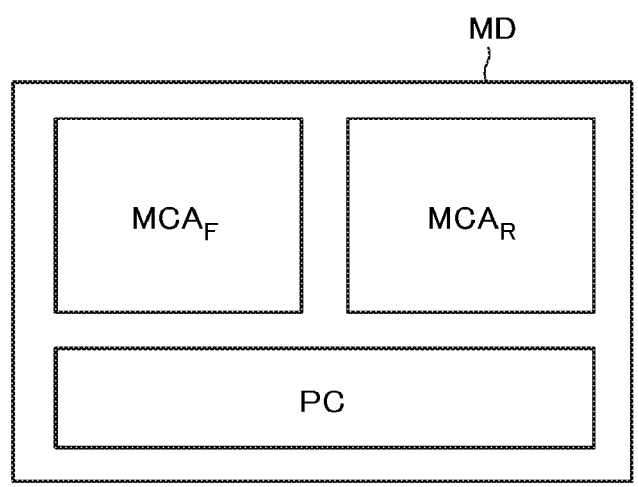
FIG. 2 is a schematic block diagram illustrating a configuration of a part of a memory die MD.

FIG. 2 is a schematic block diagram illustrating a configuration of a part of the memory die MD.

The memory die MD includes a memory cell array $MCA_F$, a memory cell array $MCA_R$, and a peripheral circuit PC connected to these memory cell arrays $MCA_F$, $MCA_R$. The memory cell array $MCA_F$ is used for storing user data. The memory cell array $MCA_R$ is used for storing a state of memory cells in the memory cell array $MCA_F$.

Figure 3:
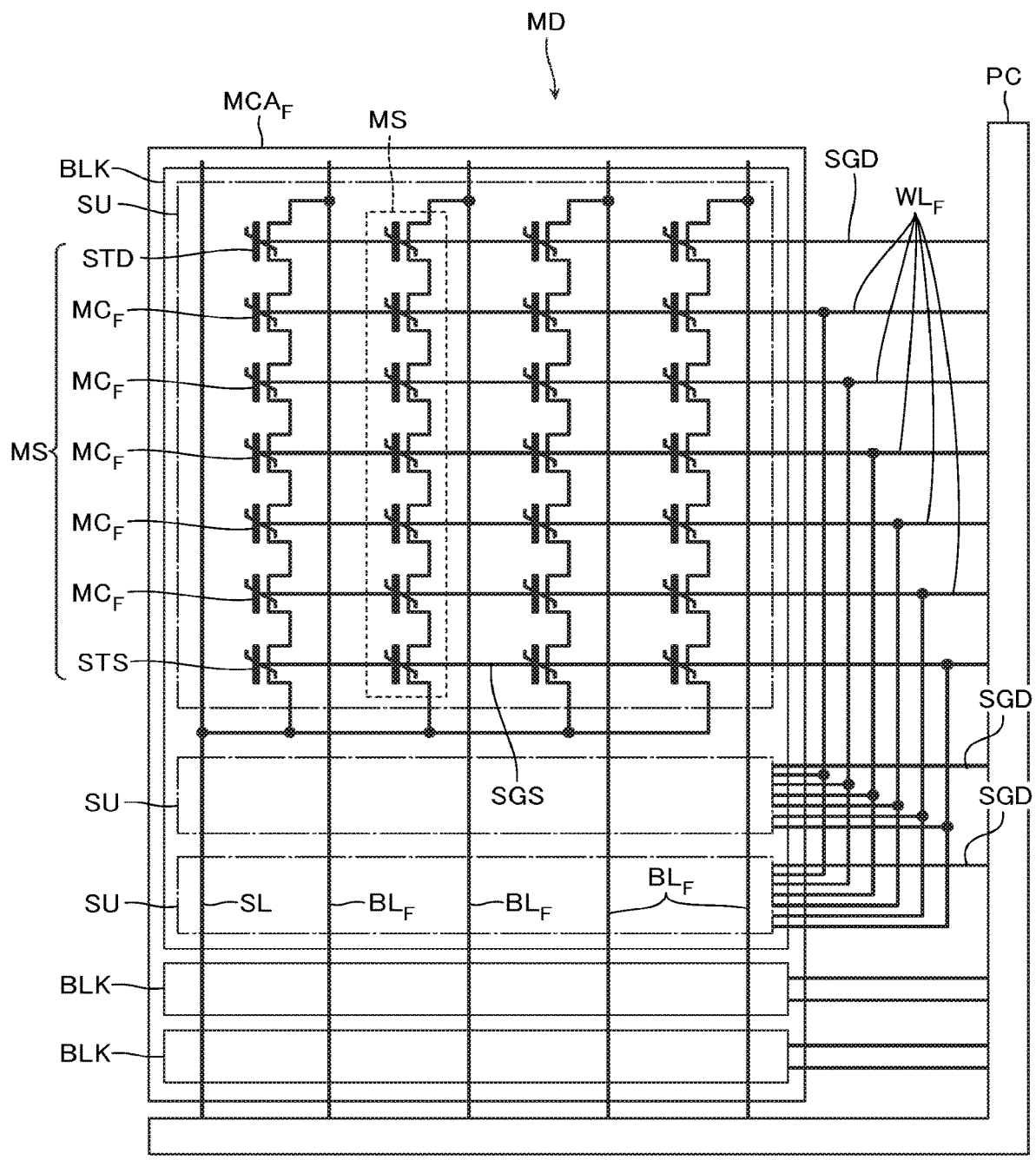
FIG. 3 is a schematic circuit diagram illustrating a configuration of a part of the memory die MD.

FIG. 3 is a schematic circuit diagram illustrating a configuration of a part of the memory cell array $MCA_F$.

The memory cell array $MCA_F$ includes a plurality of memory blocks BLK. The plurality of memory blocks BLK each include a plurality of string units SU. The plurality of string units SU each include a plurality of memory strings MS. The plurality of memory strings MS have one ends each connected to the peripheral circuit PC via a bit line $BL_F$. The plurality of memory strings MS have other ends each connected to the peripheral circuit PC via a common source line SL.

The memory string MS includes a drain-side select transistor STD, a plurality of memory cells $MC_F$ (memory transistors), and a source-side select transistor STS, which are connected in series between the bit line $BL_F$ and the source line SL.

The memory cell $MC_F$ is a field-effect type transistor including a semiconductor layer that functions as a channel region, a gate insulating film including a memory unit, and a gate electrode. The memory cell $MC_F$ has a threshold voltage that changes according to the state of the memory unit. The memory cell $MC_F$ stores one bit or a plurality of bits of data. Word lines $WL_F$ are connected to respective gate electrodes of the plurality of memory cells $MC_F$ corresponding to one memory string MS. These respective word lines $WL_F$ are connected to all of the memory strings MS in one memory block BLK in common.

The select transistor (STD, STS) is a field-effect type transistor including a semiconductor layer that functions as a channel region, a gate insulating film, and a gate electrode. Select gate lines (SGD, SGS) are connected to the respective gate electrodes of the select transistors (STD, STS). The drain-side select gate line SGD is disposed corresponding to the string unit SU and connected to all of the memory strings MS in one string unit SU in common. The source-side select gate line SGS is connected to all of the memory strings MS in the plurality of string units SU in common.

Figure 4:
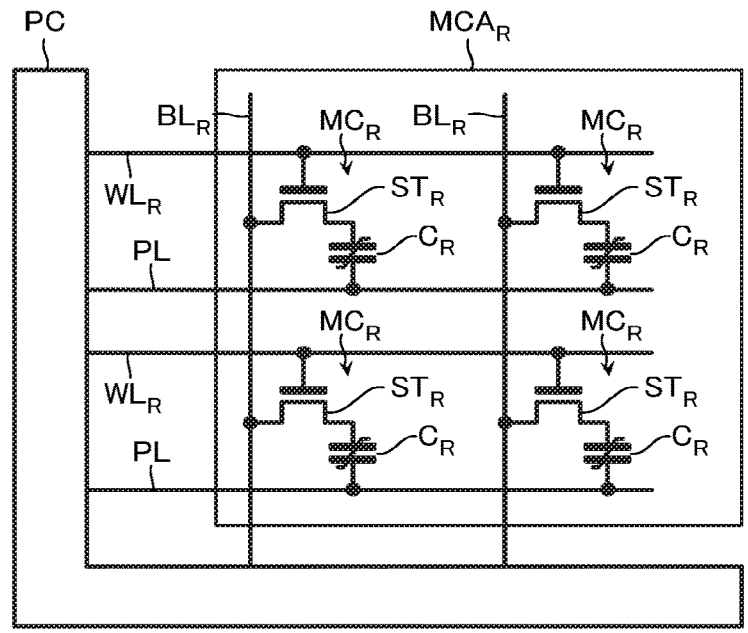
FIG. 4 is a schematic circuit diagram illustrating a configuration of a part of the memory die MD.

FIG. 4 is a schematic circuit diagram illustrating a configuration of a part of the memory cell array $MCA_R$.

The memory cell array $MCA_R$ includes a plurality of bit lines $BL_R$, a plurality of word lines $WL_R$, a plurality of plate lines PL, a plurality of memory cells $MC_R$ connected to the plurality of bit lines $BL_R$, the plurality word lines $WL_R$, and the plurality of plate lines PL. The plurality of respective memory cells $MC_R$ connected to one word line $WL_R$ are connected to the mutually different bit lines $BL_R$. The plurality of respective memory cells $MC_R$ connected to one bit line $BL_R$ are connected to the mutually different word lines $WL_R$.

The memory cells $MC_R$ each include a select transistor $ST_R$ and a capacitor $C_R$ connected in series between the bit line $BL_R$ and the plate line PL.

The select transistor $ST_R$ is a field-effect type transistor that includes a semiconductor layer functioning as a channel region, a gate insulating film, and agate electrode. To each of the gate electrodes of the select transistors $ST_R$, the word line $WL_R$ is connected.

The capacitor $C_R$ is a capacitor including a pair of electrodes and an insulating film including a memory unit.

For example, the peripheral circuit PC includes a voltage generation circuit that generates an operating voltage and outputs it to a voltage supply line, a decode circuit that electrically conducts a desired voltage supply line with each wiring in the memory cell array $MCA_F$ (the bit line $BL_F$, the source, line SL, the word line $WL_F$, and the select gate line (SGD, SGS)) and each wiring in the memory cell array $MCA_R$ (the bit line $BL_R$, the word line $WL_R$, and the plate line PL), a sense amplifier circuit that senses a current or a voltage of the bit lines $BL_F$, $BL_R$, and the like.

Figure 5:
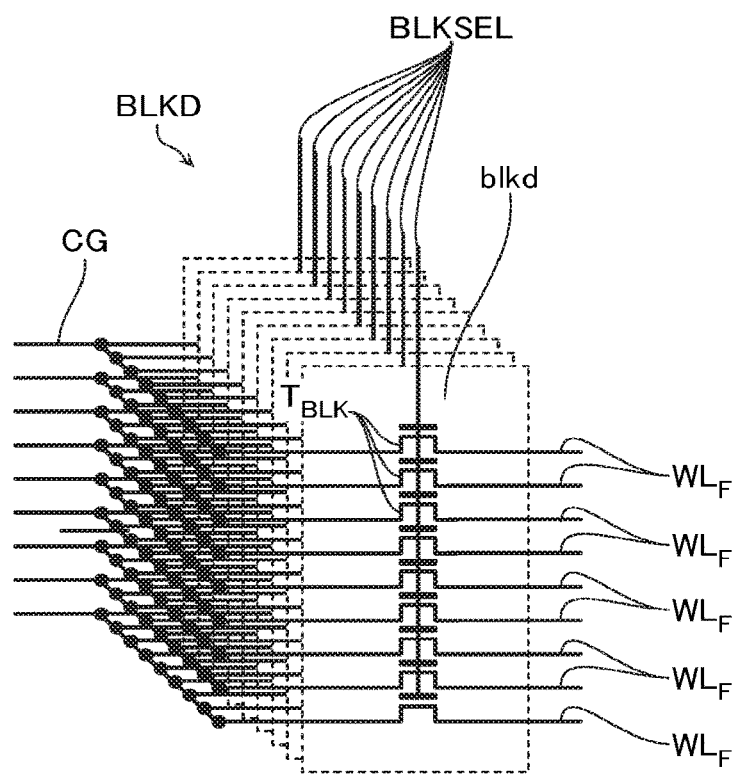
FIG. 5 is a schematic circuit diagram illustrating a configuration of a part of the memory die MD.

FIG. 5 is a schematic circuit diagram illustrating a configuration of a part of the peripheral circuit PC. FIG. 5 illustrates a block decoder BLKD electrically connected to the word lines $WL_F$.

The block decoder BLKD includes a plurality of block decode units blkd disposed corresponding to the plurality of memory blocks BLK in the memory cell array $MCA_F$. The block decode unit blkd includes a plurality of transistors $T_{BLK}$ disposed corresponding to the plurality of word lines $WL_F$ in the memory block BLK. The transistor $T_{BLK}$ is, for example, a field-effect type NMOS transistor. The transistor $T_{BLK}$ has a drain electrode connected to the word line $WL_F$. The transistor $T_{BLK}$ has a source electrode connected to a wiring CG. A plurality of the wirings CG are disposed corresponding to all transistors $T_{BLK}$ in the block decode unit blkd. The wirings CG are connected to all block decode units blkd in the block decoder BLKD. The transistor $T_{BLK}$ has a gate electrode connected to a signal supply line BLKSEL. A plurality of the signal supply lines BLKSEL are disposed corresponding to all block decode units blkd. The signal supply line BLKSEL is connected to all transistors $T_{BLK}$ in the block decode unit blkd.

In a read operation, write sequence, and an erase sequence on the memory cell array $MCA_F$, for example, one signal supply line BLKSEL corresponding to a block address in an address register (not illustrated) enters a "H" state and the other signal supply lines BLKSEL enter a "L" state. For example, a predetermined driving voltage having a positive magnitude is supplied to one signal supply line BLKSEL and a ground voltage $V_{SS}$ or the like is supplied to the other signal supply lines BLKSEL. Thus, all word lines $WL_F$ in one memory block BLK corresponding to this block address electrically conduct with the above-described voltage supply line via all wirings CG. Additionally, all word lines $WL_F$ in the other memory blocks BLK enter a floating state.

[Structure of Memory Die MD]

Figure 6:
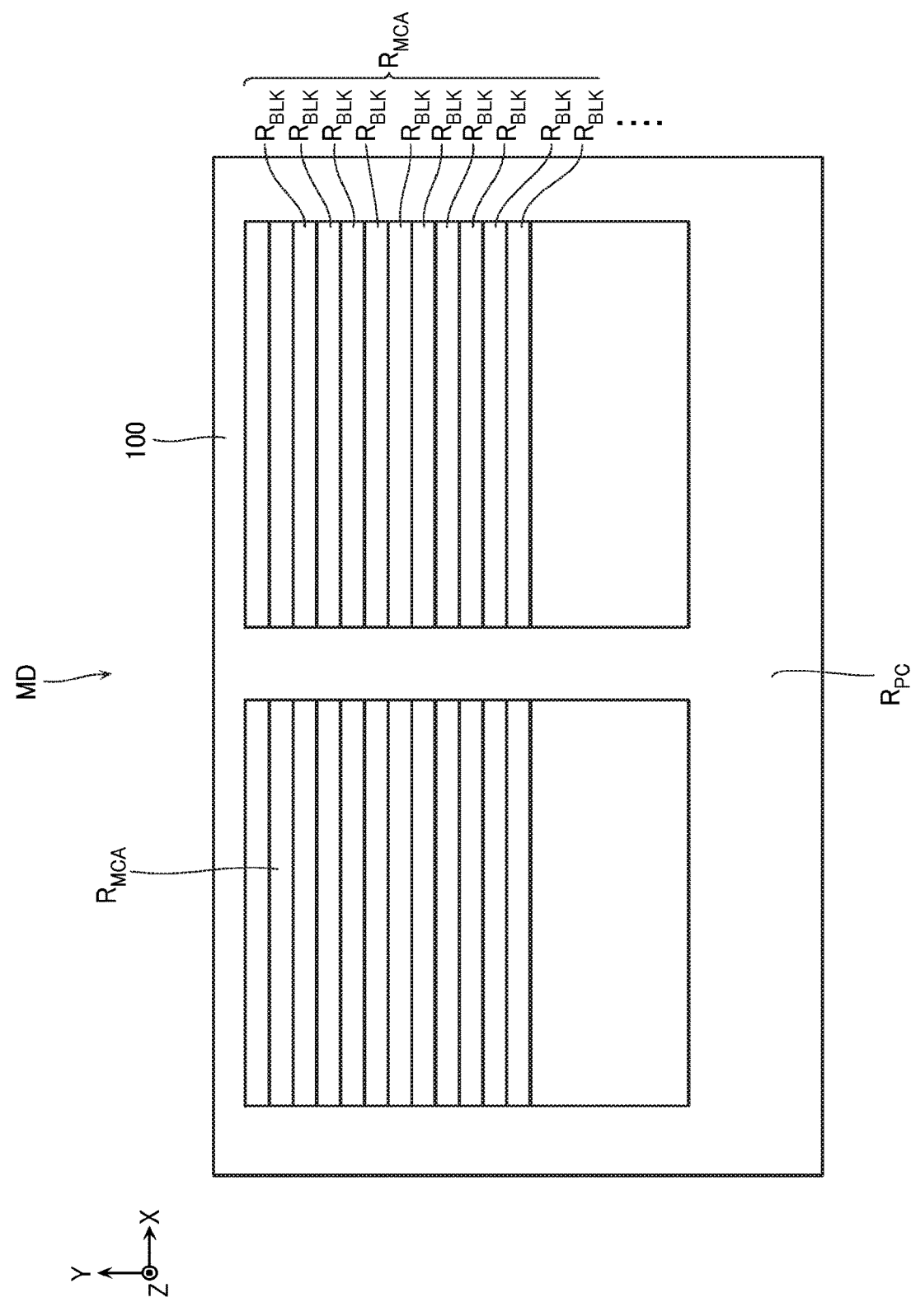
FIG. 6 is a schematic plan view of the memory die MD.
Figure 7:
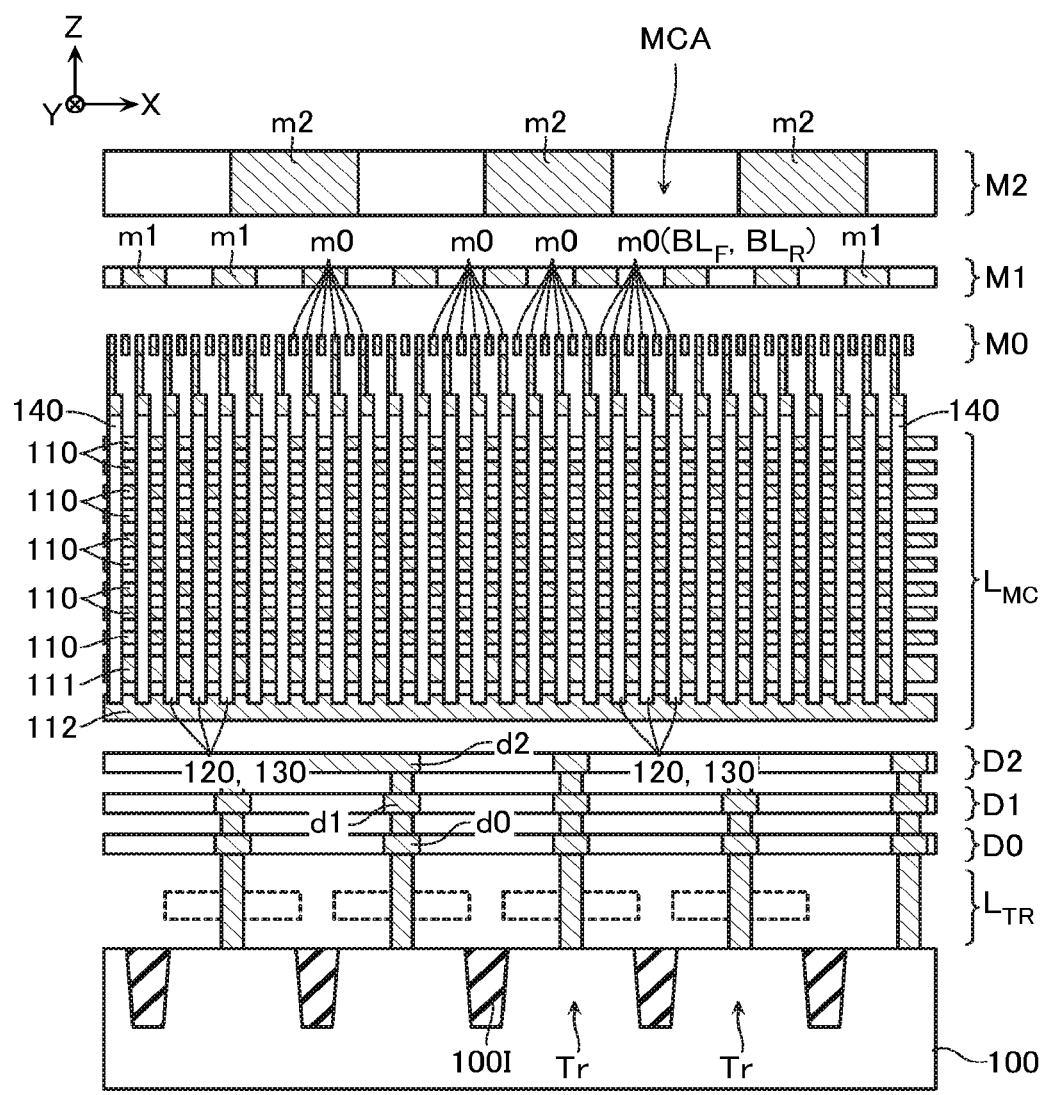
FIG. 7 is a schematic cross-sectional view illustrating a configuration of a part of the memory die MD.
Figure 8:
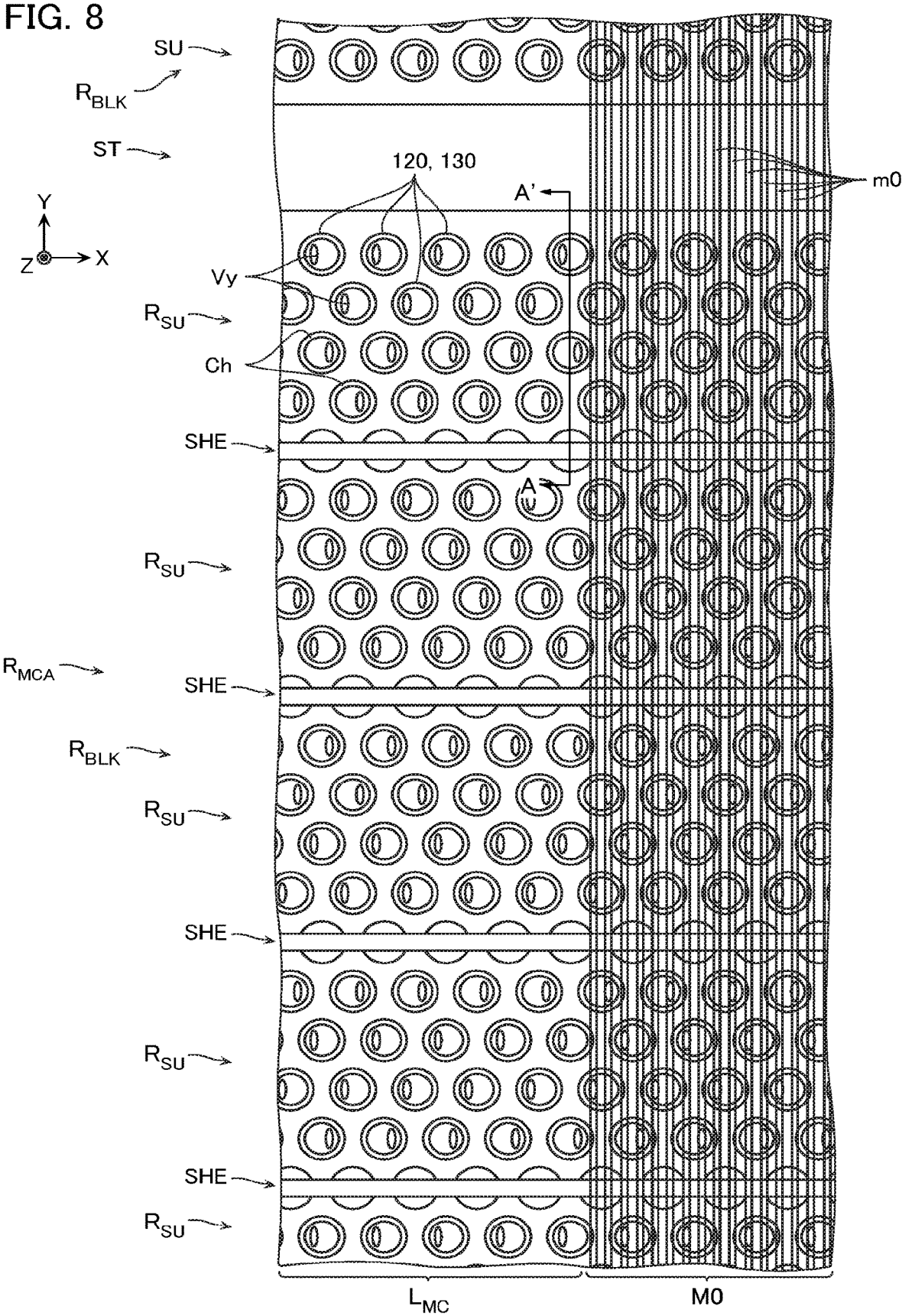
FIG. 8 is a schematic plan view illustrating a configuration of a part of the memory die MD.
Figure 9:
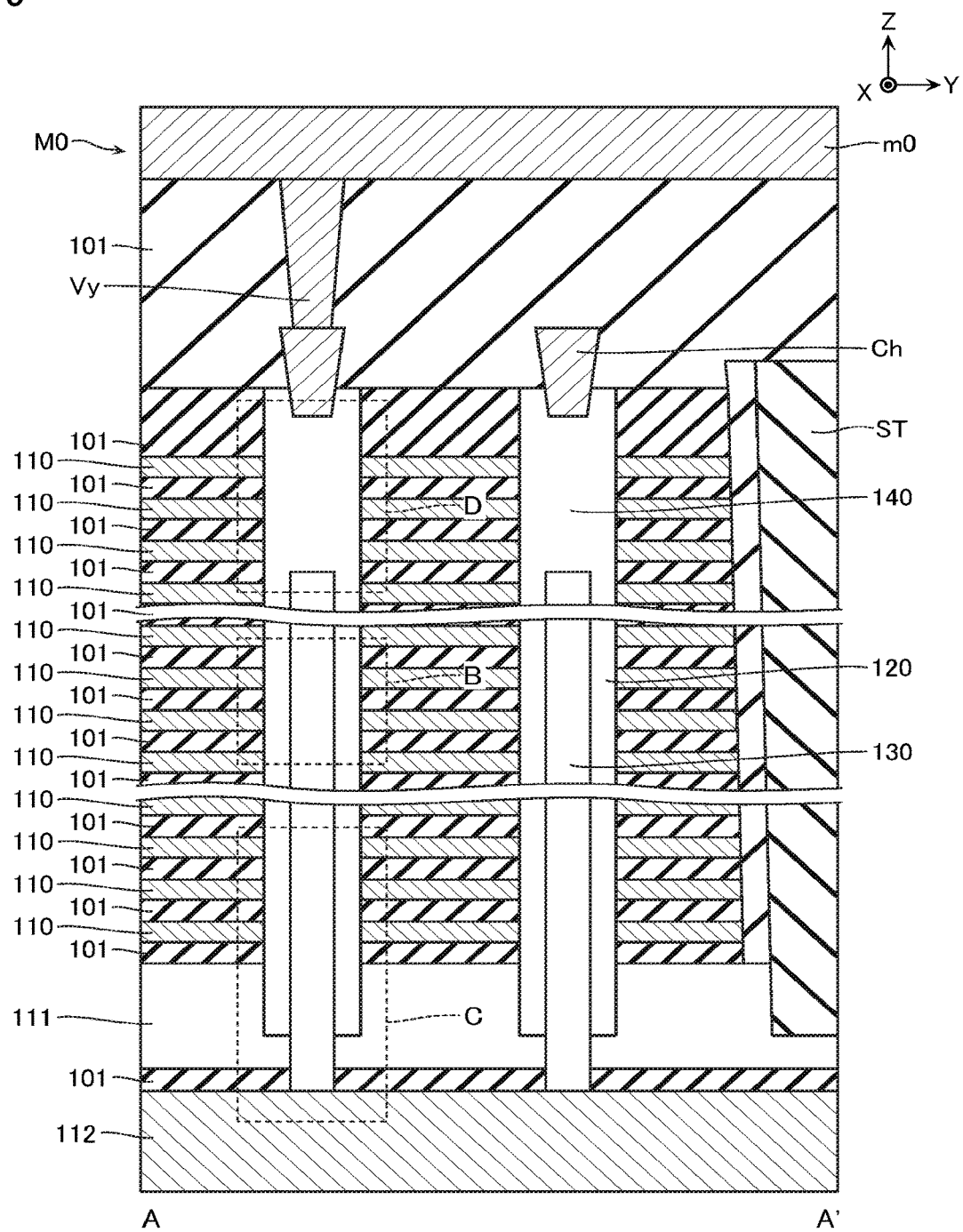
FIG. 9 is a schematic cross-sectional view of the structure illustrated in FIG. 8 taken along the line A-A' and viewed in the arrow direction.
Figure 10:
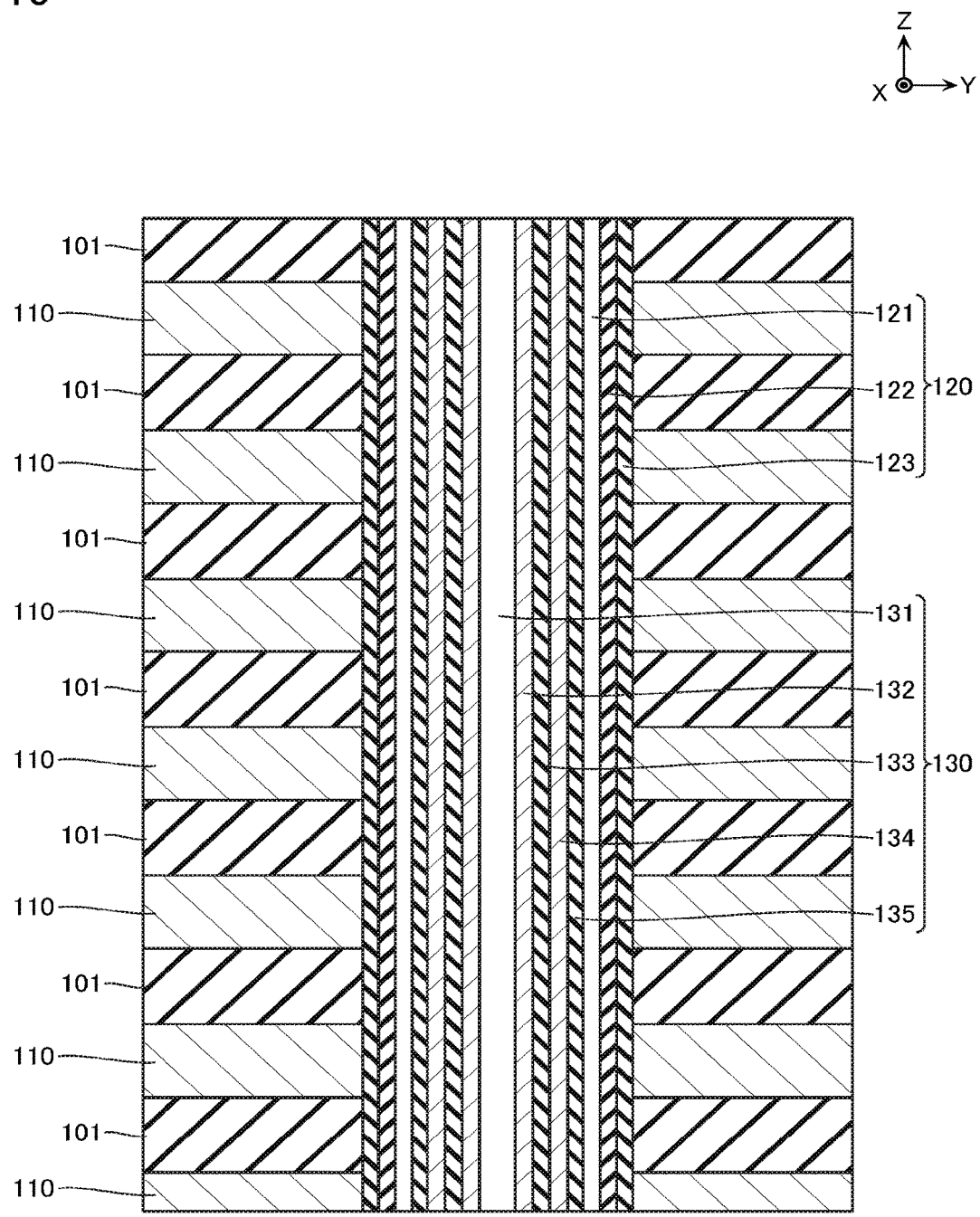
FIG. 10 is a schematic cross-sectional view illustrating an enlarged configuration including the part indicated by B in FIG. 9.
Figure 11:
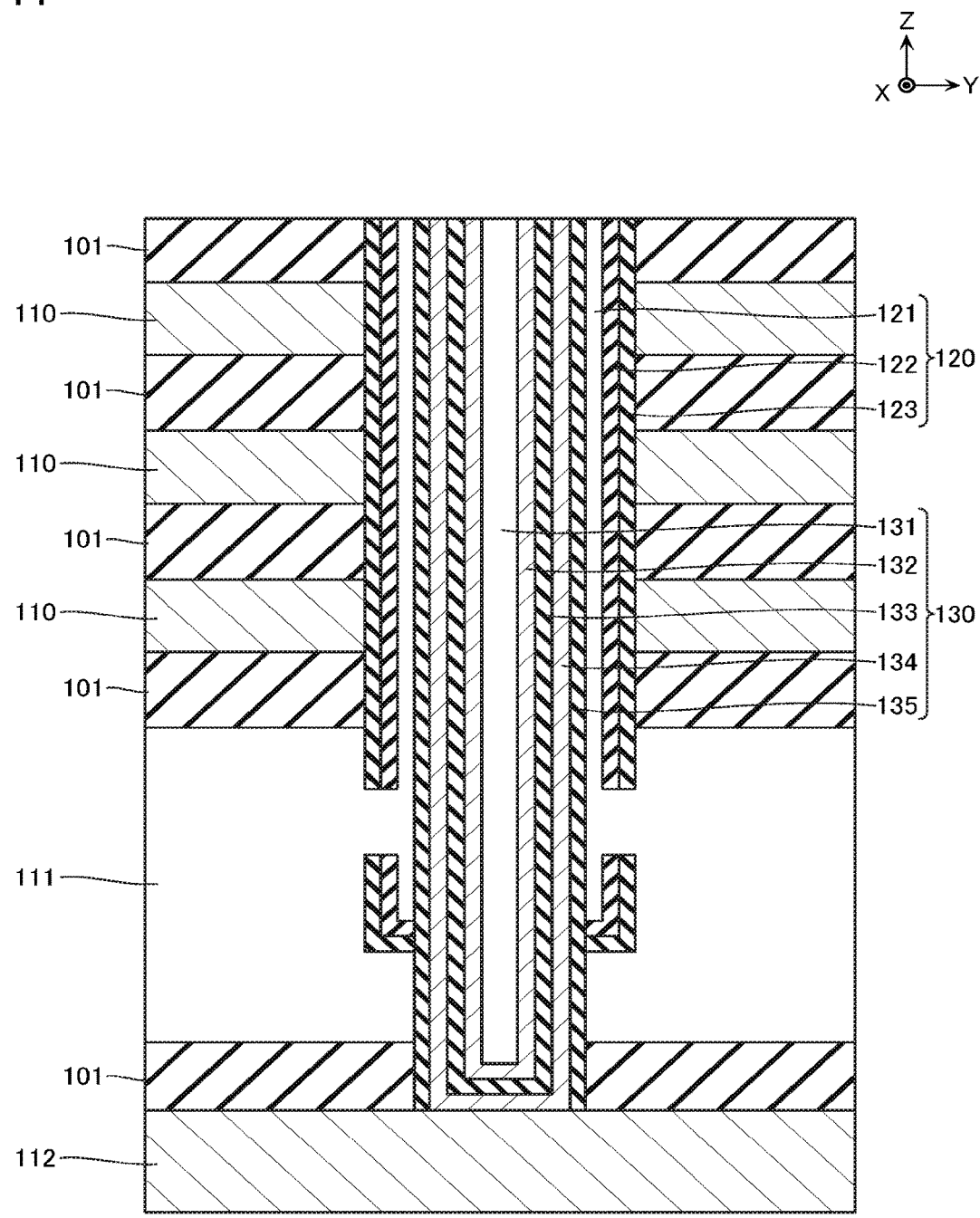
FIG. 11 is a schematic cross-sectional view illustrating an enlarged configuration including the part indicated by C in FIG. 9.
Figure 12:
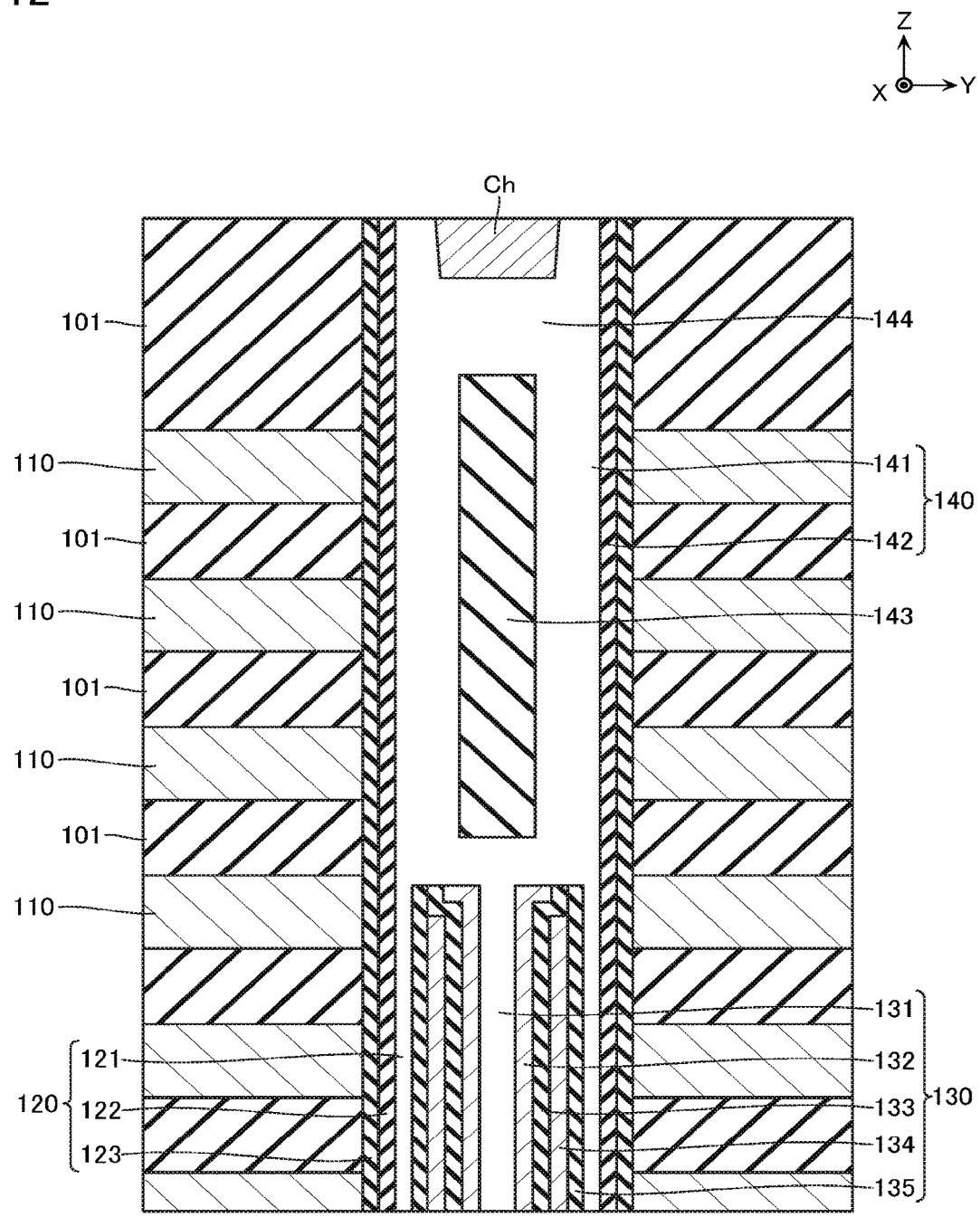
FIG. 12 is a schematic cross-sectional view illustrating an enlarged configuration including the part indicated by D in FIG. 9.

FIG. 6 is a schematic plan view of the memory die MD. FIG. 7 is a schematic cross-sectional view describing a structure of a part of the memory die MD. FIG. 8 is a schematic plan view illustrating an enlarged configuration of a part of FIG. 6. FIG. 9 is a schematic cross-sectional view of the structure illustrated in FIG. 8 taken along the line A-A' and viewed in the arrow direction. FIG. 10 is a schematic cross-sectional view illustrating an enlarged configuration including the part indicated by B in FIG. 9. FIG. 11 is a schematic cross-sectional view illustrating an enlarged configuration including the part indicated by C in FIG. 9. FIG. 12 is a schematic cross-sectional view illustrating an enlarged configuration including the part indicated by D in FIG. 9.

As illustrated in FIG. 6, the memory die MD includes a semiconductor substrate 100. In the illustrated example, the semiconductor substrate 100 includes two memory cell array regions $R_{MCA}$ arranged in the X-direction. A peripheral circuit area $R_{PC}$ is disposed at an end portion in the Y-direction of the semiconductor substrate 100.

As illustrated in FIG. 7, the memory die MD includes the semiconductor substrate 100, a transistor layer $L_{TR}$ disposed on the semiconductor substrate 100, wiring layers D0, D1, D2 disposed above the transistor layer $L_{TR}$, a memory cell layer $L_{MC}$ disposed above the wiring layers D0, D1, D2, and wiring layers M0, M1, M2 disposed above the memory cell layer $L_{MC}$.

The semiconductor substrate 100 is, for example, a semiconductor substrate made of P type silicon (Si) containing P type impurities, such as boron (B). In the surface of the semiconductor substrate 100, an N type well region containing N type impurities, such as phosphorus (P), a P type well region containing P type impurities, such as boron (B), a semiconductor substrate region where the N type well region or the P type well region is not disposed, insulating regions 100I, and the like are disposed.

The transistor layer $L_{TR}$ includes a plurality of transistors Tr. The plurality of transistors Tr are field-effect type transistors having channel regions on the surface of the semiconductor substrate 100. The plurality of transistors Tr constitute the peripheral circuit PC.

The wiring layers D0, D1, D2 include a plurality of wirings d0, d1, d2, respectively. For example, the plurality of wirings d0, d1, d2 may include a stacked film of a barrier conductive film, such as titanium nitride (TiN), and a metal film, such as tungsten (W), or the like.

For example, as illustrated in FIG. 6, the memory cell layer $L_{MC}$ includes a plurality of the memory block regions $R_{BLK}$ arranged in the Y-direction. For example, as illustrated in FIG. 8, the memory block region $R_{BLK}$ includes a plurality of string unit regions $R_{SU}$ arranged in the Y-direction. Between the two memory block regions $R_{BLK}$ adjacent in the Y-direction, an inter-block insulating layer ST, such as silicon oxide ($SiO_2$), is disposed.

For example, as illustrated in FIG. 9, the memory block region $R_{BLK}$ includes a plurality of conductive layers 110 arranged in the Z-direction, transistor structures 120 having outer peripheral surfaces surrounded by the plurality of conductive layers 110, capacitor structures 130 extending in the Z-direction and having outer peripheral surfaces surrounded by the transistor structures 120, and transistor structures 140 connected to upper ends of the transistor structures 120 and the capacitor structures 130.

The conductive layer 110 is a substantially plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z-direction, insulating layers 101, such as silicon oxide ($SiO_2$), are disposed.

A part of the conductive layers 110 each surround the outer peripheral surface of the transistor structure 120. One end and the other end in the Y-direction of the conductive layer 110 are in contact with side surfaces in the Y-direction of the inter-block insulating layers ST. A part of the respective conductive layers 110 function as the word lines $WL_F$ (FIG. 3) and gate electrodes of the plurality of memory cells $MC_F$ (FIG. 3) connected to the word lines $WL_F$. The plurality of respective conductive layers 110 positioned below the conductive layers 110 function as the source-side select gate line SGS (FIG. 3) and gate electrodes of the plurality of source-side select transistors STS (FIG. 3) connected to the source-side select gate line SGS.

A part of the conductive layers 110 each cover the outer peripheral surface of the transistor structure 140. As illustrated in FIG. 8, the conductive layers 110 are arranged in the Y-direction via inter-string unit insulating layers SHE. One end and the other end in the Y-direction of the conductive layer 110 are in contact with side surfaces in the Y-direction of the inter-block insulating layers ST or the inter-string unit insulating layers SHE. The respective conductive layers 110 function as the drain-side select gate line SGD (FIG. 3) and gate electrodes of the plurality of drain-side select transistors STD (FIG. 3) connected to the drain-side select gate line SGD. The conductive layers 110 also function as the word lines $WL_R$ (FIG. 4) and gate electrodes of the plurality of select transistors $ST_R$ (FIG. 4) connected to the word lines $WL_R$.

A conductive layer 111 (FIG. 9) is disposed below the conductive layers 110. For example, the conductive layer 111 may contain polycrystalline silicon containing N type impurities, such as phosphorus (P), or containing P type impurities, such as boron (B), or the like. The conductive layer 111 may include, for example, a conductive layer including a metal, such as tungsten (W), tungsten silicide, or the like, or another conductive layer. The conductive layer 111 is connected to lower ends of the transistor structures 120 to function as the source line SL (FIG. 3).

A conductive layer 112 is disposed below the conductive layer 111. For example, the conductive layer 112 may contain polycrystalline silicon containing N type impurities, such as phosphorus (P), or containing P type impurities, such as boron (B), or the like. The conductive layer 112 may include, for example, a conductive layer including a metal, such as tungsten (W), tungsten silicide, or the like, or another conductive layer. The conductive layer 112 is connected to lower ends of the capacitor structures 130 to function as the plate line PL (FIG. 4).

For example, as illustrated in FIG. 8, the transistor structures 120 are arranged in the X-direction and the Y-direction in a predetermined pattern. For example, as illustrated in FIG. 10, the transistor structure 120 includes a substantially cylindrically-shaped semiconductor layer 121 extending in the Z-direction, a substantially cylindrically-shaped insulating layer 122 extending in the Z-direction along the outer peripheral surface of the semiconductor layer 121, and a substantially cylindrically-shaped ferroelectric film 123 extending in the Z-direction along the outer peripheral surface of the insulating layer 122.

The semiconductor layers 121 function as channel regions of the plurality of memory cells $MC_F$ and the source-side select transistor STS included in one memory string MS (FIG. 3). For example, the semiconductor layer 121 is a semiconductor layer, such as polycrystalline silicon (Si). Each outer peripheral surface of the semiconductor layer 121 is surrounded by the conductive layers 110 and is opposed to the plurality of conductive layers 110 arranged in the Z-direction via the insulating layer 122 and the ferroelectric film 123. As illustrated in FIG. 11, the lower end portion of the semiconductor layer 121 is connected to the conductive layer 111. As illustrated in FIG. 12, the upper end portion of the semiconductor layer 121 is connected to the transistor structure 140.

The insulating layer 122 contains, for example, silicon oxide ($SiO_2$) or the like.

The ferroelectric film 123 may contain, for example, orthorhombic hafnium oxide. The hafnium oxide contained in the ferroelectric film 123 may mainly contain orthorhombic crystals. More specifically, the hafnium oxide contained in the ferroelectric film 123 may mainly contain a third orthorhombic crystal (orthorhombic III (space group Pbc21, space group number 29). Among crystals in the hafnium oxide contained in the ferroelectric film 123, a proportion of the orthorhombic crystals may be the largest.

The ferroelectric film 123 can contain at least one additive element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba).

From the aspect of causing the hafnium oxide to exhibit ferroelectricity, a concentration of the additive element is preferably from 0.1 atomic percent or more and 60 atomic percent or less. The appropriate range of the concentration of the additive element to cause the hafnium oxide to exhibit the ferroelectricity differs depending on the kind of the additive element. For example, in the case of the additive element being silicon (Si), the appropriate range of the concentration of the additive element to exhibit the ferroelectricity is from 3 atomic percent or more to 7 atomic percent or less. For example, in the case of the additive element being barium (Ba), the appropriate range of the concentration of the additive element to exhibit the ferroelectricity is from 0.1 atomic percent or more to 3 atomic percent or less. For example, in the case of the additive element being zirconium (Zr), the appropriate range of the concentration of the additive element to exhibit the ferroelectricity is from 10 atomic percent or more to 60 atomic percent or less.

For example, as illustrated in FIG. 10, the capacitor structure 130 includes a semiconductor layer 131 having a substantially columnar shape extending in the Z-direction, a substantially cylindrically-shaped conductive layer 132 extending in Z-direction along the outer peripheral surface of the semiconductor layer 131, a substantially cylindrically-shaped ferroelectric film 133 extending in the Z-direction along the outer peripheral surface of the conductive layer 132, a substantially cylindrically-shaped conductive layer 134 extending in the Z-direction along the outer peripheral surface of the ferroelectric film 133, and a substantially cylindrically-shaped insulating layer 135 extending in the Z-direction along the outer peripheral surface of the conductive layer 134.

The semiconductor layer 131 is a semiconductor layer, such as polycrystalline silicon (Si), containing N type impurities, such as phosphorus (P), or P type impurities, such as boron (B). As illustrated in FIG. 12, the semiconductor layer 131 has an upper end connected to the transistor structure 140.

The conductive layer 132 functions as one electrode constituting the capacitor $C_R$ (FIG. 4). The conductive layer 132 is in contact with the outer peripheral surface of the semiconductor layer 131. The conductive layer 132 may include a stacked film of a barrier conductive film, such as titanium nitride (TiN), and a metal film, such as tungsten (W), or the like. The conductive layer 132 is insulated from the conductive layer 134 via the ferroelectric film 133.

For example, the ferroelectric film 133 may contain the material and the crystalline structure similar to those of the ferroelectric film 123. A composition ratio of the respective materials contained in the ferroelectric film 133 may be matched with a composition ratio of the respective materials contained in the ferroelectric film 123 in a range of ±5%.

The conductive layer 134 functions as the other electrode constituting the capacitor $C_R$. The conductive layer 134 is insulated from the conductive layer 132 via the ferroelectric film 133. The conductive layer 134 may include a stacked film of a barrier conductive film, such as titanium nitride (TiN), and a metal film, such as tungsten (W), or the like. As illustrated in FIG. 11, the conductive layer 134 has a lower end connected to the conductive layer 112. The conductive layer 134 is insulated from the semiconductor layer 121 via the insulating layer 135.

For example, the insulating layer 135 contains silicon oxide ($SiO_2$) or the like.

For example, as illustrated in FIG. 12, the transistor structure 140 includes a semiconductor layer 141 extending in the Z-direction and a gate insulating film 142 disposed on the outer peripheral surface of the semiconductor layer 141.

For example, the semiconductor layer 141 is a semiconductor layer, such as polycrystalline silicon (Si). The semiconductor layer 141 functions as a channel region of the drain-side select transistor STD (FIG. 3). The semiconductor layer 141 also functions as a channel region of the select transistor $ST_R$ (FIG. 4). The semiconductor layer 141 has a substantially closed-bottomed cylindrical shape and includes an insulating layer 143, such as silicon oxide, at the center part. Each outer peripheral surface of the semiconductor layer 141 is surrounded by the conductive layers 110 and opposed to the conductive layers 110.

An impurity region 144 containing N type impurities, such as phosphorus (P), is disposed at the upper end portion of the semiconductor layer 141. The impurity region 144 is connected to a wiring m0 via a contact Ch and a contact Vy (FIG. 9).

The semiconductor layer 141 has a lower end portion connected to the semiconductor layer 121 and the semiconductor layer 131.

The gate insulating film 142 may be, for example, the upper end portion of the ferroelectric film 123 and the insulating layer 122.

For example, as illustrated in FIG. 7, the wiring layers M0, M1, M2 include a plurality of wirings m0, m1, m2, respectively. For example, the plurality of wirings m0, m1, m2 may contain a stacked film of a barrier conductive film, such as titanium nitride (TiN), and a metal film, such as copper (Cu) or aluminum (Al), or the like. In the illustrated example, a part of the wirings m0 are connected to the semiconductor layers 141 (FIG. 12) via the contacts Vy (FIG. 9) and the contacts Ch (FIG. 9). The wirings m0 function as the bit line $BL_F$ (FIG. 3) and the bit line $BL_R$ (FIG. 4). The wirings m0 are arranged in the X-direction and extend in the Y-direction.

[Threshold Voltage of Memory Cell $MC_F$]

Figure 13:
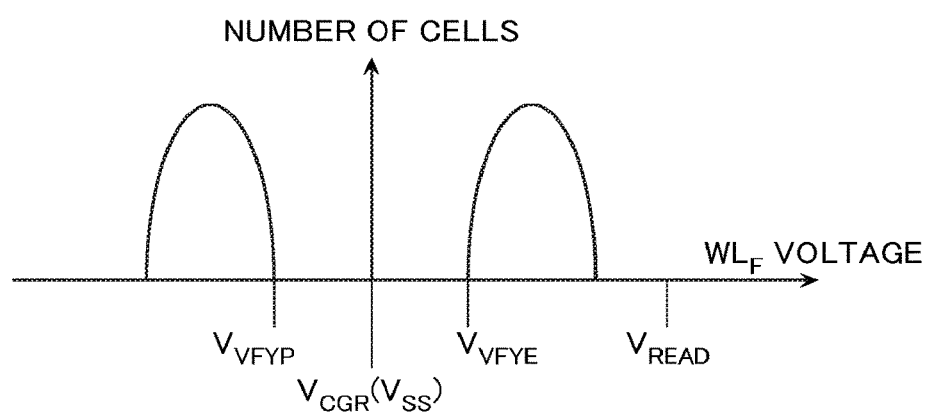
FIG. 13 is a schematic histogram describing a threshold voltage of a memory cell $MC_F$.

Next, with reference to FIG. 13, the threshold voltage of the memory cell $MC_F$ is described. FIG. 13 is a schematic histogram describing the threshold voltage of the memory cell $MC_F$ at which one-bit data is stored. The horizontal axis indicates the voltage of the word line $WL_F$ and the vertical axis indicates the number of the memory cells $MC_F$.

In the example of FIG. 13, the threshold voltage of the memory cell $MC_F$ is controlled to be in two patterns of states. For example, the threshold voltage of the memory cell $MC_F$ controlled to be in a lower state is smaller than a verify voltage $V_{VFYP}$ of FIG. 13. The threshold voltage of the memory cell $MC_F$ controlled to be in an upper state is larger than a verify voltage $V_{VFYE}$ of FIG. 13.

In the read operation, for example, a read voltage $V_{CGR}$ larger than the verify voltage $V_{VFYP}$ and smaller than the verify voltage $V_{VFYE}$ is supplied to a selected word line $WL_F$. In the example of FIG. 13, the read voltage $V_{CGR}$ has a magnitude around the ground voltage $V_{SS}$. Accordingly, the selected memory cell $MC_F$ controlled to be in the lower state enters the ON state and the selected memory cell $MC_F$ controlled to be in the upper state enters the OFF state.

In the read operation, for example, a read pass voltage $V_{READ}$ larger than the threshold voltage of the memory cell $MC_F$ controlled to be in the upper state is supplied to unselected word lines $WL_F$. Accordingly, the unselected memory cells $MC_F$ enters the ON state regardless of stored data. Accordingly, the selected memory cell $MC_F$ electrically conducts with the bit line $BL_F$ (FIG. 3) and the source line SL (FIG. 3). Therefore, when a voltage is supplied between the bit line $BL_F$ and the source line SL in this state and it is detected whether a current flows through the bit line $BL_F$ or not, the data stored in the selected memory cell $MC_F$ can be read.

Figure 14:
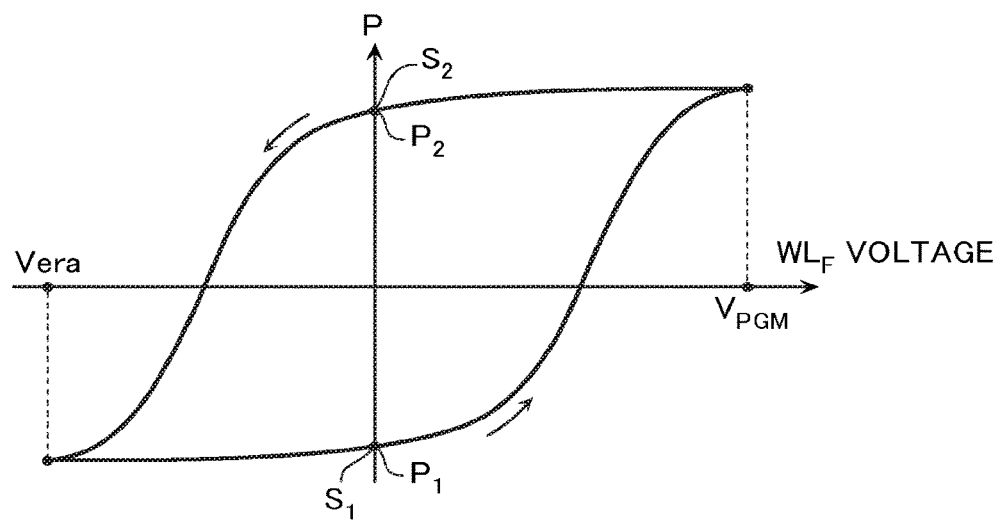
FIG. 14 is a schematic graph describing polarizability of the memory cell $MC_F$.
Figure 15:
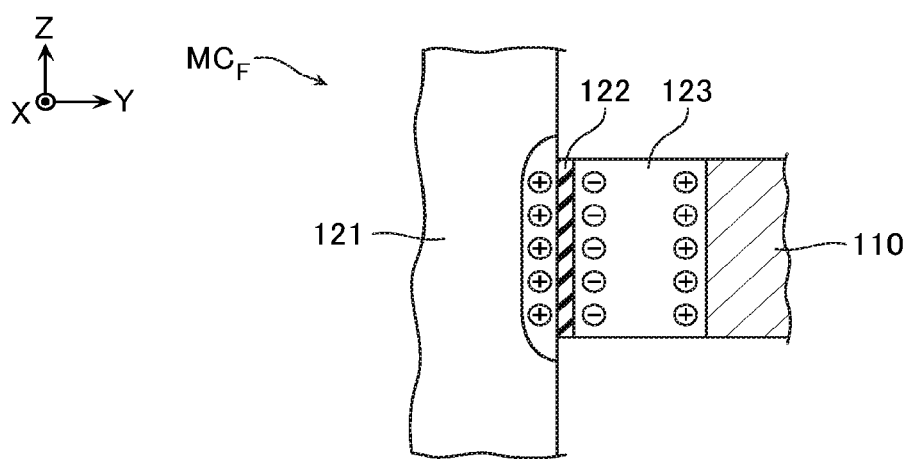
FIG. 15 is a schematic cross-sectional view describing a state of the memory cell $MC_F$.
Figure 16:
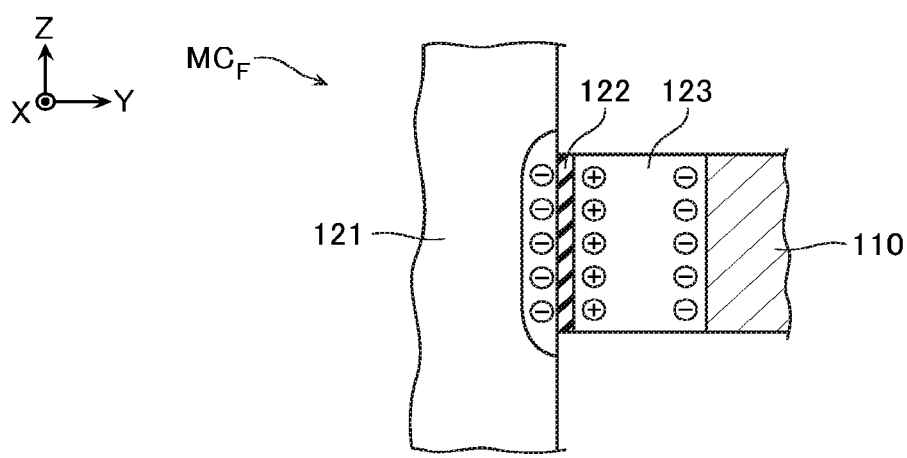
FIG. 16 is a schematic cross-sectional view describing the state of the memory cell $MC_F$.

Next, with reference to FIG. 14 to FIG. 16, a control method of the threshold voltage of the memory cell $MC_F$ is described. FIG. 14 is a schematic graph describing polarizability of the memory cell $MC_F$. The horizontal axis of the graph illustrated in FIG. 14 indicates the voltage of the word line $WL_F$. The vertical axis of the graph illustrated in FIG. 14 indicates polarizability P of the ferroelectric film 123. FIG. 15 and FIG. 16 are schematic cross-sectional views describing the state of the memory cell $MC_F$.

As described with reference to FIG. 10 and the like, the gate insulating film of the memory cell $MC_F$ according to the embodiment includes the ferroelectric film 123. When a voltage of positive polarity and a voltage of negative polarity having a magnitude equal to or more than a predetermined magnitude are supplied to the word line $WL_F$ connected to the memory cell $MC_F$ in alternation, the hysteresis curve as illustrated in FIG. 14 is observed. FIG. 14 indicates states $S_1$, $S_2$ on this hysteresis curve.

The state $S_1$ is the state of the memory cell $MC_F$ controlled to be the upper state. The polarizability P of the state $S_1$ is negative polarizability $P_1$ and the voltage of the word line $WL_F$ in the state is the ground voltage $V_{SS}$. In the state, as illustrated in FIG. 15, negative electric charges are induced to the surface on the semiconductor layer 121 side of the ferroelectric film 123. In the state, since positive electric charges are induced to the semiconductor layer 121, an electron channel is less likely to be formed in the semiconductor layer 121. Accordingly, the threshold voltage of the memory cell $MC_F$ becomes a positive value.

When a voltage having a magnitude around the read pass voltage $V_{READ}$ is supplied to the gate electrode of the memory cell $MC_F$ in the state $S_1$, the state of polarization in the ferroelectric film 123 does not change. When the supply of the voltage to the gate electrode is halted in the state, the memory cell $MC_F$ returns to the state $S_1$.

When a voltage of positive polarity having a magnitude equal to or more than the predetermined magnitude is supplied to the gate electrode of the memory cell $MC_F$ in the state $S_1$, the direction of the polarization in the ferroelectric film 123 is inverted because of an electric field between the conductive layer 110 and the semiconductor layer 121, and as illustrated in FIG. 14, the polarizability P in the ferroelectric film 123 increases. When the voltage of the gate electrode reaches a program voltage $V_{PGM}$, the polarizability P of the memory cell $MC_F$ changes up to a certain magnitude and saturates. In a case where the supply of the voltage to the gate electrode is halted in the state, the memory cell $MC_F$ transitions to the state $S_2$.

The state $S_2$ is the state of the memory cell $MC_F$ controlled to be the lower state. The polarizability P of the state $S_2$ is positive polarizability $P_2$, and the voltage of the word line $WL_F$ in the state is the ground voltage $V_{SS}$. In the state, as illustrated in FIG. 16, positive electric charges are induced to the surface on the semiconductor layer 121 side of the ferroelectric film 123. In the state, negative electric charges are induced to the semiconductor layer 121. That is, the electron channel is formed in the semiconductor layer 121. Therefore, the threshold voltage of the memory cell $MC_F$ becomes a negative value.

When a voltage of negative polarity having a magnitude equal to or more than the predetermined magnitude is supplied to the gate electrode of the memory cell $MC_F$ in the state $S_2$, the direction of the polarization in the ferroelectric film 123 is inverted because of an electric field between the conductive layer 110 and the semiconductor layer 121, and as illustrated in FIG. 14, the polarizability P in the ferroelectric film 123 decreases. When the voltage of the gate electrode reaches an erase voltage $V_{era}$, the polarizability P of the memory cell $MC_F$ changes up to a certain magnitude and saturates. In a case where the supply of the voltage to the gate electrode is halted in the state, the memory cell $MC_F$ transitions to the state $S_1$.

[Read Operation of Memory Cell Array $MCA_F$]

Figure 17:
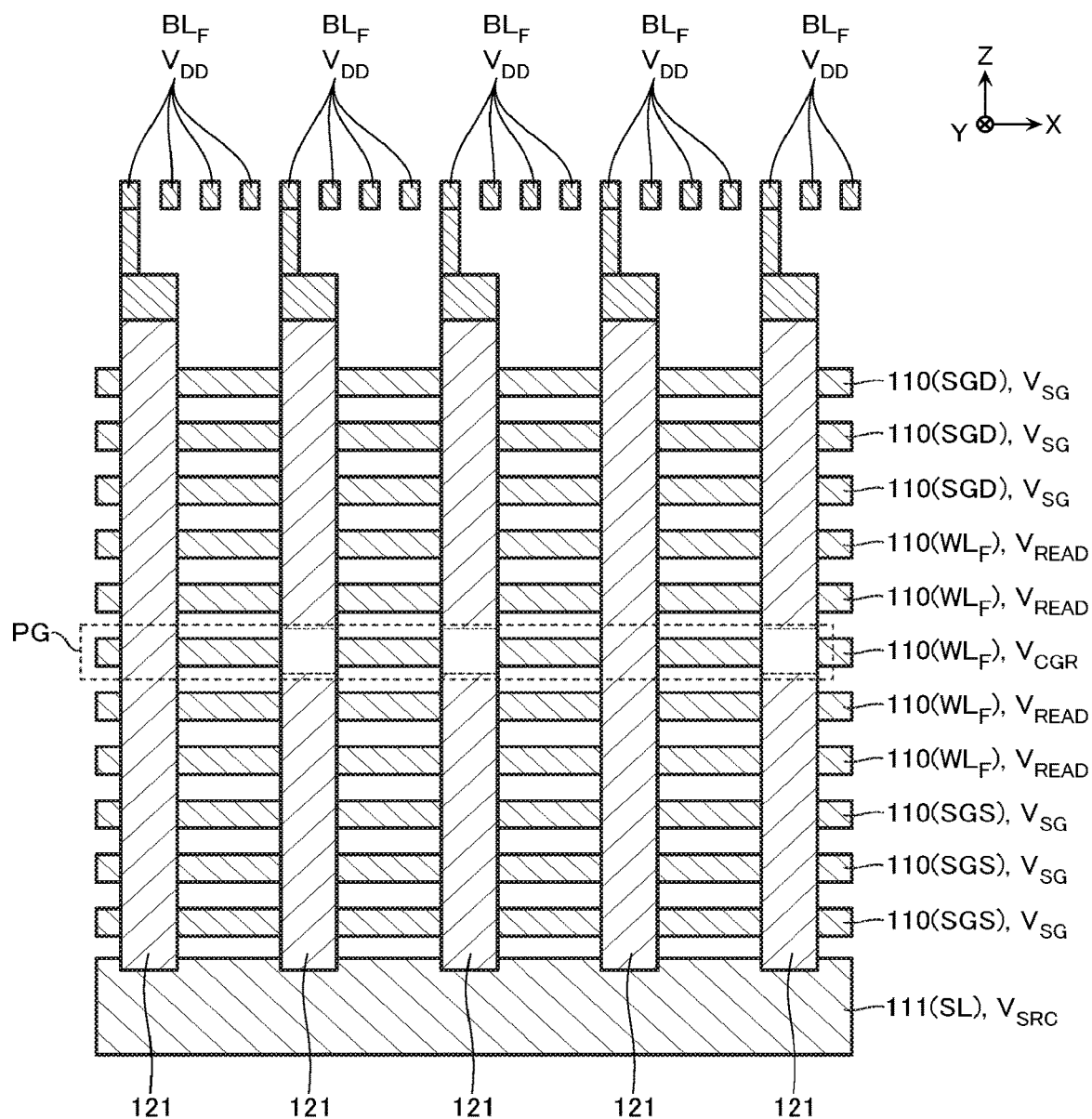
FIG. 17 is a schematic cross-sectional view describing a read operation of the memory cell $MC_F$.

Next, with reference to FIG. 17, the read operation of the memory cell array $MCA_F$ is more specifically described. FIG. 17 is a schematic cross-sectional view describing the read operation.

The read operation according to the embodiment is collectively performed on all memory cells $MC_F$ included in one string unit SU and connected to the selected word line $WL_F$. In the following description, the configuration including all memory cells $MC_F$ included in one string unit SU and connected to one word line $WL_F$ is referred to as a page PG in some cases.

In the read operation, for example, a voltage $V_{DD}$ is supplied to the bit line $BL_F$ and a voltage $V_{SRC}$ is supplied to the source line SL. For example, the voltage $V_{SRC}$ has a magnitude around the ground voltage $V_{SS}$. For example, the voltage $V_{SRC}$ is larger than the ground voltage $V_{SS}$ and smaller than the voltage $V_{DD}$.

The plurality of memory cells $MC_F$ connected to the selected word line $WL_F$ are selectively electrically conducted with the bit lines $BL_F$ and the source line SL. For example, a voltage $V_{SG}$ is supplied to the select gate line (SGD, SGS) to set the select transistor (STD, STS) to the ON state. The read pass voltage $V_{READ}$ is supplied to the unselected word lines $WL_F$ to set all memory cells $MC_F$ connected to the unselected word lines $WL_F$ to the ON state.

The read voltage $V_{CGR}$ is supplied to the selected word line $WL_F$. Thus, the memory cell $MC_F$ corresponding to the lower state enters the ON state and the memory cell $MC_F$ corresponding to the upper state enters the OFF state. In the state, a sense amplifier module in the peripheral circuit PC detects the ON state/OFF state of the selected memory cell $MC_F$ and outputs it to the controller die CD (FIG. 1) as read data. The controller die CD performs bit error detection/correction or the like on this data and then transfers the data to the host computer 20 (FIG. 1).

[Write Sequence of Memory Cell Array $MCA_F$]

Figure 18:
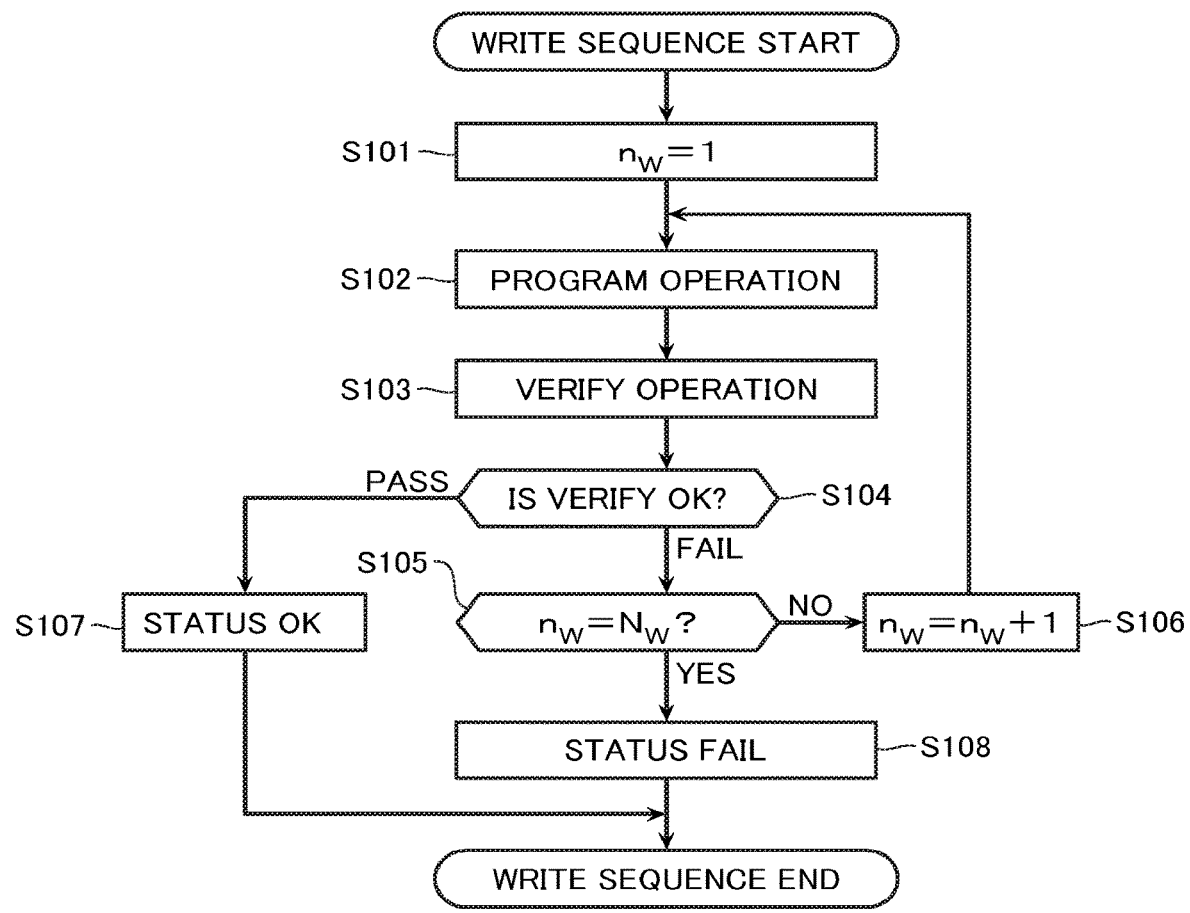
FIG. 18 is a schematic flowchart describing a write sequence of the memory cell $MC_F$.
Figure 19:
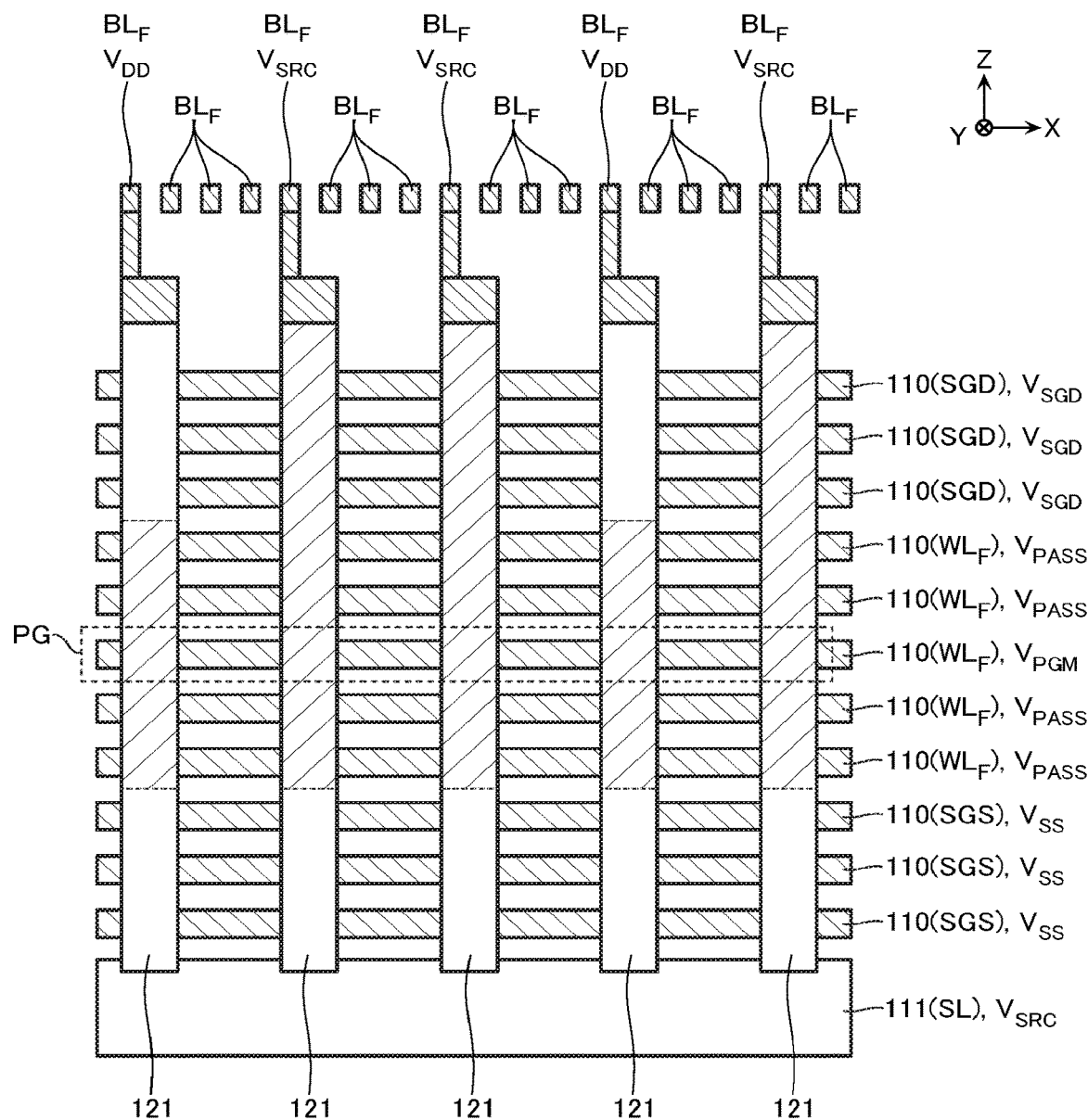
FIG. 19 is a schematic cross-sectional view describing the write sequence of the memory cell $MC_F$.
Figure 20:
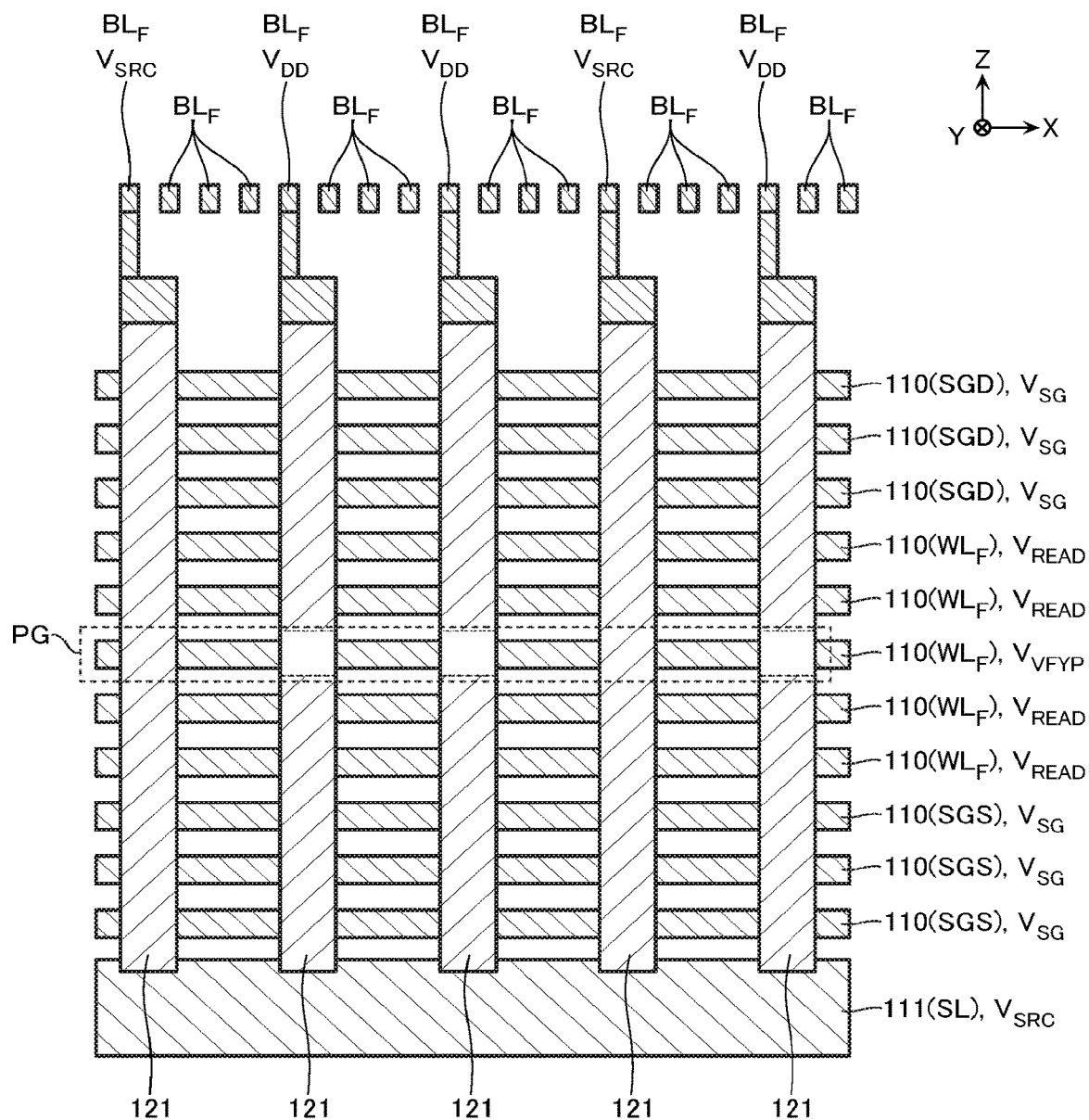
FIG. 20 is a schematic cross-sectional view describing the write sequence of the memory cell $MC_F$.

Next, with reference to FIG. 18 to FIG. 20, the write sequence of the memory cell array $MCA_F$ is described. FIG. 18 is a schematic flowchart describing the write sequence. FIG. 19 and FIG. 20 are schematic cross-sectional views describing the write sequence.

Note that the write sequence according to the embodiment is collectively performed on all memory cells $MC_F$ in one page PG.

At Step S101 (FIG. 18), a loop count $n_W$ is set to 1. The loop count $n_W$ is stored in a register or the like.

At Step S102, a program operation is performed.

For example, as illustrated in FIG. 19 as an example, in the program operation, among the plurality of selected memory cells $MC_F$, the voltage $V_{SRC}$ is supplied to the bit lines $BL_F$ connected to the ones whose threshold voltages are to be adjusted, and, among the plurality of selected memory cells $MC_F$, the voltage $V_{DD}$ is supplied to the bit lines $BL_F$ connected to the ones whose threshold voltages are not to be adjusted.

In the program operation, the memory cells $MC_F$ whose threshold voltages are adjusted are selectively electrically conducted with the bit lines $BL_F$. For example, voltage $V_{SGD}$ is supplied to the drain-side select gate lines SGD. The voltage $V_{SGD}$ is, for example, smaller than the voltage $V_{SG}$ of FIG. 17. Thus, the drain-side select transistors STD connected to the bit lines $BL_F$ to which the voltage $V_{SRC}$ is supplied enter the ON state, and the drain-side select transistors STD connected to the bit lines $BL_F$ to which the voltage $V_{DD}$ is supplied enter the OFF state. Write pass voltage $V_{PASS}$ is supplied to the unselected word lines $WL_F$. The write pass voltage $V_{PASS}$ may be, for example, larger than the read pass voltage $V_{READ}$ of FIG. 17.

In the program operation, the program voltage $V_{PGM}$ is supplied to the selected word line $WL_F$. The program voltage $V_{PGM}$ is larger than the write pass voltage $V_{PASS}$. Thus, the polarization state of the ferroelectric film 123 in the desired memory cell $MC_F$ can be changed.

At Step S103 (FIG. 18), a verify operation is performed.

In the verify operation, for example, as illustrated in FIG. 20 as an example, the read pass voltage $V_{READ}$ is supplied to the unselected word lines $WL_F$, and the voltage $V_{SG}$ is supplied to the select gate lines (SGD, SGS).

In the verify operation, the verify voltage $V_{VFYP}$ is supplied to the selected word line $WL_F$. Additionally, the ON state/OFF state of the selected memory cell $MC_F$ is detected.

At Step S104 (FIG. 18), the result of the verify operation is determined. For example, in a case where the memory cells $MC_F$ in the OFF state are detected by the certain number or more in the verify operation or the like, it is determined as verify FAIL, and the process proceeds to Step S105. On the other hand, in a case where the memory cells $MC_F$ in the OFF state are not detected by the certain number or more in the verify operation, it is determined as verify PASS, and the process proceeds to Step S107.

At Step S105, it is determined whether the loop count $n_W$ reaches a predetermined count $N_W$ or not. When the loop count $n_W$ has not reached, the process proceeds to Step S106. When the loop count $n_W$ has reached, the process proceeds to Step S108.

At Step S106, 1 is added to the loop count $n_W$, and the process proceeds to Step S102. At Step S106, for example, a predetermined voltage $\Delta V$ is added to the program voltage $V_{PGM}$. Accordingly, when the loop count $n_W$ is 2 or more, in the program operation at Step S102, the program voltage $V_{PGM}$ supplied to the selected word line $WL_F$ is larger than that in previous Step S102.

At Step S107, status data indicative of normal completion of the write sequence is stored in a status register (not illustrated) and is output to the controller die CD (FIG. 1), and the write sequence is terminated.

At Step S108, status data indicative of abnormal completion of the write sequence is stored in the status register (not illustrated) and is output to the controller die CD (FIG. 1), and the write sequence is terminated.

[Erase Sequence of Memory Cell Array $MCA_F$]

Figure 21:
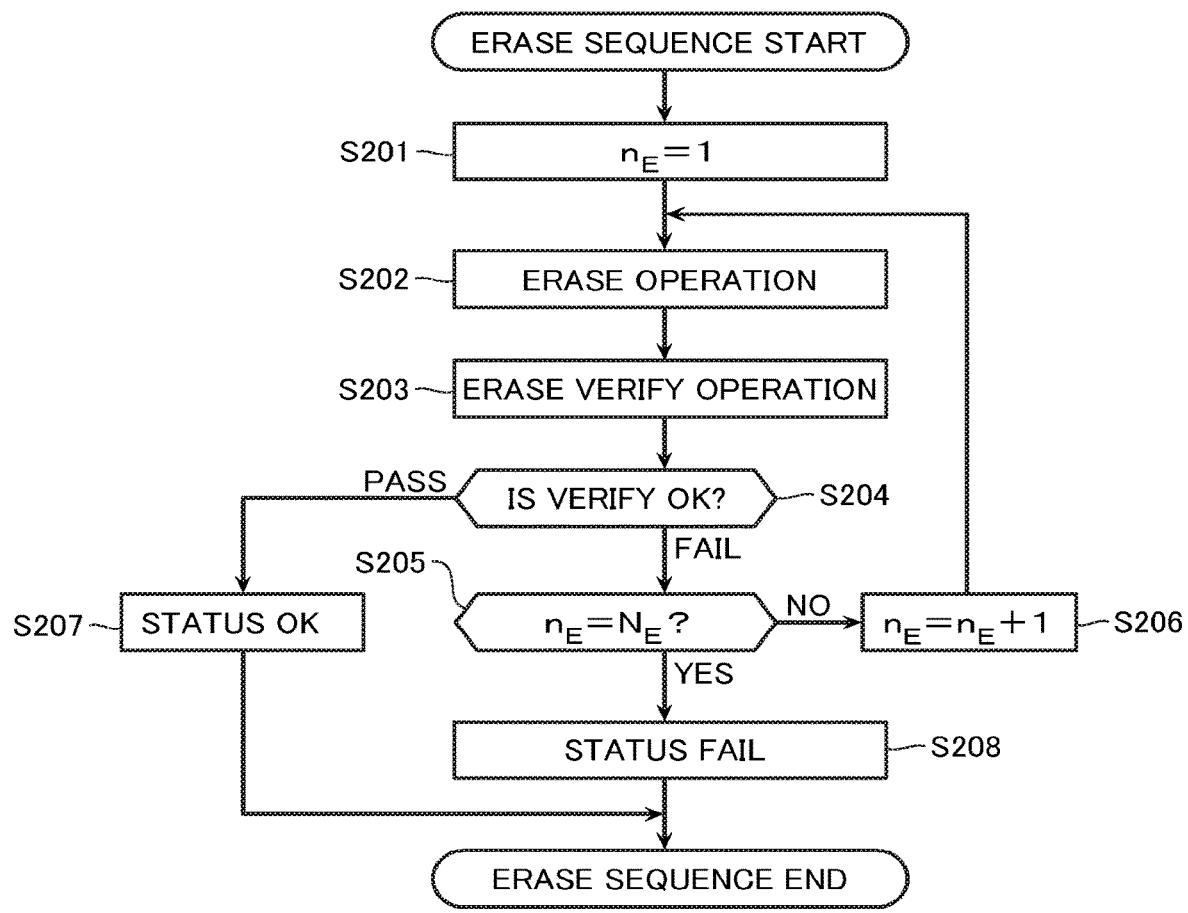
FIG. 21 is a schematic flowchart describing an erase sequence of the memory cell $MC_F$.
Figure 22:
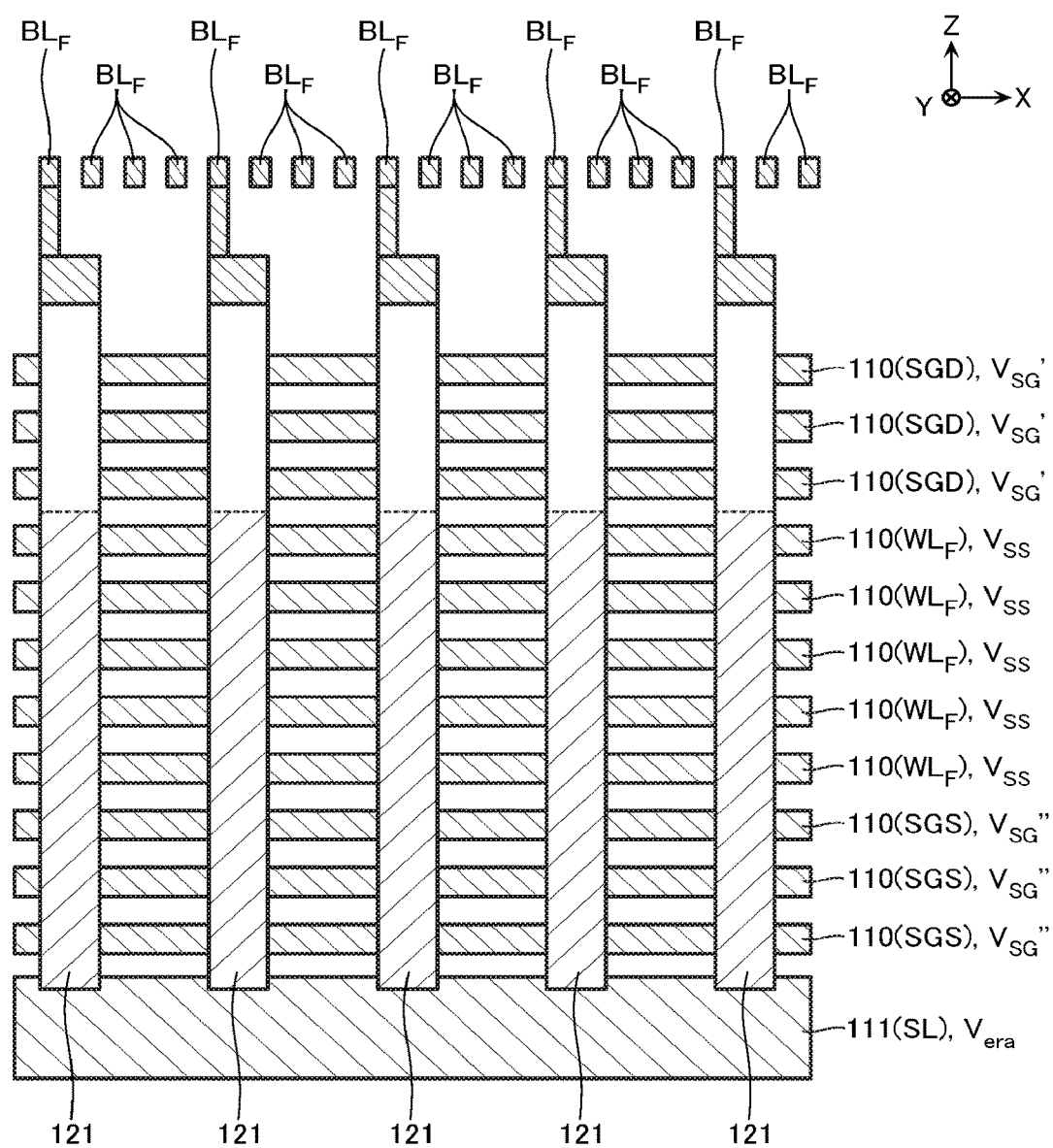
FIG. 22 is a schematic cross-sectional view describing the erase sequence of the memory cell $MC_F$.
Figure 23:
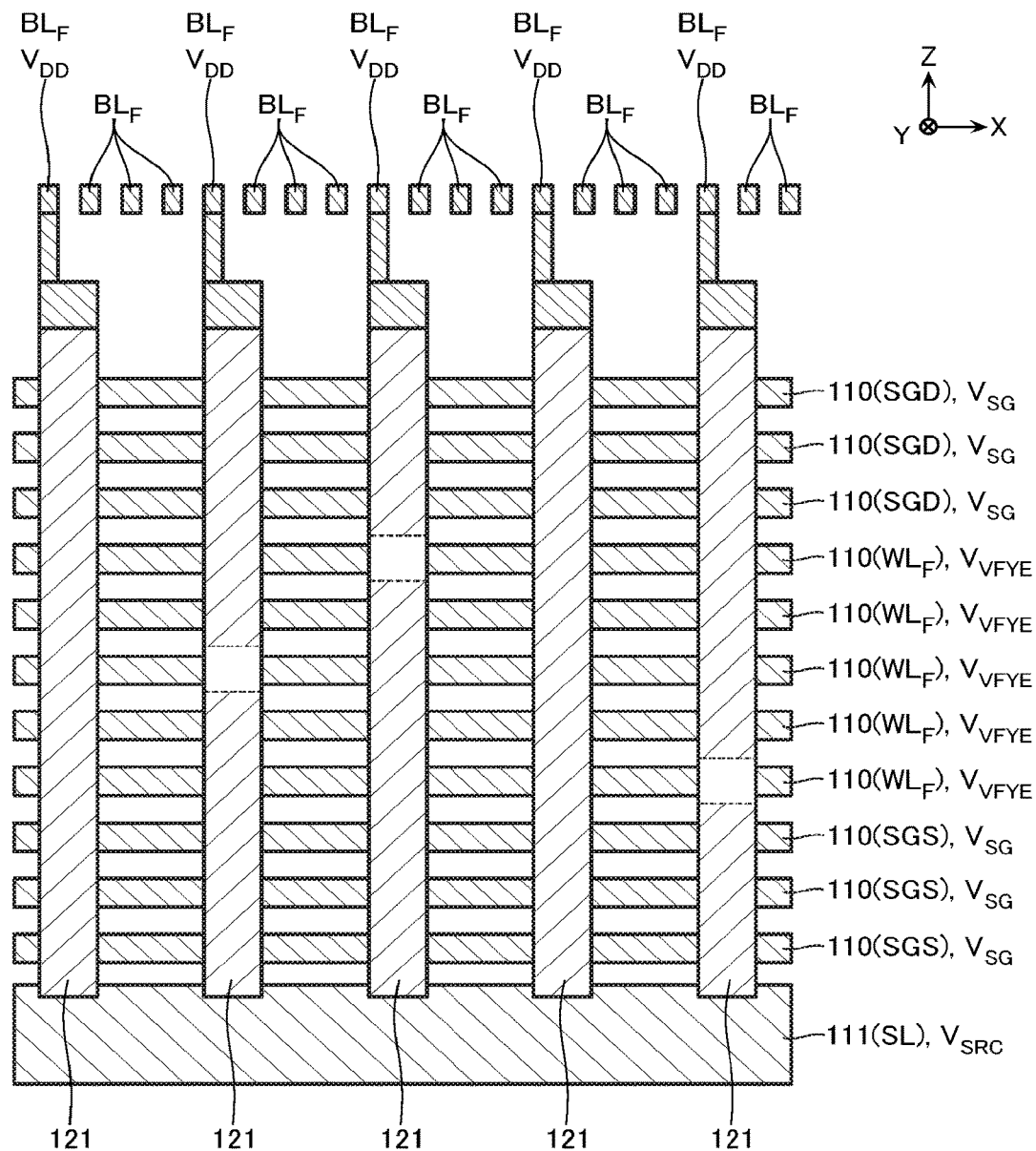
FIG. 23 is a schematic cross-sectional view describing the erase sequence of the memory cell $MC_F$.

Next, with reference to FIG. 21 to FIG. 23, the erase sequence of the memory cell array $MCA_F$ is described. FIG. 21 is a schematic flowchart describing the erase sequence. FIG. 22 and FIG. 23 are schematic cross-sectional views describing the erase sequence.

The erase sequence according to the embodiment is collectively performed on all memory cells $MC_F$ in one memory block BLK.

At Step S201 (FIG. 21), a loop count $n_E$ is set to 1. The loop count $n_E$ is stored in the register or the like.

At Step S202, the erase operation is performed.

In the erase operation, for example, as illustrated in FIG. 22 as an example, the memory cell $MC_F$ is disconnected from the bit line $BL_F$ and electrically conducted with the source line SL. For example, a voltage $V_{SG}'$ is supplied to the drain-side select gate lines SGD. For example, the voltage $V_{SG}'$ is a voltage having a magnitude to the extent of setting the drain-side select transistor STD to the OFF state. A voltage $V_{SG}''$ is supplied to the source-side select gate lines SGS. For example, the voltage $V_{SG}''$ is a voltage having a magnitude to the extent of forming a channel of the holes in a channel region of the source-side select transistor STS.

In the erase operation, the ground voltage $V_{SS}$ is supplied to the word lines $WL_F$ and the erase voltage $V_{era}$ is supplied to the source line SL. Thus, the polarization state of the ferroelectric film 123 in the memory cell $MC_F$ can be changed.

At Step S203 (FIG. 21), an erase verify operation is performed.

In the erase verify operation, for example, as illustrated in FIG. 23 as an example, the verify voltage $V_{VFYE}$ is supplied to the word lines $WL_F$ and the voltage $V_{SG}$ is supplied to the select gate lines (SGD, SGS). The ON state/OFF state of the memory cell $MC_F$ is detected.

At Step S204 (FIG. 21), the result of the erase verify operation is determined. For example, in a case where the memory cells $MC_F$ in the ON state are detected by the certain number or more in the erase verify operation or the like, it is determined as verify FAIL, and the process proceeds to Step S205. On the other hand, in a case where the memory cells $MC_F$ in the ON state are not detected by the certain number or more in the verify operation, it is determined as verify PASS, and the process proceeds to Step S207.

At Step S205, it is determined whether the loop count $n_E$ reaches a predetermined count $N_E$ or not. When the loop count $n_E$ has not reached, the process proceeds to Step S206. When the loop count $n_E$ has reached, the process proceeds to Step S208.

At Step S206, 1 is added to the loop count $n_E$, and the process proceeds to Step S202. At Step S206, for example, the predetermined voltage $\Delta V$ is added to the erase voltage $V_{era}$. Accordingly, when the loop count $n_E$ is 2 or more, in the erase operation at Step S202, the erase voltage $V_{era}$ supplied to the source line SL is larger than that in previous Step S202.

At Step S207, status data indicative of normal completion of the erase sequence is stored in the status register (not illustrated) and is output to the controller die CD (FIG. 1), and the erase sequence is terminated.

At Step S208, status data indicative of abnormal completion of the erase sequence is stored in the status register (not illustrated) and is output to the controller die CD (FIG. 1), and the erase sequence is terminated.

[Characteristic Change of Ferroelectric Film 123]

In a case where the state of polarization does not change for a predetermined period or more, the ferroelectric exhibits a phenomenon so-called imprint in which the state of polarization is less likely to change in some cases.

Figure 24:
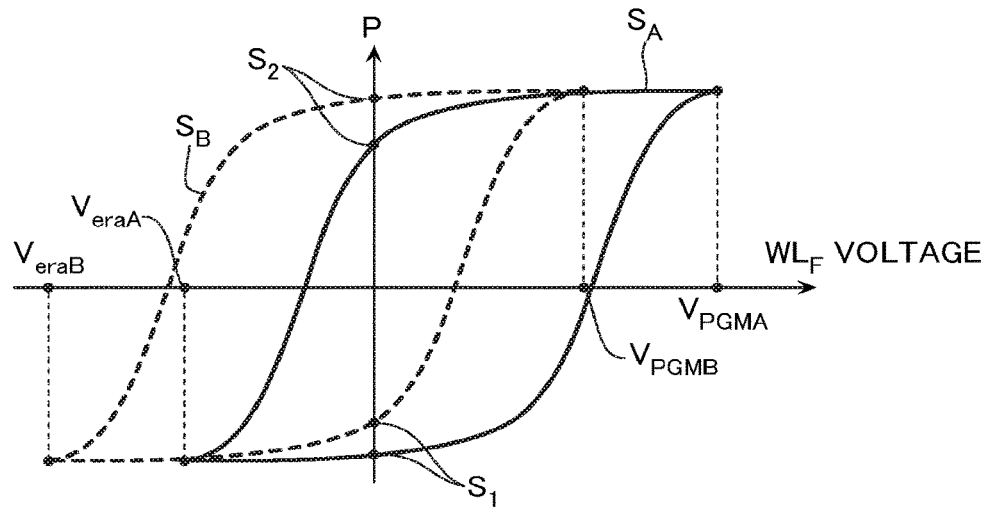
FIG. 24 is a schematic graph describing a characteristic change of a ferroelectric film 123.

For example, the graph illustrated as an example in FIG. 24 illustrates the characteristic of the ferroelectric film 123 in the state imprinted in the negative direction (hereinafter referred to as "state $S_A$" in some cases) and the characteristic of the ferroelectric film 123 in the state imprinted in the positive direction (hereinafter referred to as "state $S_B$" in some cases). A program voltage $V_{PGMA}$ that causes the ferroelectric film 123 in the state $S_A$ to transition from the state $S_1$ to the state $S_2$ is larger than a program voltage $V_{PGMB}$ that causes the ferroelectric film 123 in the state $S_B$ to transition from the state $S_1$ to the state $S_2$. An erase voltage $V_{eraA}$ that causes the ferroelectric film 123 in the state $S_A$ to transition from the state $S_2$ to the state $S_1$ is larger than an erase voltage $V_{eraB}$ that causes the ferroelectric film 123 in the state $S_B$ to transition from the state $S_2$ to the state $S_1$.

An influence of the imprint tends to be significantly exhibited as a count of polarization inversions in the ferroelectric film 123 increases.

Here, for example, from the aspect of reducing deterioration of the ferroelectric film 123 or the like, the voltage supplied to the ferroelectric film 123 is preferably the minimum necessary. Therefore, for example, it is considered that the program voltage $V_{PGM}$ is set to the program voltage $V_{PGMB}$ in accordance with the ferroelectric film 123 in the state $S_B$. However, in the case, there may be a case where the number of the loop count $n_W$, which has been described with reference to FIG. 18 or the like, increases in the write sequence and a time period required for the write sequence lengthens. Similarly, when the erase voltage $V_{era}$ is set to the erase voltage $V_{eraA}$ in accordance with the ferroelectric film 123 in the state $S_A$ as well, there may be a case where the time period required for the erase sequence lengthens.

Therefore, in the first embodiment, prior to the write sequence and the erase sequence, the program voltage $V_{PGM}$ and the erase voltage $V_{era}$ are adjusted.

[Adjustment of Program Voltage $V_{PGM}$]

Figure 25:
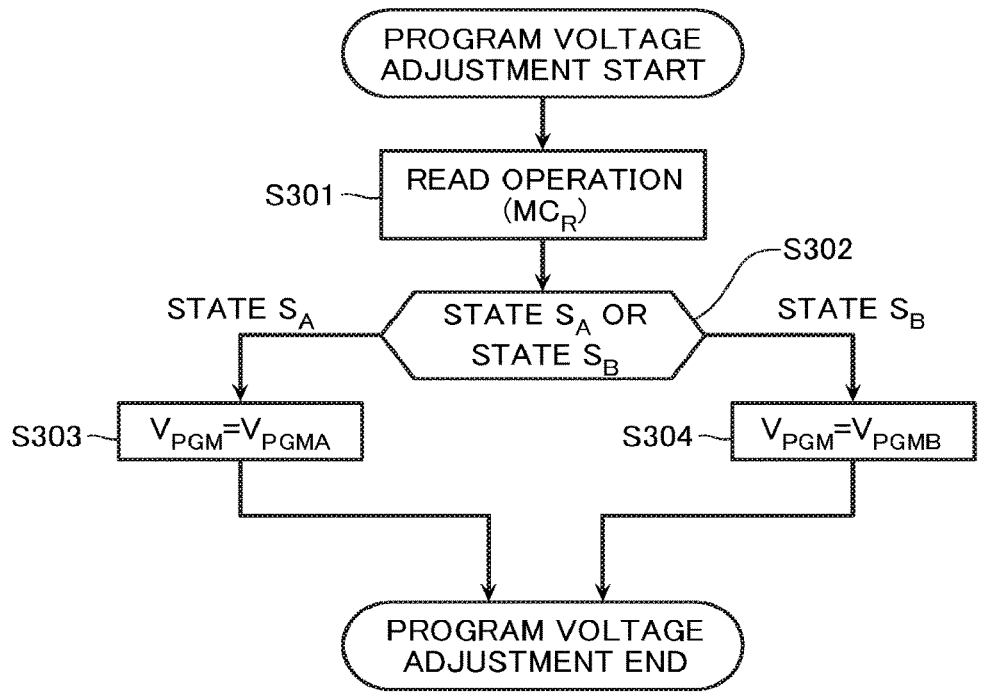
FIG. 25 is a schematic flowchart describing an adjustment method of a program voltage $V_{PGM}$.

FIG. 25 is a schematic flowchart describing the adjustment method of the program voltage $V_{PGM}$. Note that the operation depicted in FIG. 25 is performed before performing the write sequence. The operation depicted in FIG. 25 may be performed, for example, after a command indicative of performing the write sequence on the memory die MD is input.

At Step S301, the read operation is performed on the memory cell $MC_R$ corresponding to the page PG target for the write sequence.

Figure 26:
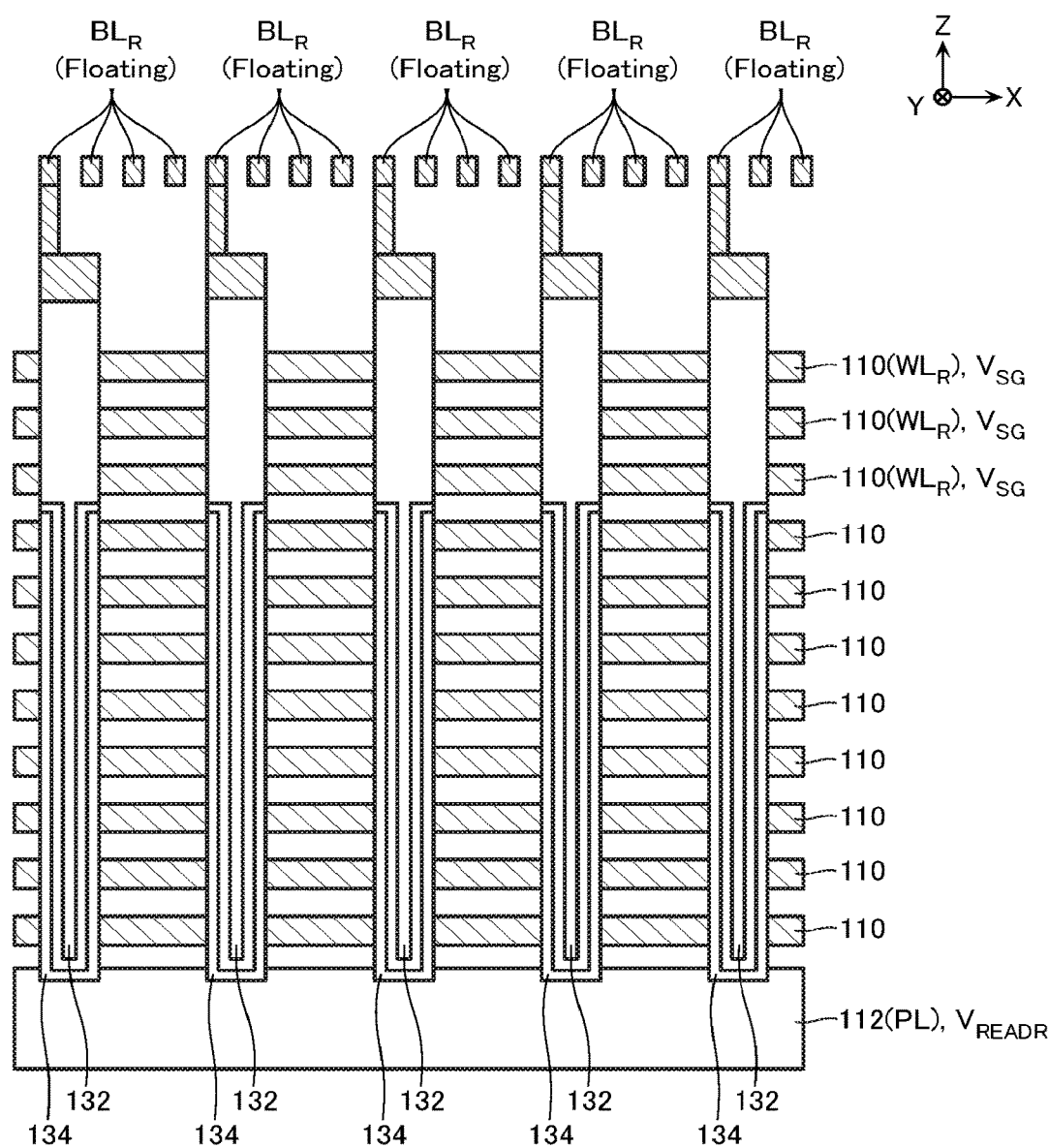
FIG. 26 is a schematic cross-sectional view describing the adjustment method of the program voltage $V_{PGM}$.

For example, as illustrated in FIG. 26, in the read operation, the voltage $V_{SG}$ is supplied to the selected word lines $WL_R$ and the ground voltage $V_{SS}$ is supplied to the unselected word lines $WL_R$. In the read operation, the bit lines $BL_R$ are set to the floating state and a read voltage $V_{READR}$ is supplied to the plate line PL.

Figure 27:
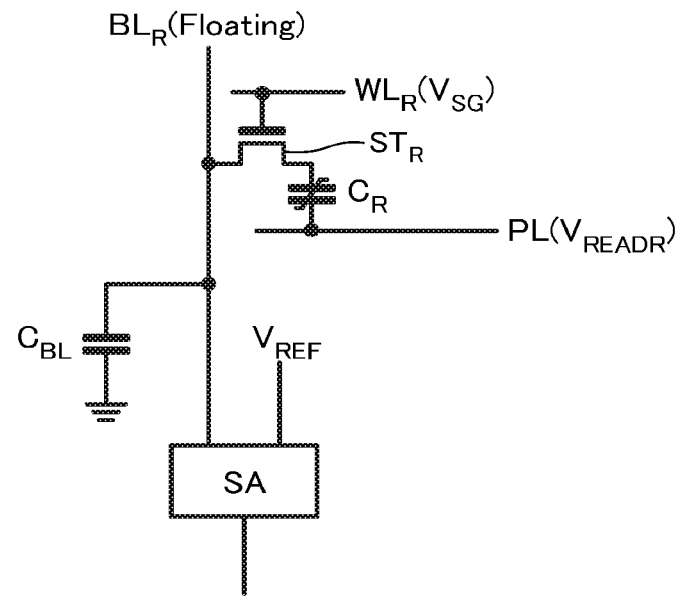
FIG. 27 is a schematic circuit diagram describing the adjustment method of the program voltage $V_{PGM}$.
Figure 28:
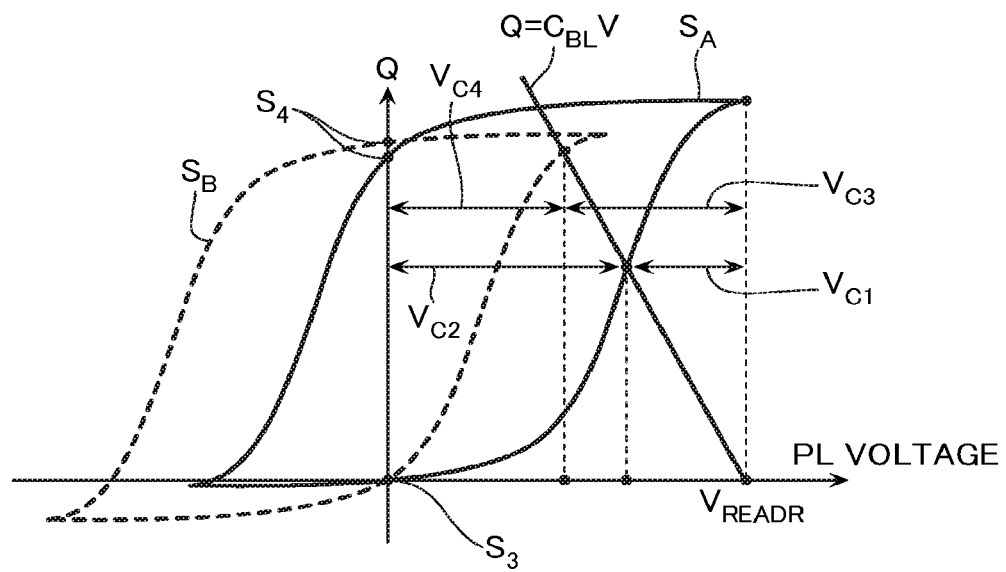
FIG. 28 is a schematic graph describing the adjustment method of the program voltage $V_{PGM}$.

Here, for example, as illustrated in FIG. 27, while the read operation is performed, between a grounding terminal and the plate line PL, a capacitor $C_{BL}$, the bit line $BL_R$, the select transistor $ST_R$, and the capacitor $C_R$ are connected in series. FIG. 28 is a schematic graph illustrating a state of voltage division between the capacitor $C_{BL}$ and the capacitor $C_R$ while the read operation is performed.

The memory cell $MC_R$ target for the read operation at Step S301 is controlled to be in the erase state. Hereinafter, regarding the memory cell $MC_R$, the erase state is referred to as "state $S_3$" in some cases. The write state is referred to as "state $S_4$" in some cases.

For example, in a case where the ferroelectric film 133 in the capacitor $C_R$ is in the state $S_A$, when the read voltage $V_{READR}$ of positive polarity is supplied to the plate line PL, the polarization state of the ferroelectric film 133 changes at a point when the voltage division of the capacitor $C_R$ reaches a certain magnitude, and the electric charges accumulated in the capacitor $C_R$ are discharged. In association with this, the voltage division of the bit line $BL_R$ significantly increases. Accordingly, at the point when the voltage of the plate line PL reaches the read voltage $V_{READR}$, the voltage (the voltage division of the capacitor $C_{BL}$) of the bit line $BL_R$ becomes a voltage $V_{C1}$ and the voltage division of the capacitor $C_R$ becomes a voltage $V_{C2}$ (=$V_{READR}$-$V_{C1}$).

On the other hand, in a case where the ferroelectric film 133 in the capacitor $C_R$ is in the state $S_B$, when the read voltage $V_{READR}$ of positive polarity is supplied to the plate line PL, at the point when the voltage division of the capacitor $C_R$ reaches a certain magnitude, the polarization state of the ferroelectric film 133 changes, and the electric charges accumulated in the capacitor $C_R$ are discharged. In association with this, the voltage division of the bit line $BL_R$ significantly increases. Here, the voltage at which the polarization state of the ferroelectric film 133 in the state $S_B$ changes is smaller than the voltage at which the polarization state of the ferroelectric film 133 in the state $S_A$ changes. Therefore, at the point when the voltage of the plate line PL reaches the read voltage $V_{READR}$, the voltage (the voltage division of the capacitor $C_{BL}$) of the bit line $BL_R$ becomes a voltage $V_{C3}$ larger than the voltage $V_{C1}$ and the voltage division of the capacitor $C_R$ becomes a voltage $V_{C4}$ (=$V_{READR}$-$V_{C3}$).

Therefore, by detecting the magnitude relationship between the voltage of the bit line $BL_R$ and a voltage $V_{REF}$ ($V_{C1}$<$V_{REF}$<$V_{C3}$) in this state by a sense amplifier SA (FIG. 27) in the peripheral circuit PC, it can be detected whether the capacitor $C_R$ is in the state $S_A$ or the state $S_B$.

Note that the ferroelectric film 133 in the memory cell $MC_R$ transitions from the state $S_3$ to the state $S_4$ by performing the read operation.

At Step S302 (FIG. 25), in the read operation on the memory cell $MC_R$, it is determined whether the memory cell $MC_R$ is in the state $S_A$ or the state $S_B$. When the memory cell $MC_R$ is in the state $S_A$, the process proceeds to Step S303. When the memory cell $MC_R$ is in the state $S_B$, the process proceeds to Step S304.

At Step S303, the program voltage $V_{PGM}$ is set to the program voltage $V_{PGMA}$ and the adjustment of the voltage is terminated.

At Step S304, the program voltage $V_{PGM}$ is set to the program voltage $V_{PGMB}$ and the adjustment of the voltage is terminated.

Note that after the termination of the process depicted in FIG. 25, the write sequence is performed.

[Adjustment of Erase voltage $V_{era}$]

Figure 29:
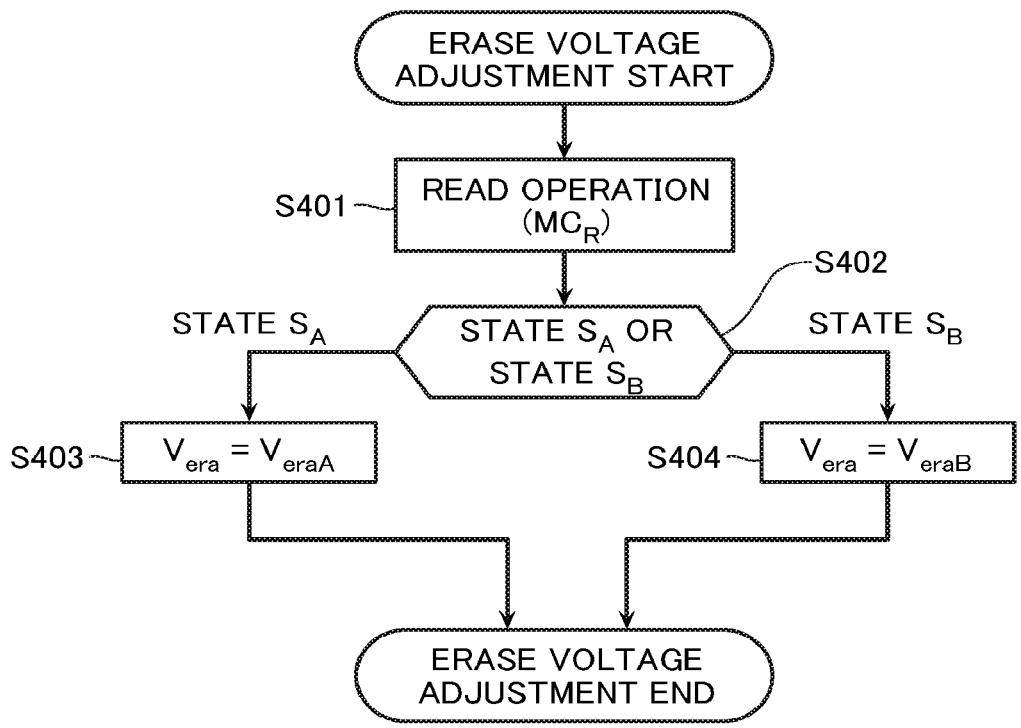
FIG. 29 is a schematic flowchart describing an adjustment method of an erase voltage $V_{era}$.

FIG. 29 is a schematic flowchart describing the adjustment method of the erase voltage $V_{era}$. Note that the operation depicted in FIG. 29 is performed before performing the erase sequence. The operation depicted in FIG. 29 may be performed, for example, after a command indicative of performing the erase sequence on the memory die MD is input.

At Step S401, the read operation is performed on the plurality of memory cells $MC_R$ corresponding to the plurality of pages PG included in the memory block BLK target for the erase sequence.

For example, as illustrated in FIG. 26, in the read operation, the voltage $V_{SG}$ is supplied to the selected word lines $WL_R$ and the ground voltage $V_{SS}$ is supplied to the unselected word lines $WL_R$. In the read operation, the bit lines $BL_R$ are set to the floating state and the read voltage $V_{READR}$ is supplied to the plate line PL.

Figure 30:
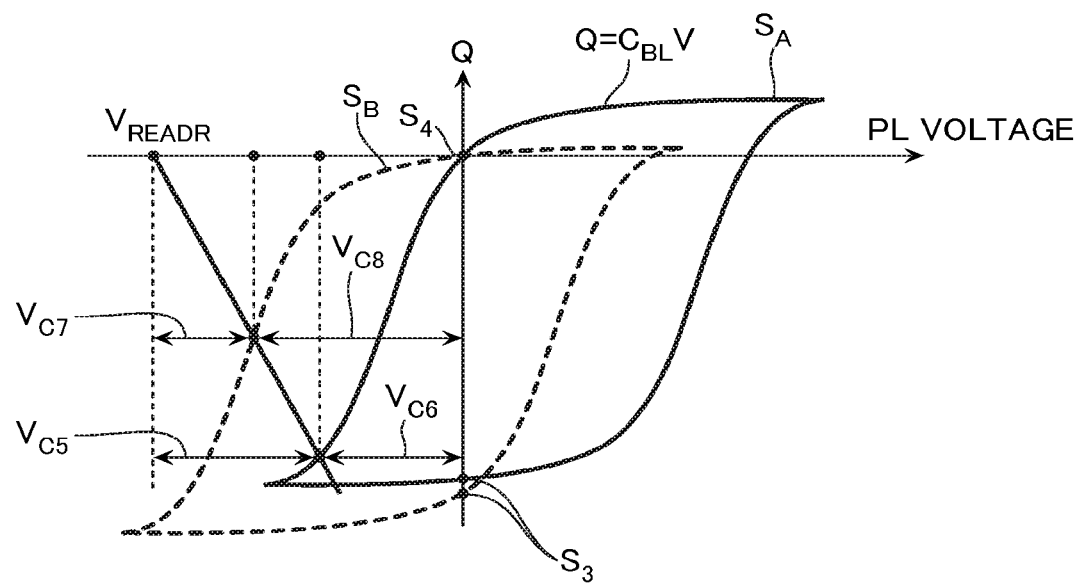
FIG. 30 is a schematic graph describing the adjustment method of the erase voltage $V_{era}$.

Here, for example, as illustrated in FIG. 27, while the read operation is performed, between the grounding terminal and the plate line PL, the capacitor $C_{BL}$, the bit line $BL_R$, the select transistor $ST_R$, and the capacitor $C_R$ are connected in series. FIG. 30 is a schematic graph illustrating a state of voltage division between the capacitor $C_{BL}$ and the capacitor $C_R$ while the read operation is performed.

The memory cell $MC_R$ target for the read operation at Step S401 is controlled to be in the state $S_4$.

For example, in a case where the ferroelectric film 133 in the capacitor $C_R$ is in the state $S_A$, when the read voltage $V_{READR}$ of negative polarity is supplied to the plate line PL, the polarization state of the ferroelectric film 133 changes at a point when the voltage division of the capacitor $C_R$ reaches a certain magnitude, and the electric charges accumulated in the capacitor $C_R$ are discharged. In association with this, the voltage division of the bit line $BL_R$ significantly increases. Accordingly, at the point when the voltage of the plate line PL reaches the read voltage $V_{READR}$, the voltage (the voltage division of the capacitor $C_{BL}$) of the bit line $BL_R$ becomes a voltage $V_{C5}$ and the voltage division of the capacitor $C_R$ becomes a voltage $V_{C6}$ (=$V_{READR}$-$V_{C5}$).

On the other hand, in a case where the ferroelectric film 133 in the capacitor $C_R$ is in the state $S_B$, when the read voltage $V_{READR}$ of negative polarity is supplied to the plate line PL, at the point when the voltage division of the capacitor $C_R$ reaches a certain magnitude, the polarization state of the ferroelectric film 133 changes, and the electric charges accumulated in the capacitor $C_R$ are discharged. In association with this, the voltage division of the bit line $BL_R$ significantly increases. Here, the voltage at which the polarization state of the ferroelectric film 133 in the state $S_B$ changes is smaller than the voltage at which the polarization state of the ferroelectric film 133 in the state $S_A$ changes. Therefore, at the point when the voltage of the plate line PL reaches the read voltage $V_{READR}$, the voltage (the voltage division of the capacitor $C_{BL}$) of the bit line $BL_R$ becomes a voltage $V_{C7}$ smaller than the voltage $V_{C5}$ and the voltage division of the capacitor $C_R$ becomes a voltage $V_{C8}$ (=$V_{READR}$-$V_{C7}$).

Therefore, by detecting the magnitude relationship between the voltage of the bit line $BL_R$ and the voltage $V_{REF}$ ($V_{C7}$<$V_{REF}$<$V_{C5}$) in this state by the sense amplifier SA (FIG. 27) in the peripheral circuit PC, it can be detected whether the capacitor $C_R$ is in the state $S_A$ or the state $S_B$.

Note that the ferroelectric film 133 in the memory cell $MC_R$ transitions from the state $S_4$ to the state $S_3$ by performing the read operation.

At Step S402 (FIG. 29), in the read operation on the memory cell $MC_R$, it is determined whether the memory cell $MC_R$ is in the state $S_A$ or the state $S_B$. When the memory cell $MC_R$ is in the state $S_A$, the process proceeds to Step S403. When the memory cell $MC_R$ is in the state $S_B$, the process proceeds to Step S404.

At Step S403, the erase voltage $V_{era}$ is set to the erase voltage $V_{eraA}$ and the adjustment of the voltage is terminated.

At Step S404, the erase voltage $V_{era}$ is set to the erase voltage $V_{eraB}$ and the adjustment of the voltage is terminated.

Note that after the termination of the process depicted in FIG. 29, the erase sequence is performed.

[State of Imprint of Memory Cell $MC_F$]

Figure 31:
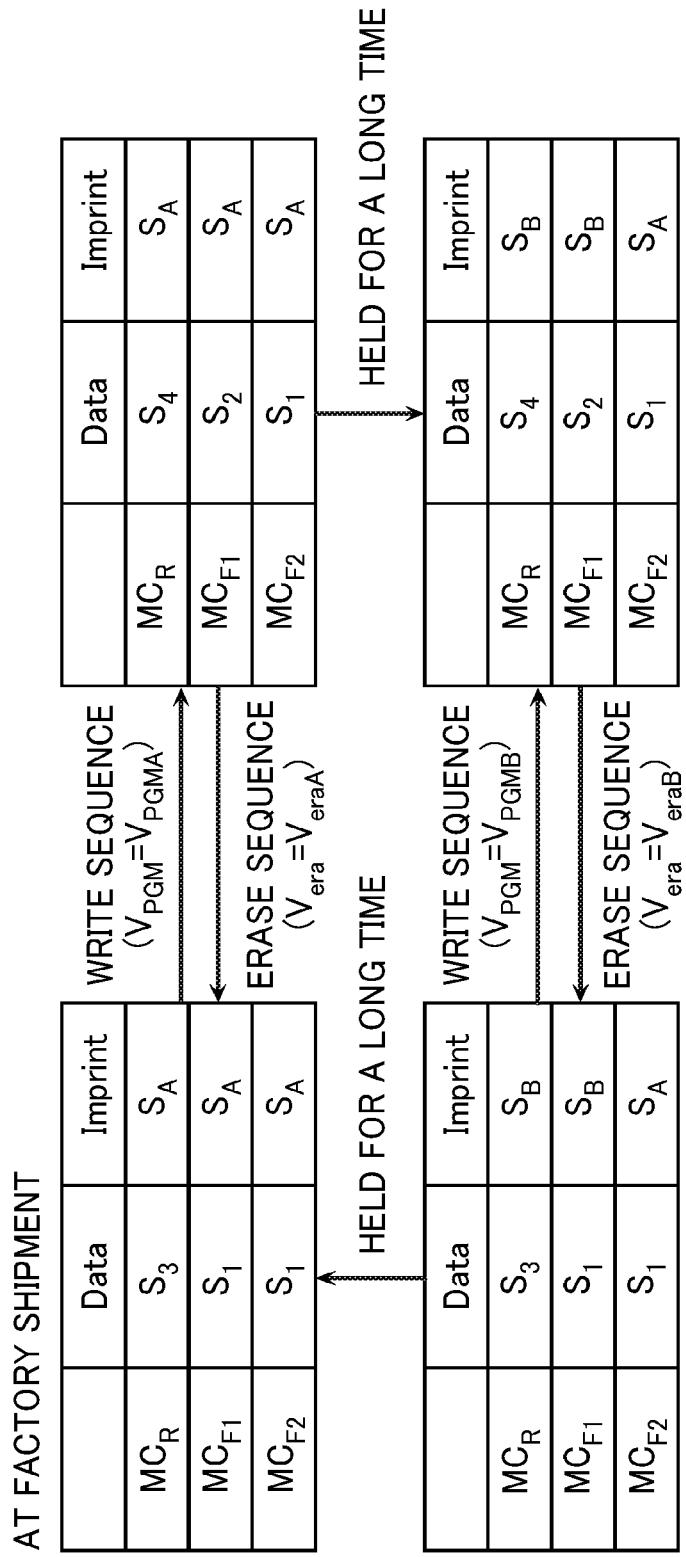
FIG. 31 is a schematic state transition diagram describing a state of imprint of the memory cell $MC_F$ according to the first embodiment.

In the example illustrated in FIG. 31, at factory shipment, the ferroelectric film 123 in the memory cell $MC_F$ and the ferroelectric film 133 in the memory cell $MC_R$ are set to be in the erase state (states $S_1$, $S_3$). However, at factory shipment, the ferroelectric film 123 in the memory cell $MC_F$ and the ferroelectric film 133 in the memory cell $MC_R$ may be set to be in the write state (states $S_2$, $S_4$).

In a case where the write sequence is not performed on the memory cell $MC_F$ in the state $S_1$ and the memory cell $MC_R$ in the state $S_3$ for a long time, the states of imprint of the memory cells $MC_F$, $MC_R$ are maintained to the state $S_A$ or transition from the state $S_B$ to the state $S_A$.

In a case where the write sequence is performed on the memory cell $MC_F$ in the state $S_1$, first, as described above, the read operation is performed on the memory cell $MC_R$, and it is detected whether the memory cell $MC_R$ is in the state $S_A$ or the state $S_B$. According to this result, the program voltage $V_{PGM}$ is adjusted to the program voltage $V_{PGMA}$ or the program voltage $V_{PGMB}$ and the write sequence is performed in the state. Thus, this memory cell $MC_F$ transitions from the state $S_1$ to the state $S_2$. The memory cell $MC_R$ corresponding to this memory cell $MC_F$ transitions from the state $S_3$ to the state $S_4$.

In a case where the erase sequence is not performed on the memory cell $MC_F$ in the state $S_2$ or the memory cell $MC_R$ in the state $S_4$ for a long time, the states of imprint of the memory cells $MC_F$, $MC_R$ are maintained to the state $S_B$ or transition from the state $S_A$ to the state $S_B$.

In a case where the erase sequence is performed on the memory cell $MC_F$ in the state $S_2$, first, as described above, the read operation is performed on the memory cell $MC_R$, and it is detected whether the memory cell $MC_R$ is in the state $S_A$ or the state $S_B$. According to this result, the erase voltage $V_{era}$ is adjusted to the erase voltage $V_{eraA}$ or the erase voltage $V_{eraB}$ and the erase sequence is performed in the state. Thus, this memory cell $MC_F$ transitions from the state $S_2$ to the state $S_1$. The memory cell $MC_R$ corresponding to this memory cell $MC_F$ transitions from the state $S_4$ to the state $S_3$.

[Assignment of Memory Cell $MC_R$ for Memory Cell $MC_F$]

As described above, in this embodiment, the write sequence is performed on the memory cell $MC_F$ in units of pages PG. When the write sequence or the erase sequence is performed on the memory cell $MC_F$, the state of the memory cell $MC_R$ also changes. In the case, for example, one page PG in the memory cell array $MCA_F$ may be made to correspond to at least one memory cell $MC_R$ in the memory cell array $MCA_R$. Note that the capacitors $C_R$ connected between the bit lines $BL_R$ and the plate lines PL each can be independently operated.

Second Embodiment

Figure 32:
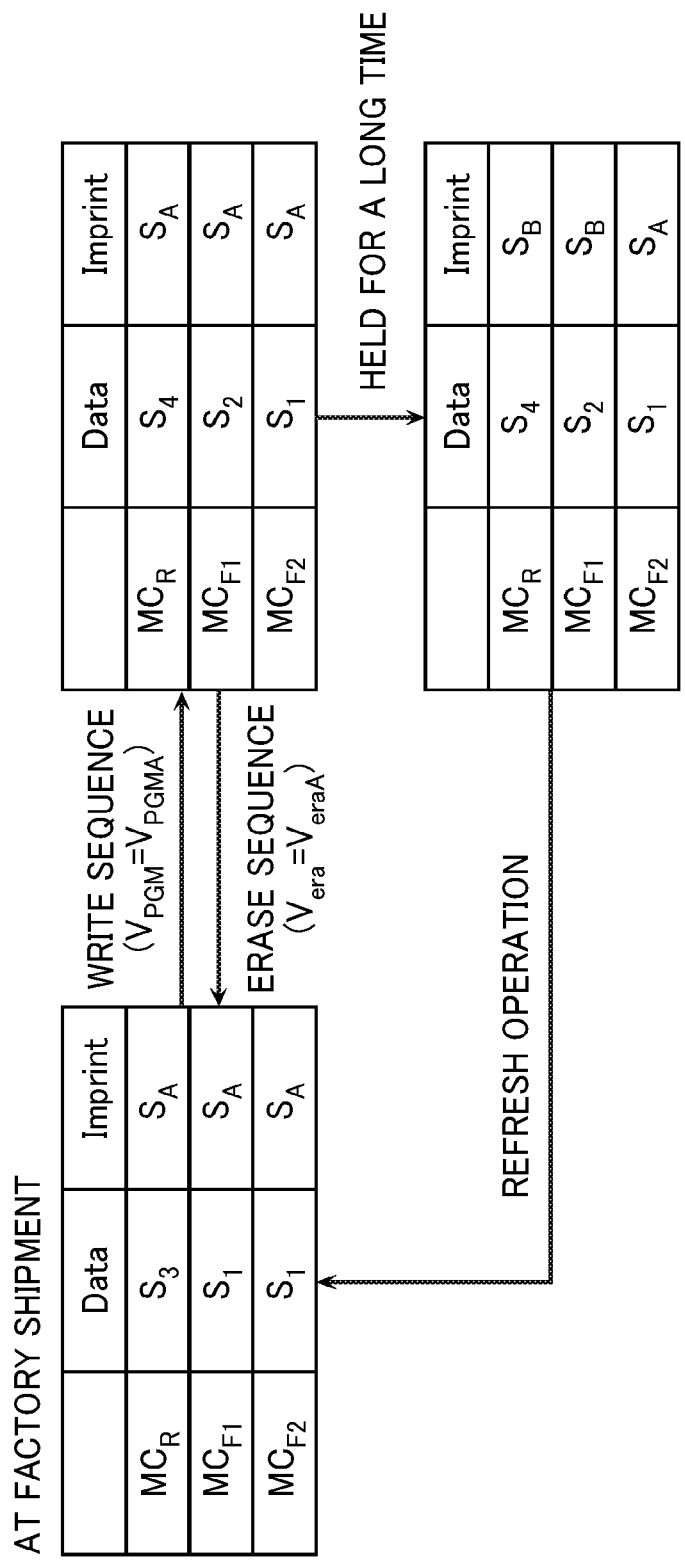
FIG. 32 is a schematic state transition diagram describing a state of imprint of the memory cell $MC_F$ according to a second embodiment.
Figure 33:
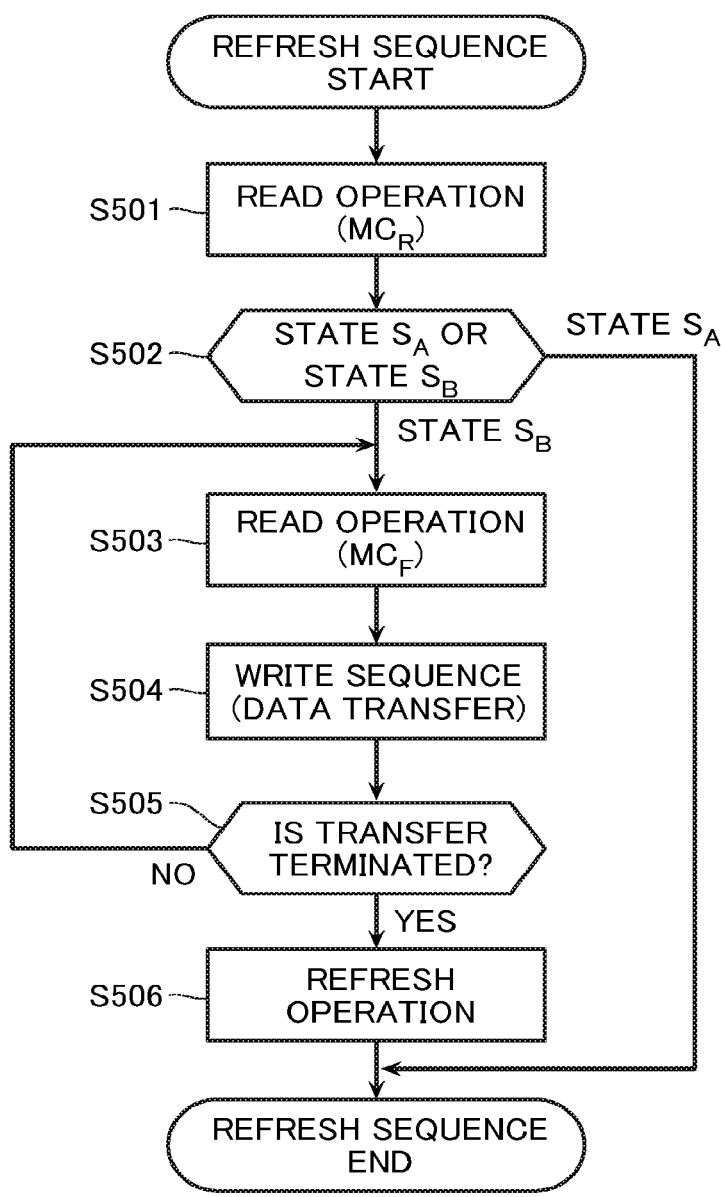
FIG. 33 is a schematic flowchart describing a refresh sequence of a semiconductor memory device according to the second embodiment.

Next, with reference to FIG. 32 and FIG. 33, a semiconductor memory device according to the second embodiment will be described. FIG. 32 is a schematic state transition diagram describing the operation of the semiconductor memory device according to the second embodiment. FIG. 33 is a schematic flowchart describing the operation of the semiconductor memory device according to the second embodiment.

The semiconductor memory device according to the second embodiment is basically configured similar to the semiconductor memory device according to the first embodiment.

However, in the second embodiment, for example, as illustrated in FIG. 32, the read operation is periodically performed on the memory cell $MC_R$ in the state $S_A$ and it is determined whether the memory cell $MC_R$ in the state $S_B$ is not included. In a case where the memory cell $MC_R$ in the state $S_B$ is detected, a refresh operation is performed on the string unit SU corresponding to this memory cell $MC_R$ and the state of imprint of the memory cell $MC_F$ in this string unit SU is transitioned to the state $S_A$.

Here, when the write sequence is performed on the page PG in the memory cell array $MCA_F$, this page PG includes the memory cells $MC_F$ where the polarization state is controlled and the memory cells $MC_F$ where the polarization state is not controlled. Accordingly, a rewrite count on the page PG and a rewrite count on each memory cell $MC_F$ included in the page PG are not always matched. On the other hand, the rewrite count on the page PG and a rewrite count on the memory cell $MC_R$ corresponding to this page PG are matched. Therefore, the influence of imprint in the memory cell $MC_R$ is larger than the influence of imprint in the memory cell $MC_F$. Accordingly, by monitoring the state of imprint in the memory cell $MC_R$, the state of imprint of the memory cell $MC_F$ can be preferably controlled.

Next, with reference to FIG. 33, a refresh sequence of the semiconductor memory device according to the second embodiment is described. The operation depicted in FIG. 33 may be performed, for example, after a command indicative of performing the refresh sequence on the memory die MD is input.

At Step S501, for example, the read operation described with reference to FIG. 30 is performed on the plurality of memory cells $MC_R$ corresponding to the plurality of pages PG included in the string unit SU. Thus, the memory cell $MC_R$ in the state $S_A$ imprinted in the negative direction and the memory cell $MC_R$ in the state $S_B$ imprinted in the positive direction are discriminated.

At Step S502, it is determined whether the state of imprint of the memory cell $MC_R$ read at Step S501 is the state $S_A$ or the state $S_B$. In a case where the memory cell $MC_R$ is in the state $S_A$, the refresh sequence is terminated. In a case where the memory cell $MC_R$ is in the state $S_B$, the process proceeds to Step S503.

At Step S503, the read operation is performed on one of the plurality of pages PG included in this string unit SU and user data stored in this page PG is obtained.

At Step S504, the write sequence is performed, and the user data obtained at Step S503 is written to the page PG in another string unit SU.

At Step S505, it is determined whether data in all of the pages PG included in the string unit SU have been transferred to another string unit SU or not. When the data are not transferred, the process proceeds to Step S503. When the data have been transferred, the process proceeds to Step S506.

At Step S506, the refresh operation is performed. For example, the refresh operation may be performed similarly to the erase operation, which has been described with reference to FIG. 22. Note that the voltage supplied to the source line SL in the refresh operation may be larger than the erase voltage $V_{era}$. The time period during which this voltage is supplied may be longer than the time period during which the erase voltage $V_{era}$ is supplied to the source line SL in the erase operation. [Assignment of Memory Cell $MC_R$ for Memory Cell $MC_F$]

As described above, in this embodiment, the write sequence is performed in units of pages PG. Even in a case where the read operation is performed on the memory cell $MC_R$, the write sequence, the erase sequence, or the refresh operation is not performed on the memory cell $MC_F$ in some cases. In the case, for example, one page PG in the memory cell array $MCA_F$ may be made to correspond to the plurality of memory cells $MC_R$ in the memory cell array $MCA_R$.

Third Embodiment

Figure 34:
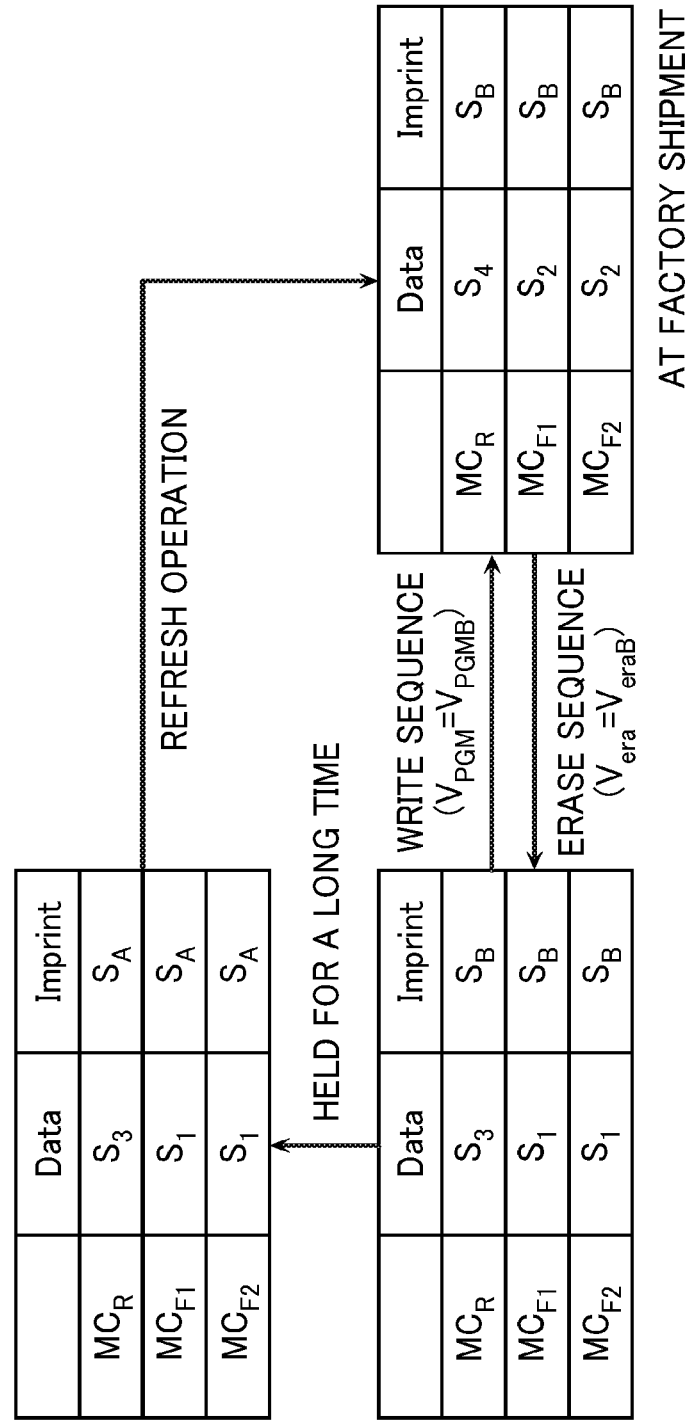
FIG. 34 is a schematic state transition diagram describing a state of imprint of the memory cell $MC_F$ according to a third embodiment.
Figure 35:
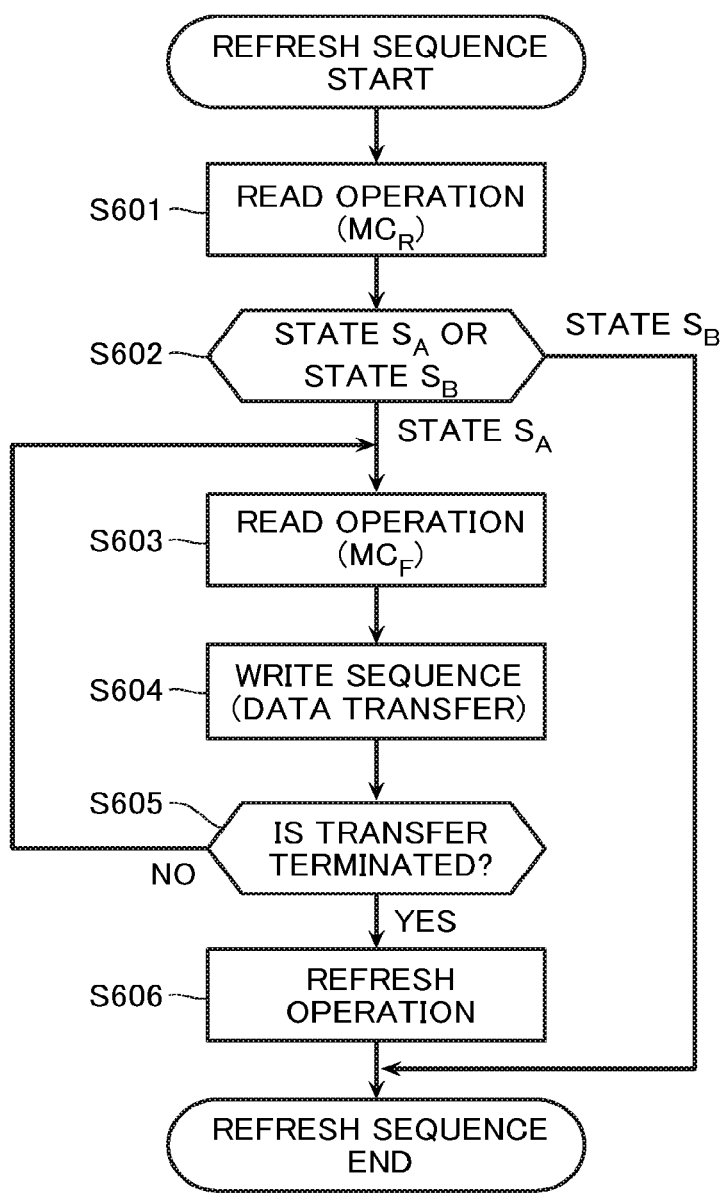
FIG. 35 is a schematic flowchart describing a refresh sequence of a semiconductor memory device according to the third embodiment.

Next, with reference to FIG. 34 and FIG. 35, a semiconductor memory device according to the third embodiment is described. FIG. 34 is a schematic state transition diagram describing the operation of the semiconductor memory device according to the third embodiment. FIG. 35 is a schematic flowchart describing the operation of the semiconductor memory device according to the third embodiment.

The semiconductor memory device according to the third embodiment is basically configured similarly to the semiconductor memory device according to the second embodiment.

However, in the second embodiment, for example, as described with reference to FIG. 32 and the like, at factory shipment, the ferroelectric film 123 in the memory cell $MC_F$ and the ferroelectric film 133 in the memory cell $MC_R$ are set to be in the erase state (the states $S_1$, $S_3$). Accordingly, the ferroelectric film 123 in the memory cell $MC_F$ and the ferroelectric film 133 in the memory cell $MC_R$ are in the state $S_A$ imprinted in the negative direction. In the case where the states of imprint of the memory cells $MC_F$, $MC_R$ transition to the state $S_B$, the refresh operation is performed such that the states of imprint of the memory cells $MC_F$, $MC_R$ transition to the state $S_A$.

On the other hand, in the third embodiment, for example, as illustrated in FIG. 34, at factory shipment, the ferroelectric film 123 in the memory cell $MC_F$ and the ferroelectric film 133 in the memory cell $MC_R$ are set to be in the write states (states $S_2$, $S_4$). Accordingly, the ferroelectric film 123 in the memory cell $MC_F$ and the ferroelectric film 133 in the memory cell $MC_R$ are set to be in the state $S_B$ imprinted in the positive direction. In a case where the states of imprint of the memory cells $MC_F$, $MC_R$ transition to the state $S_A$, the refresh operation is performed such that the states of imprint of the memory cells $MC_F$, $MC_R$ transition to the state $S_B$.

Next, with reference to FIG. 35, the refresh sequence of the semiconductor memory device according to the third embodiment is described. The operation depicted in FIG. 35 may be performed, for example, after a command indicative of performing the refresh sequence on the memory die MD is input.

At Step S601, for example, the read operation described with reference to FIG. 28 is performed on the plurality of memory cells $MC_R$ corresponding to the plurality of pages PG included in the string unit SU. Thus, the memory cell $MC_R$ in the state $S_A$ imprinted in the negative direction and the memory cell $MC_R$ in the state $S_B$ imprinted in the positive direction are discriminated.

At Step S602, it is determined whether the state of imprint of the memory cell $MC_R$ read at Step S601 is the state $S_A$ or the state $S_B$. In a case where the memory cell $MC_R$ is in the state $S_A$, the process proceeds to Step S603. In a case where the memory cell $MC_R$ is in the state $S_B$, the refresh sequence is terminated.

Step S603 to Step S605 are performed similarly to Step S503 to Step S505 (FIG. 33).

At Step S606, the refresh operation is performed. For example, the refresh operation may be performed similarly to the program operation, which has been described with reference to FIG. 19. However, in the refresh operation, a predetermined voltage may be supplied to all word lines $WL_F$ included in the string unit SU. This voltage may be larger than the program voltage $V_{PGM}$. The time period during which this voltage is supplied may be longer than the time period during which the program voltage $V_{PGM}$ is supplied to the word lines $WL_F$ in the program operation.

[Assignment of Memory Cell $MC_R$ for Memory Cell $MC_F$]

In this embodiment, similarly to the second embodiment, one page PG in the memory cell array $MCA_F$ may be made to correspond to the plurality of memory cells $MC_R$ in the memory cell array $MCA_R$.

Fourth Embodiment

Figure 36:
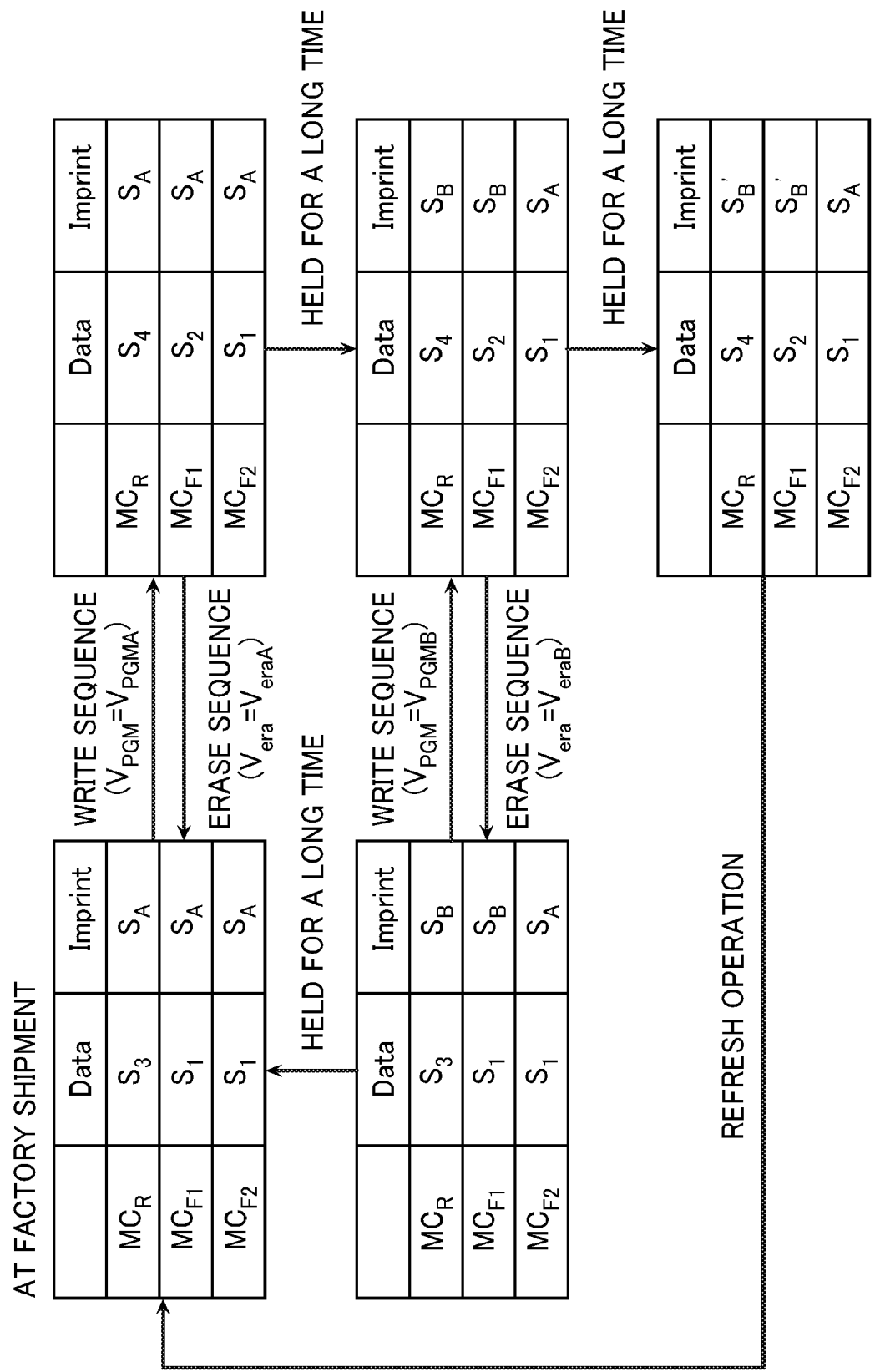
FIG. 36 is a schematic state transition diagram describing a state of imprint of the memory cell $MC_F$ according to a fourth embodiment.

Next, with reference to FIG. 36, a semiconductor memory device according to the fourth embodiment is described. FIG. 36 is a schematic state transition diagram describing the operation of the semiconductor memory device according to the fourth embodiment.

As described above, in a case where the erase sequence is not performed on the memory cell $MC_F$ in the state $S_2$ and the state $S_A$ or the memory cell $MC_R$ in the state $S_4$ and the state $S_A$ for a long time, the states of imprint of the memory cells $MC_F$, $MC_R$ transition from the state $S_A$ to the state $S_B$. Here, in a case where the erase sequence is not performed on the memory cell $MC_F$ in the state $S_2$ and the state $S_B$ or the memory cell $MC_R$ in the state $S_4$ and the state $S_B$ for a further long time, the states of imprint of the memory cells $MC_F$, $MC_R$ are possibly shifted to the positive direction further.

Here, when the erase sequence is performed on the memory cell $MC_F$, the state of the memory cell $MC_F$ transitions from the state $S_2$ to the state $S_1$. However, the memory cells $MC_F$, $MC_R$ easily transition to the state $S_2$ by supply of the comparatively small voltage of positive polarity.

For example, as described with reference to FIG. 17 and the like, in the read operation on the memory cell $MC_F$, the read pass voltage $V_{READ}$ is supplied to the unselected word lines $WL_F$. Here, in a case where the state of imprint of the memory cells $MC_F$ connected to the unselected word lines $WL_F$ is shifted in the positive direction to some extent or more, there may be a case where the memory cells $MC_F$ transition from the state $S_1$ to the state $S_2$ by supply of the read pass voltage $V_{READ}$. That is, the data held in the memory cells $MC_F$ are possibly corrupted by performing the read operation.

Therefore, in this embodiment, for example, as illustrated in FIG. 36, the read operation is periodically performed on the memory cell $MC_R$ in the state $S_4$ and it is determined whether the state of imprint of the memory cell $MC_R$ is not shifted in the positive direction to some extent or more. For example, the read operation described with reference to FIG. 30 is performed on the memory cell $MC_R$ and it is determined whether the voltage of the bit line $BL_R$ is smaller than the predetermined voltage or not. In a case where the state of imprint of the memory cell $MC_R$ is shifted in the positive direction to some extent or more, the refresh operation is performed on the string unit SU corresponding to this memory cell $MC_R$ and the state of imprint of the memory cell $MC_F$ in this string unit SU is transitioned to the state $S_A$. For example, this operation may be performed similarly to the refresh sequence according to the second embodiment.

[Assignment of Memory Cell $MC_R$ for Memory Cell $MC_F$]

In this embodiment, similarly to the second embodiment, one page PG in the memory cell array $MCA_F$ may be made to correspond to the plurality of memory cells $MC_R$ in the memory cell array $MCA_R$.

[Manufacturing Method of Semiconductor Memory Devices According to First Embodiment to Fourth Embodiment]

Next, with reference to FIG. 37 to FIG. 62, the manufacturing method of the structure described with reference to FIG. 9 to FIG. 12 is described. FIG. 37 to FIG. 62 are schematic cross-sectional views describing the manufacturing method. FIG. 37, FIG. 38, and FIG. 57 to FIG. 60 illustrate cross-sectional surfaces corresponding to FIG. 9. FIG. 39 to FIG. 44, FIG. 61, and FIG. 62 illustrate cross-sectional surfaces corresponding to FIG. 11. FIG. 45 to FIG. 56 illustrate cross-sectional surfaces corresponding to FIG. 12.

To manufacture the memory die MD, first, the transistor layer $L_{TR}$, the wiring layer D0, the wiring layer D1, and the wiring layer D2 (FIG. 7) are formed on the semiconductor substrate 100. An insulating layer (not illustrated) is formed on the upper surface of the wiring layer D2.

Figure 37:
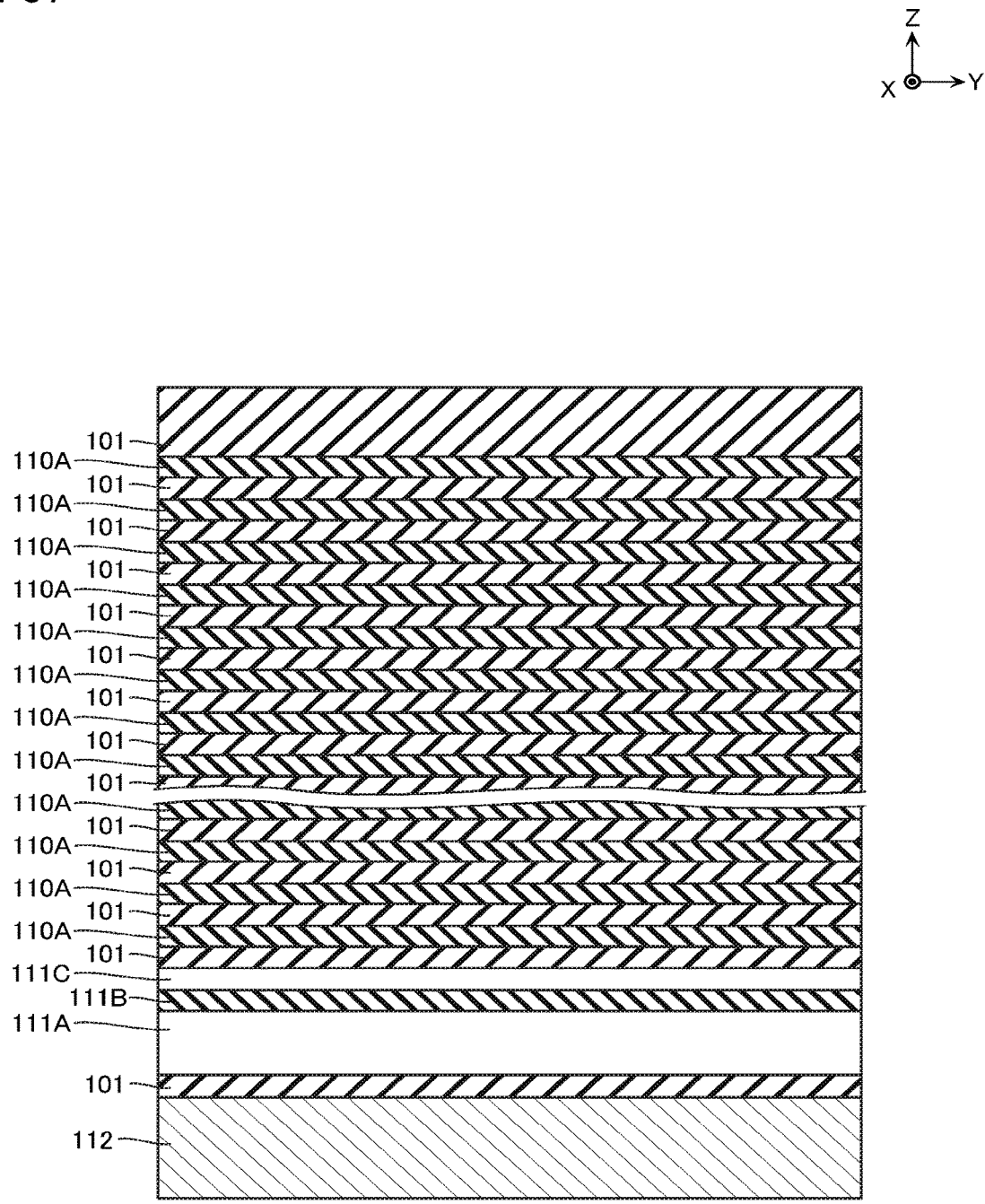
FIG. 37 is a schematic cross-sectional view describing a manufacturing method of the semiconductor memory devices according to the first embodiment to the fourth embodiment.

Next, for example, as illustrated in FIG. 37, on the insulating layer (not illustrated), the conductive layer 112, the insulating layer 101, a semiconductor layer 111A, such as silicon, a sacrifice layer 111B, such as silicon nitride, and a semiconductor layer 111C, such as silicon, are formed. The plurality of insulating layers 101 and the plurality of sacrifice layers 110A are formed in alternation. For example, this process is performed by a method, such as Chemical Vapor Deposition (CVD).

Figure 38:
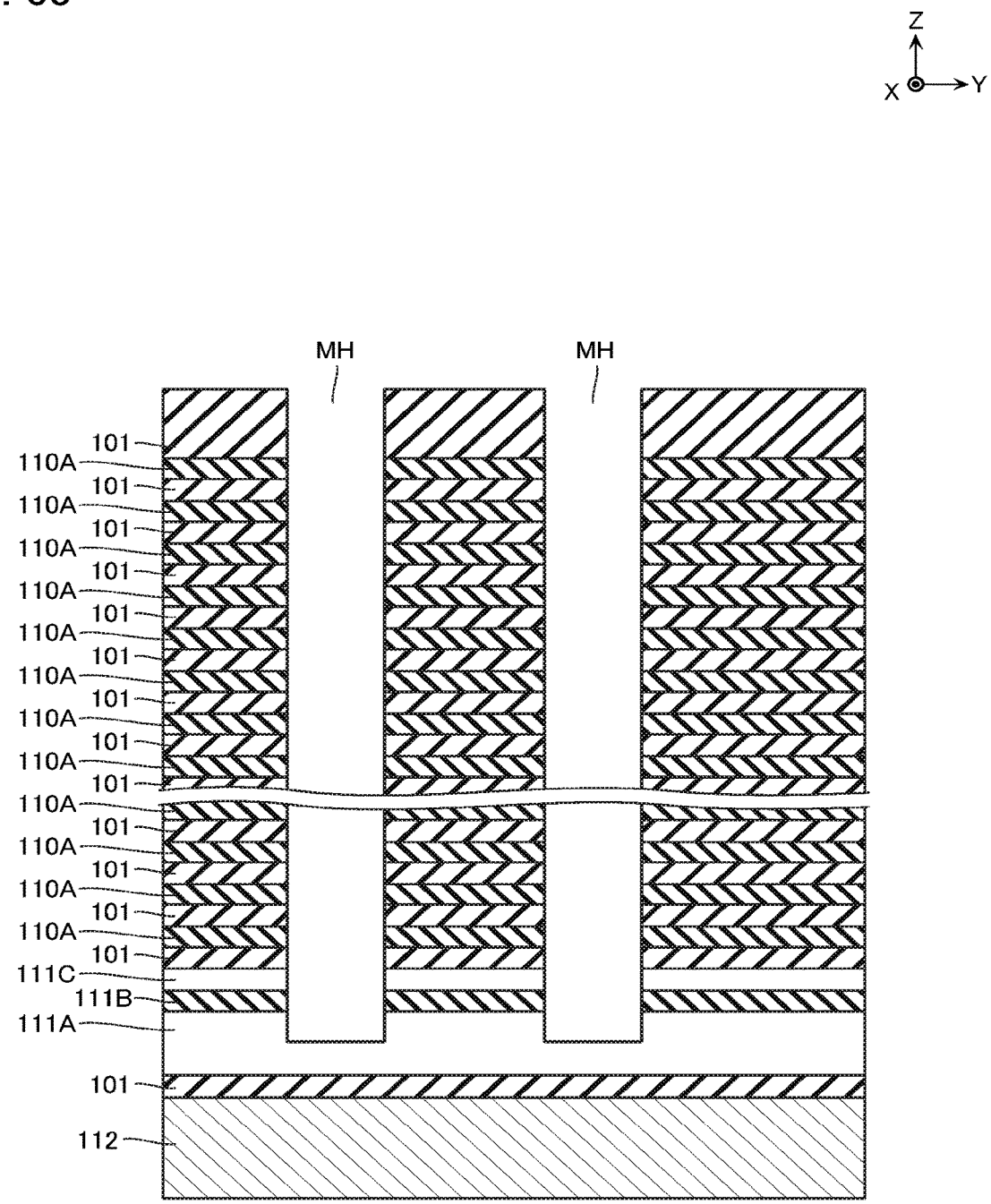
FIG. 38 is a schematic cross-sectional view describing the manufacturing method.
Figure 39:
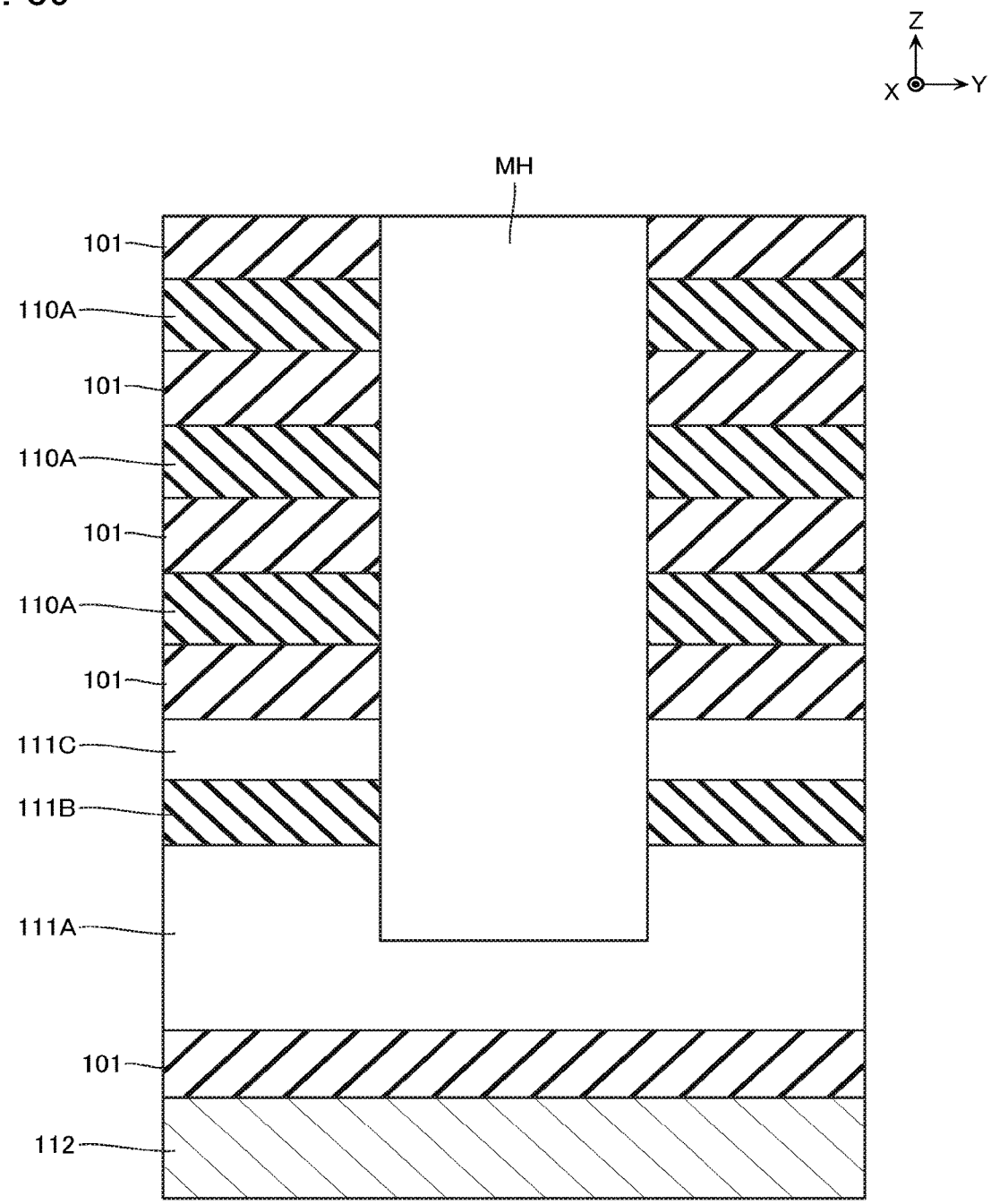
FIG. 39 is a schematic cross-sectional view describing the manufacturing method.

Next, for example, as illustrated in FIG. 38 and FIG. 39, a plurality of memory holes MH are formed at positions corresponding to the transistor structure 120 and the capacitor structure 130. The memory hole MH is a through-hole extending in the Z-direction, penetrating the insulating layers 101, the sacrifice layers 110A, the semiconductor layer 111C, and the sacrifice layer 111B to expose the upper surface of the semiconductor layer 111A. For example, this process is performed by a method, such as Reactive Ion Etching (RIE).

Figure 40:
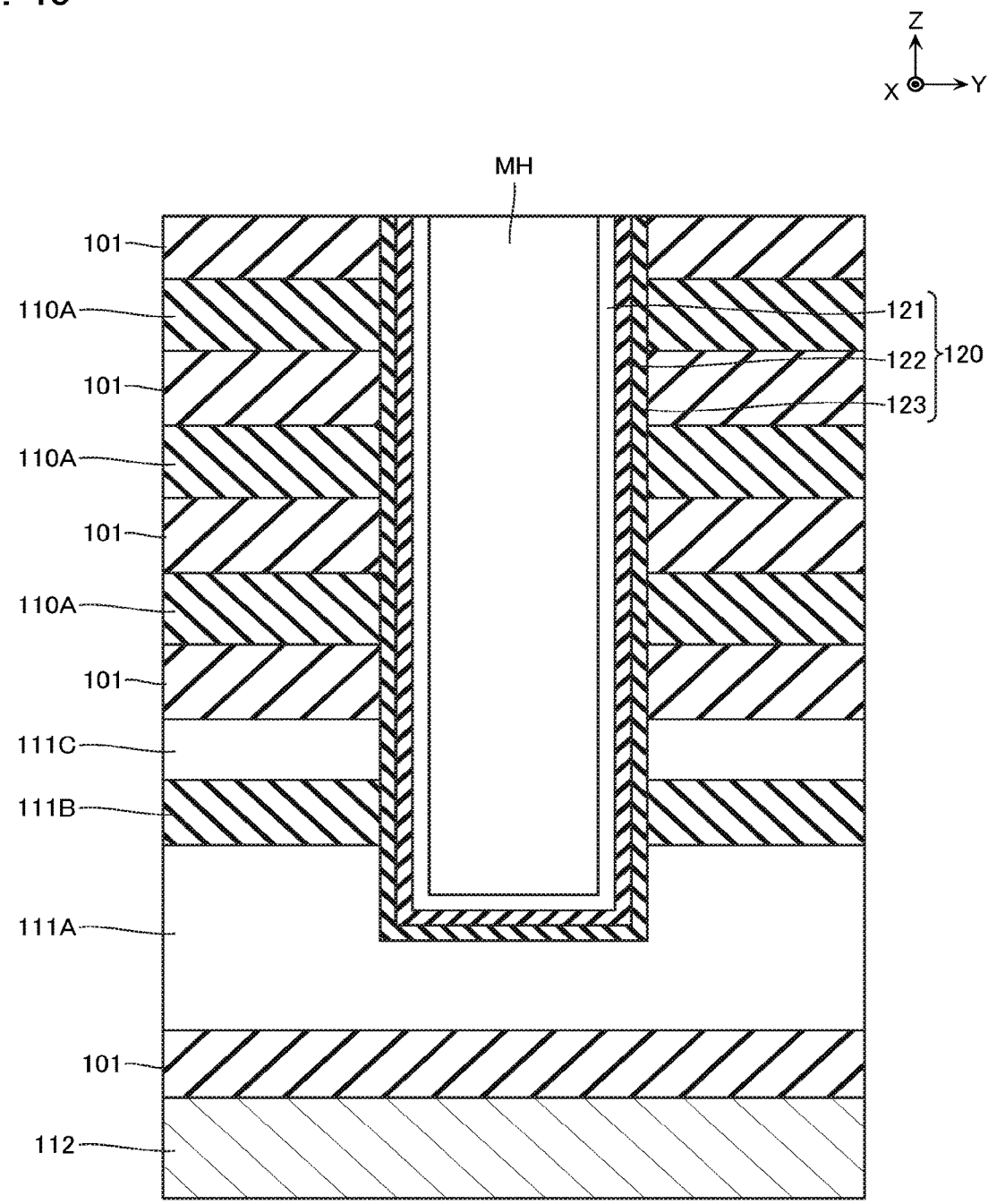
FIG. 40 is a schematic cross-sectional view describing the manufacturing method.

Next, for example, as illustrated in FIG. 40, on the inner peripheral surface of the memory hole MH, the ferroelectric film 123, the insulating layer 122, and the semiconductor layer 121 are formed. For example, this process is performed by a method, such as CVD.

Figure 41:
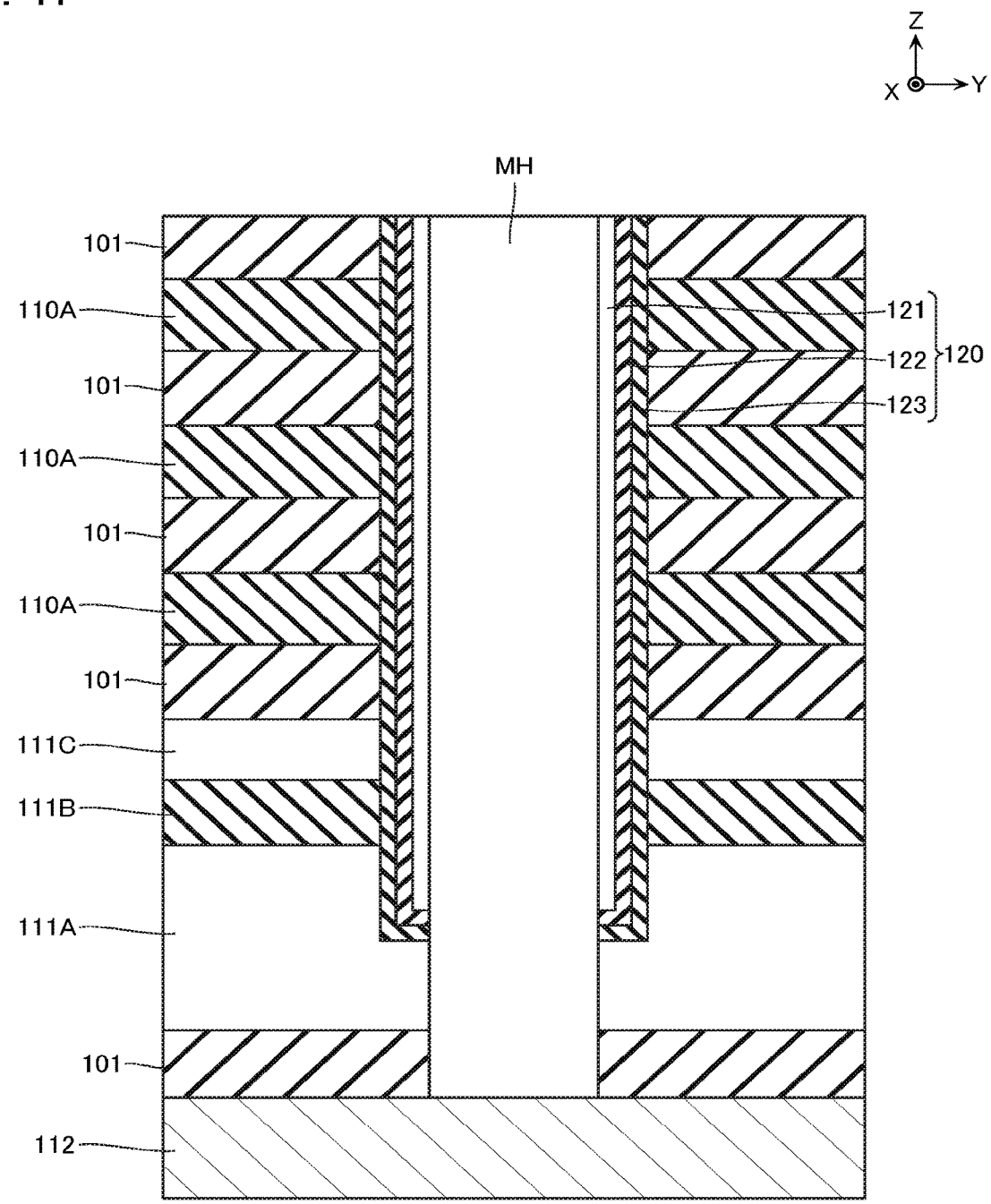
FIG. 41 is a schematic cross-sectional view describing the manufacturing method.

Next, for example, as illustrated in FIG. 41, the semiconductor layer 121, the insulating layer 122, the ferroelectric film 123, the semiconductor layer 111A, and the insulating layer 101 formed on the bottom surface of the memory hole MH are removed to expose the upper surface of the conductive layer 112. For example, this process is performed by a method, such as RIE.

Figure 42:
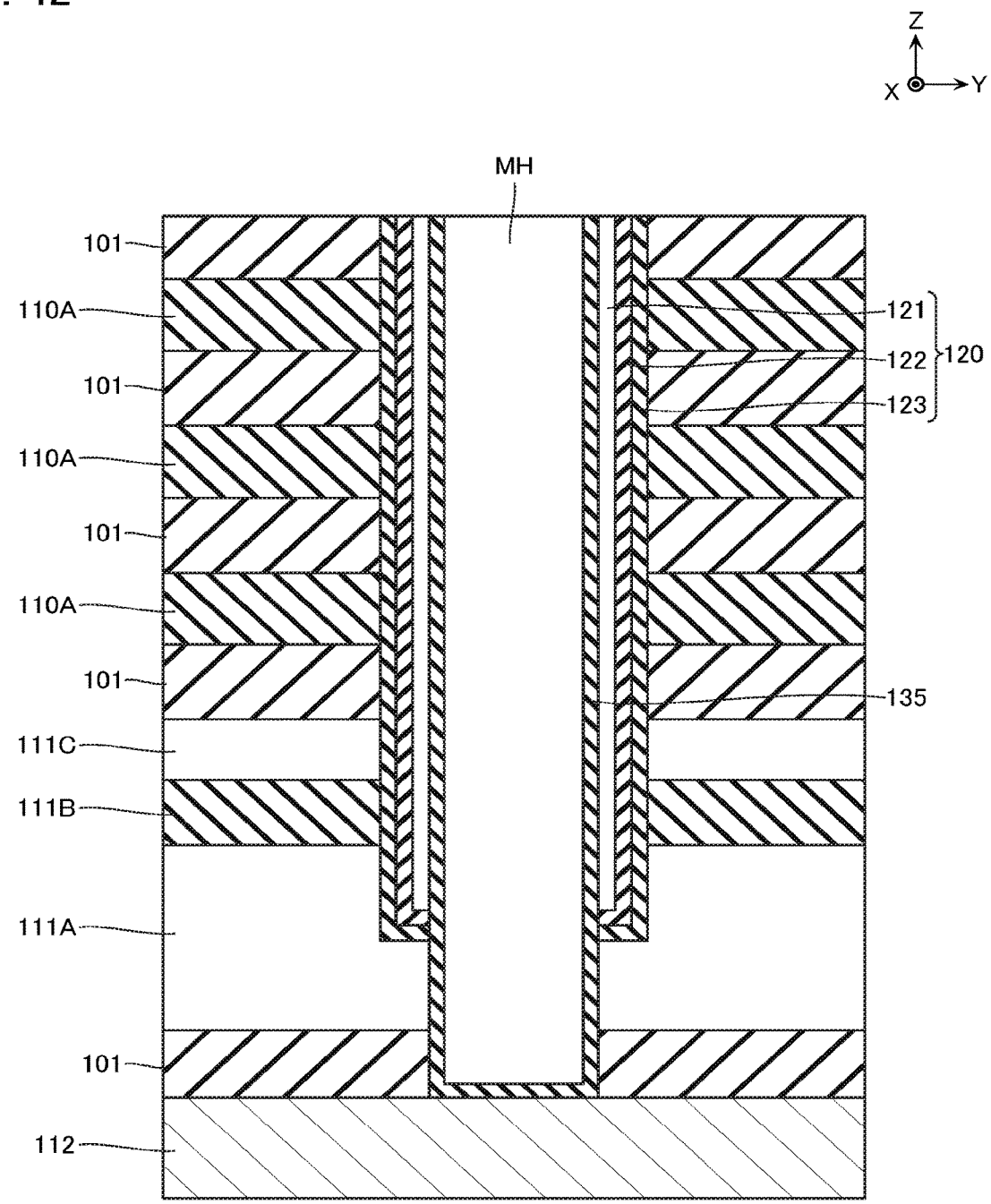
FIG. 42 is a schematic cross-sectional view describing the manufacturing method.

Next, for example, as illustrated in FIG. 42, the insulating layer 135 is formed on the inner peripheral surface of the memory hole MH. For example, this process is performed by a method, such as CVD.

Figure 43:
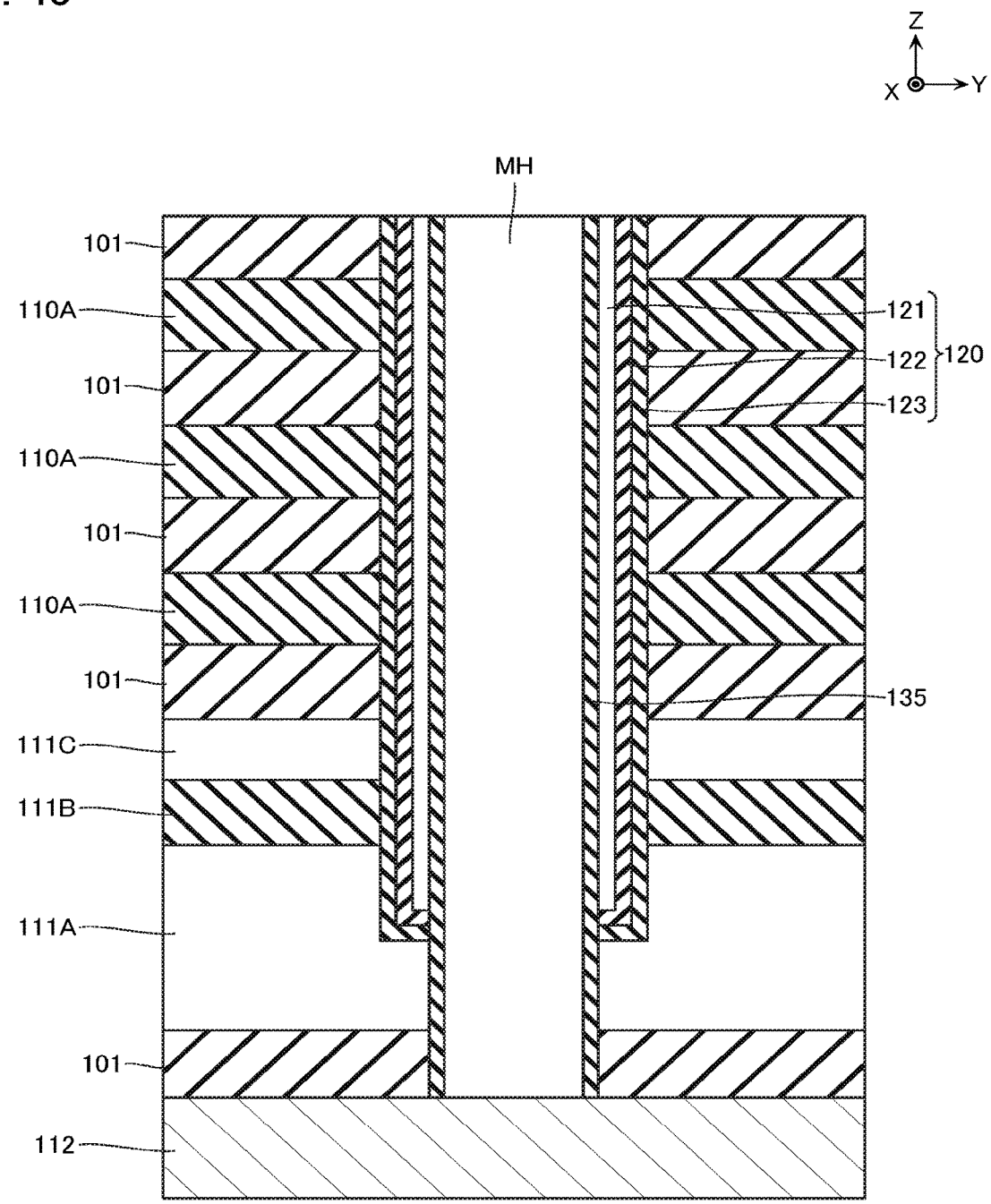
FIG. 43 is a schematic cross-sectional view describing the manufacturing method.

Next, for example, as illustrated in FIG. 43, the insulating layer 135 formed on the bottom surface of the memory hole MH is removed to expose the upper surface of the conductive layer 112. For example, this process is performed by a method, such as RIE.

Figure 44:
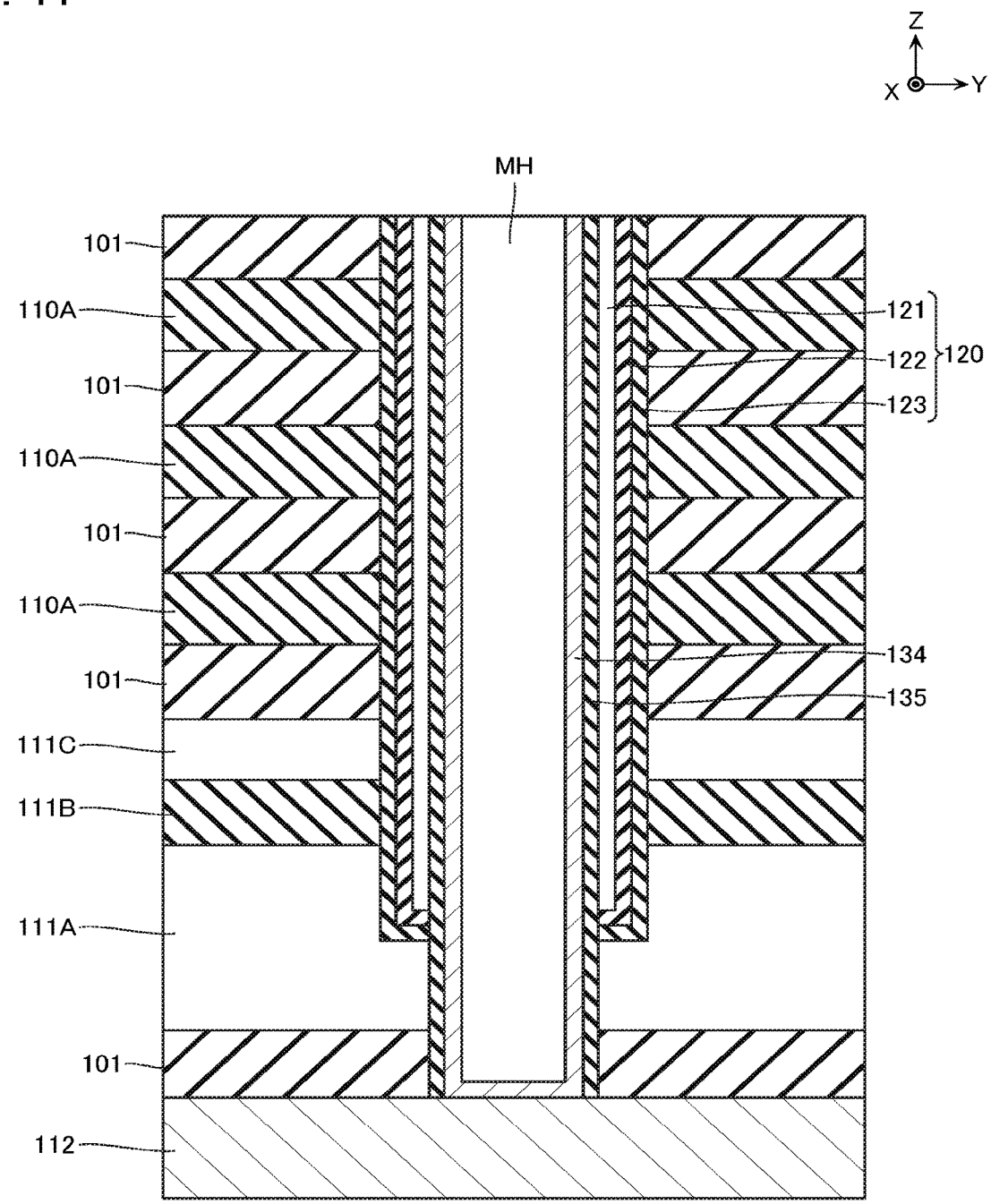
FIG. 44 is a schematic cross-sectional view describing the manufacturing method.
Figure 45:
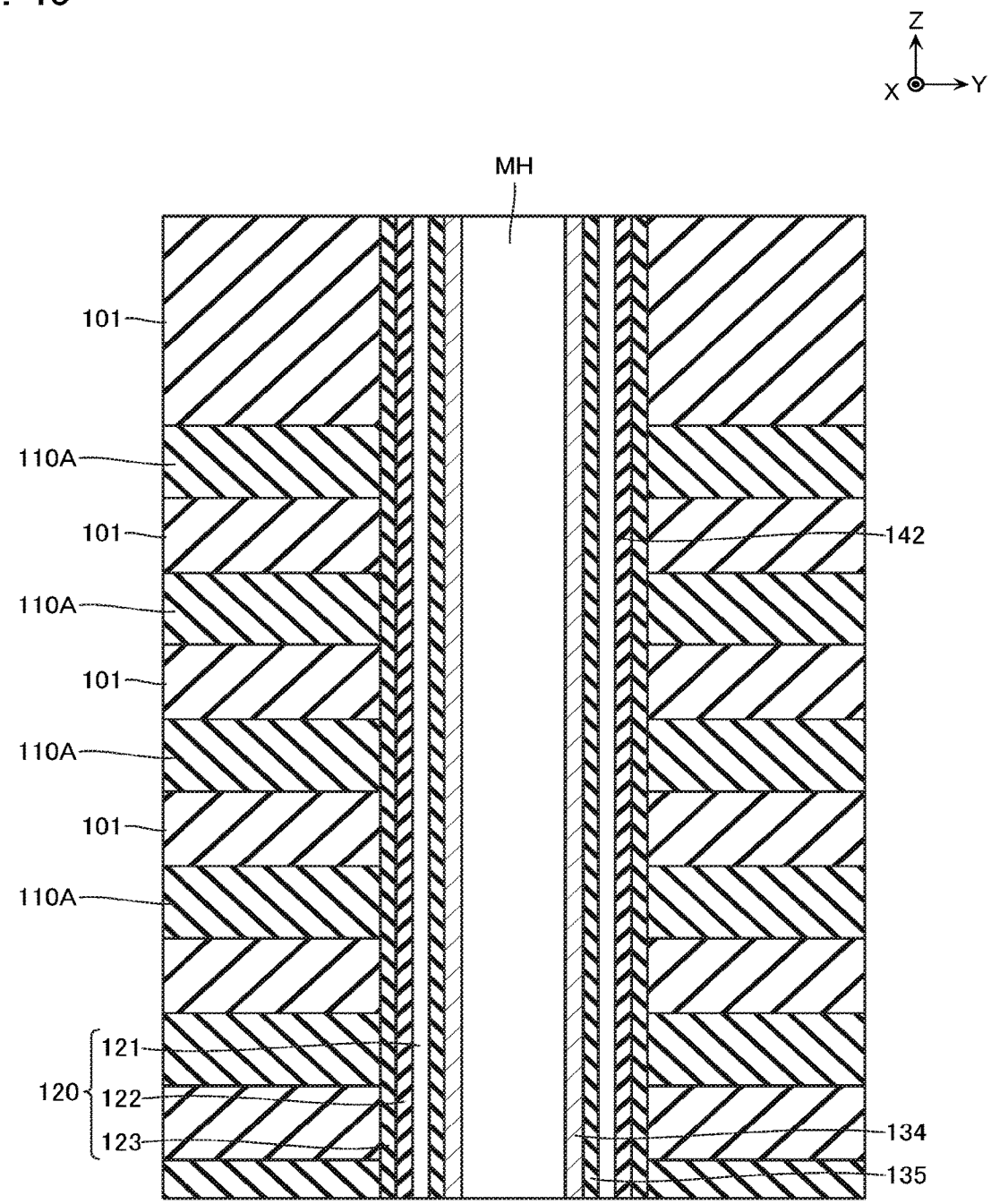
FIG. 45 is a schematic cross-sectional view describing the manufacturing method.

Next, for example, as illustrated in FIG. 44 and FIG. 45, the conductive layer 134 is formed on the inner peripheral surface of the memory hole MH. For example, this process is performed by a method, such as CVD.

Figure 46:
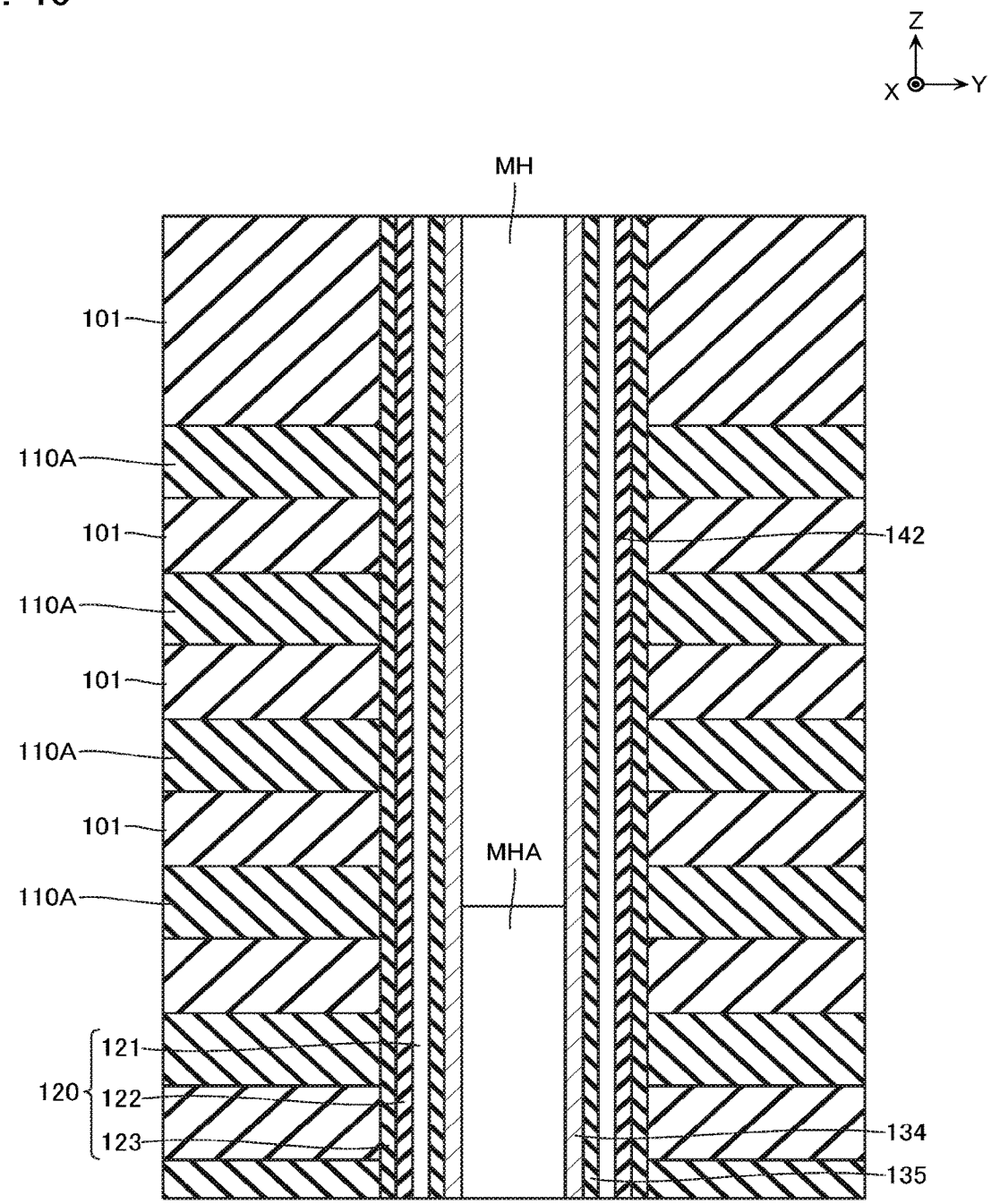
FIG. 46 is a schematic cross-sectional view describing the manufacturing method.

Next, for example, as illustrated in FIG. 46, a sacrifice layer MHA is formed inside the memory hole MH. A part of the sacrifice layer MHA is removed inside the memory hole MH by a method, such as RIE, and a position of an upper end of the sacrifice layer MHA is adjusted to be lower than lower surfaces of a part of the sacrifice layers 110A.

Figure 47:
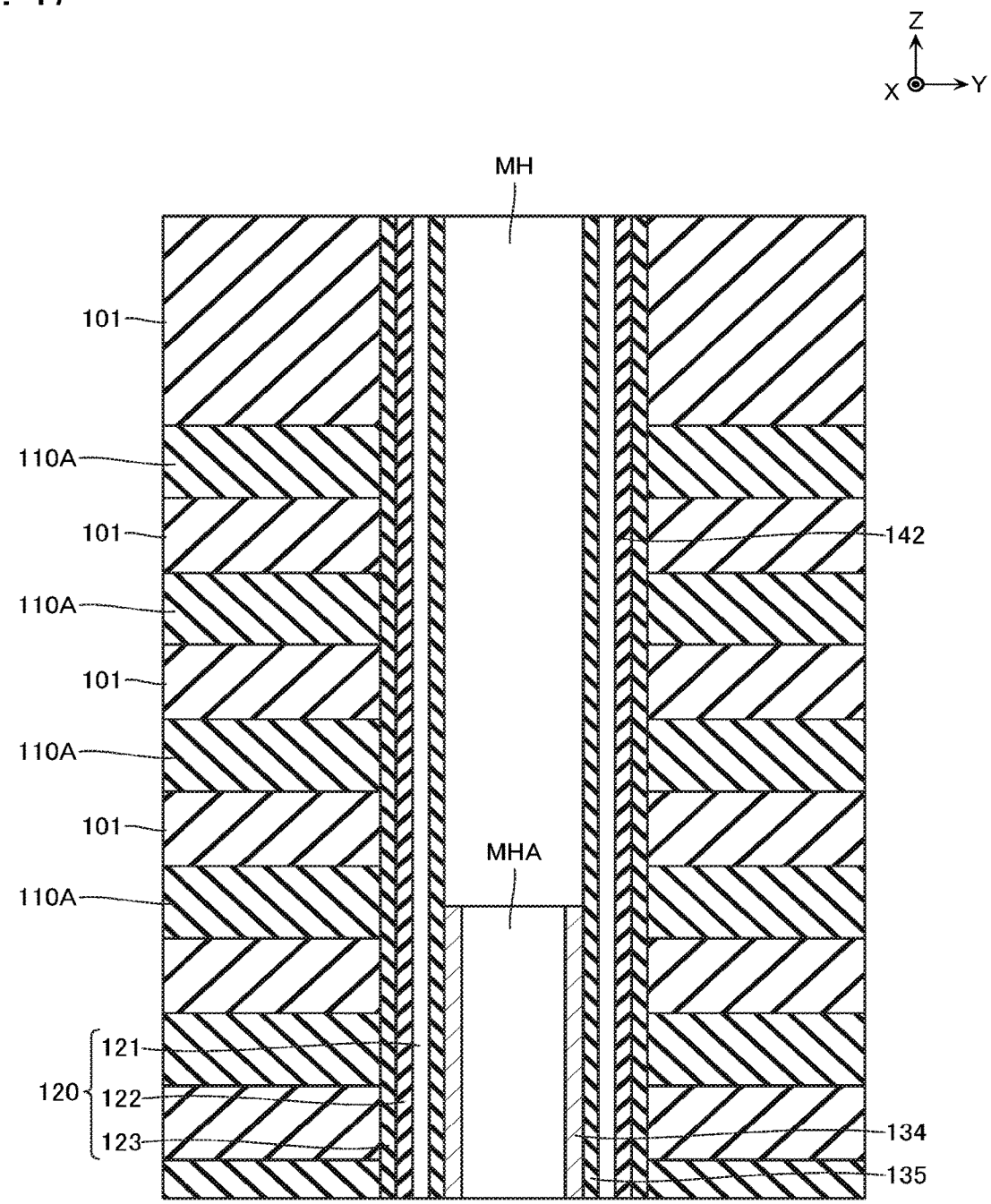
FIG. 47 is a schematic cross-sectional view describing the manufacturing method.

Next, for example, as illustrated in FIG. 47, a part of the conductive layer 134 is removed to expose the inner peripheral surface of the insulating layer 135 at the inside of the memory hole. For example, this process is performed by a method, such as wet etching.

Figure 48:
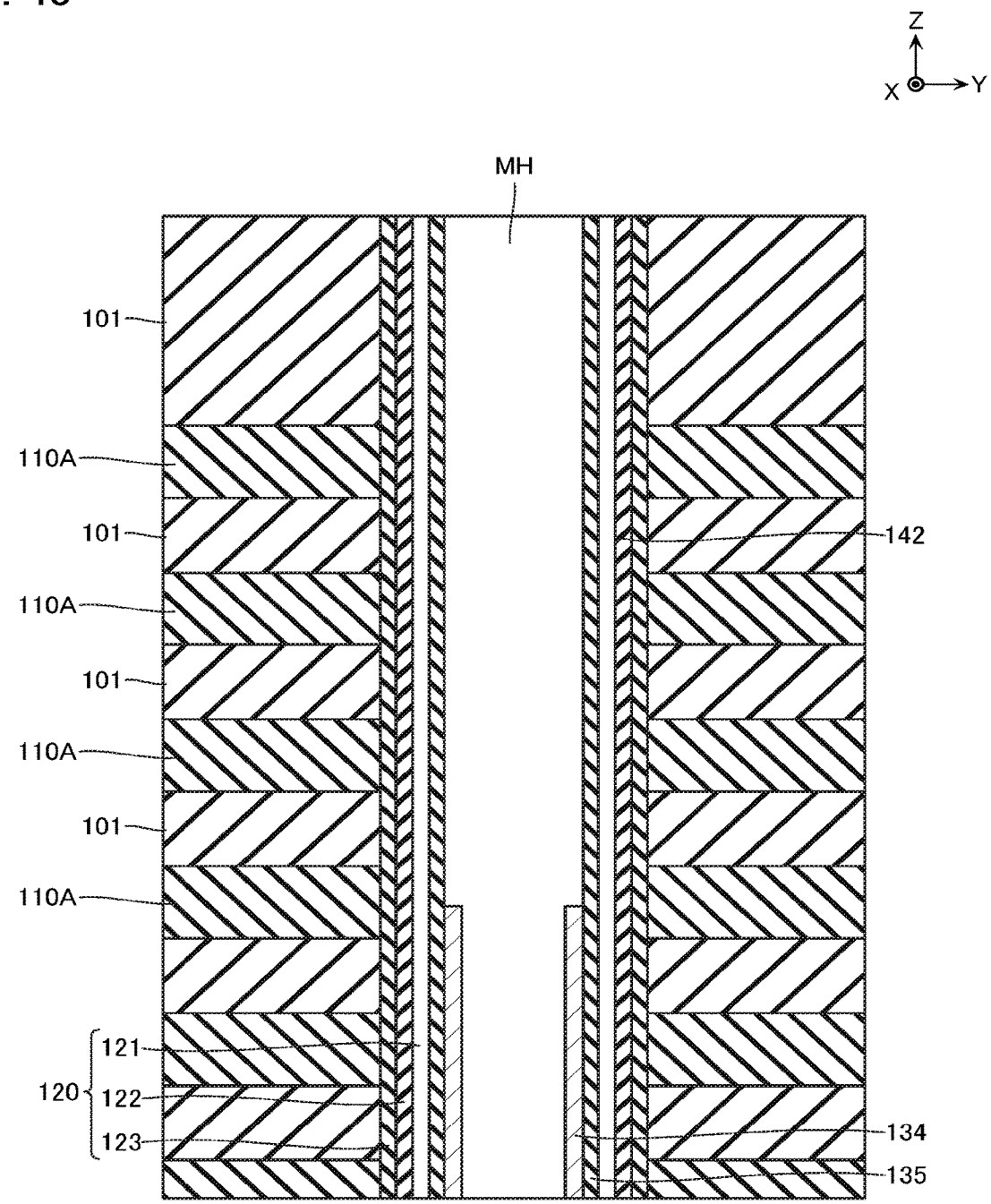
FIG. 48 is a schematic cross-sectional view describing the manufacturing method.

Next, for example, as illustrated in FIG. 48, the sacrifice layer MHA is removed.

Figure 49:
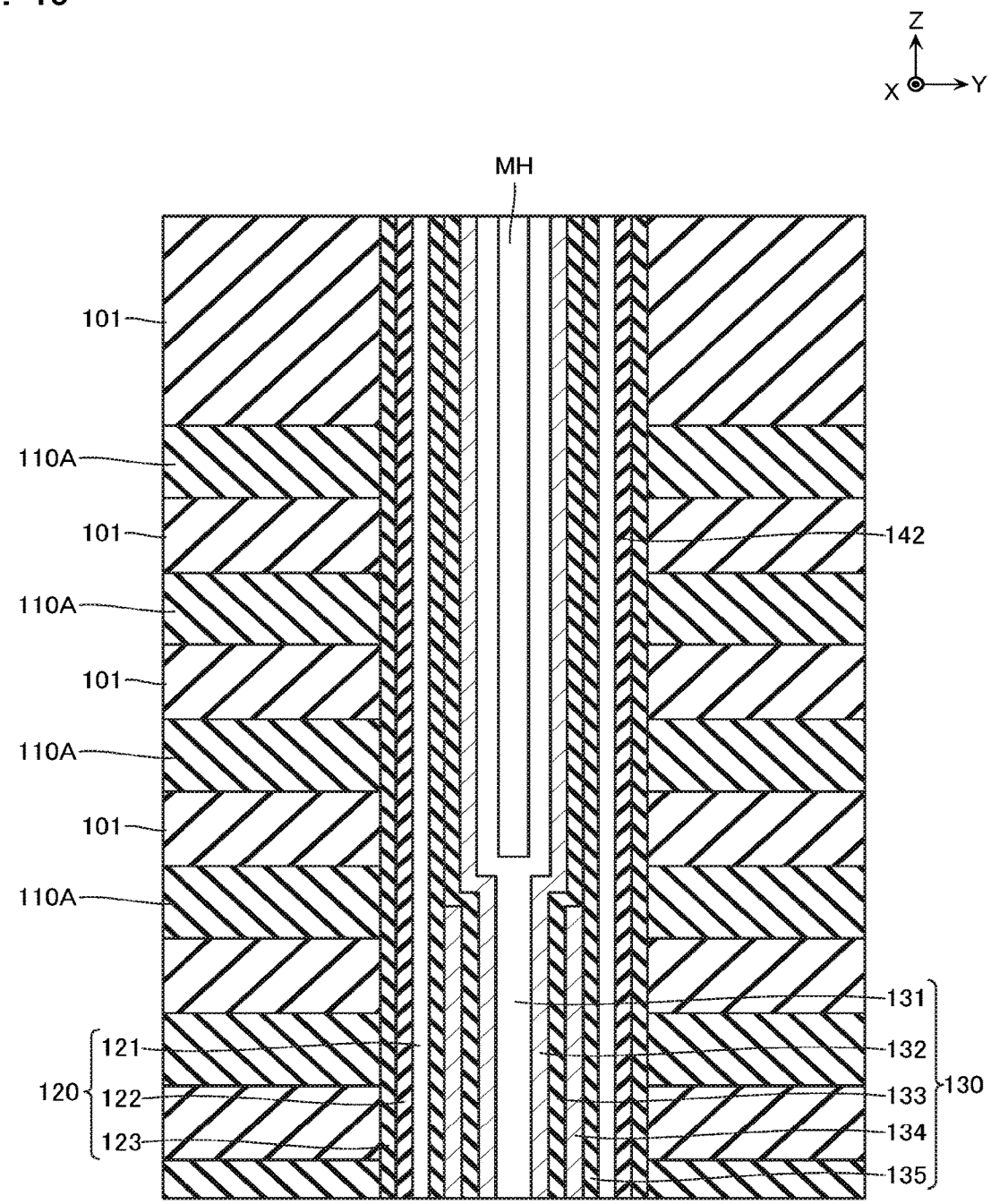
FIG. 49 is a schematic cross-sectional view describing the manufacturing method.

Next, for example, as illustrated in FIG. 49, the ferroelectric film 133, the conductive layer 132, and the semiconductor layer 131 are formed on the inner peripheral surface of the memory hole MH. For example, this process is performed by a method, such as CVD. For example, the ferroelectric film 133, the conductive layer 132, and the semiconductor layer 131 are formed to be thin to the extent that the upper end portion of the memory hole MH is not obstructed.

Figure 50:
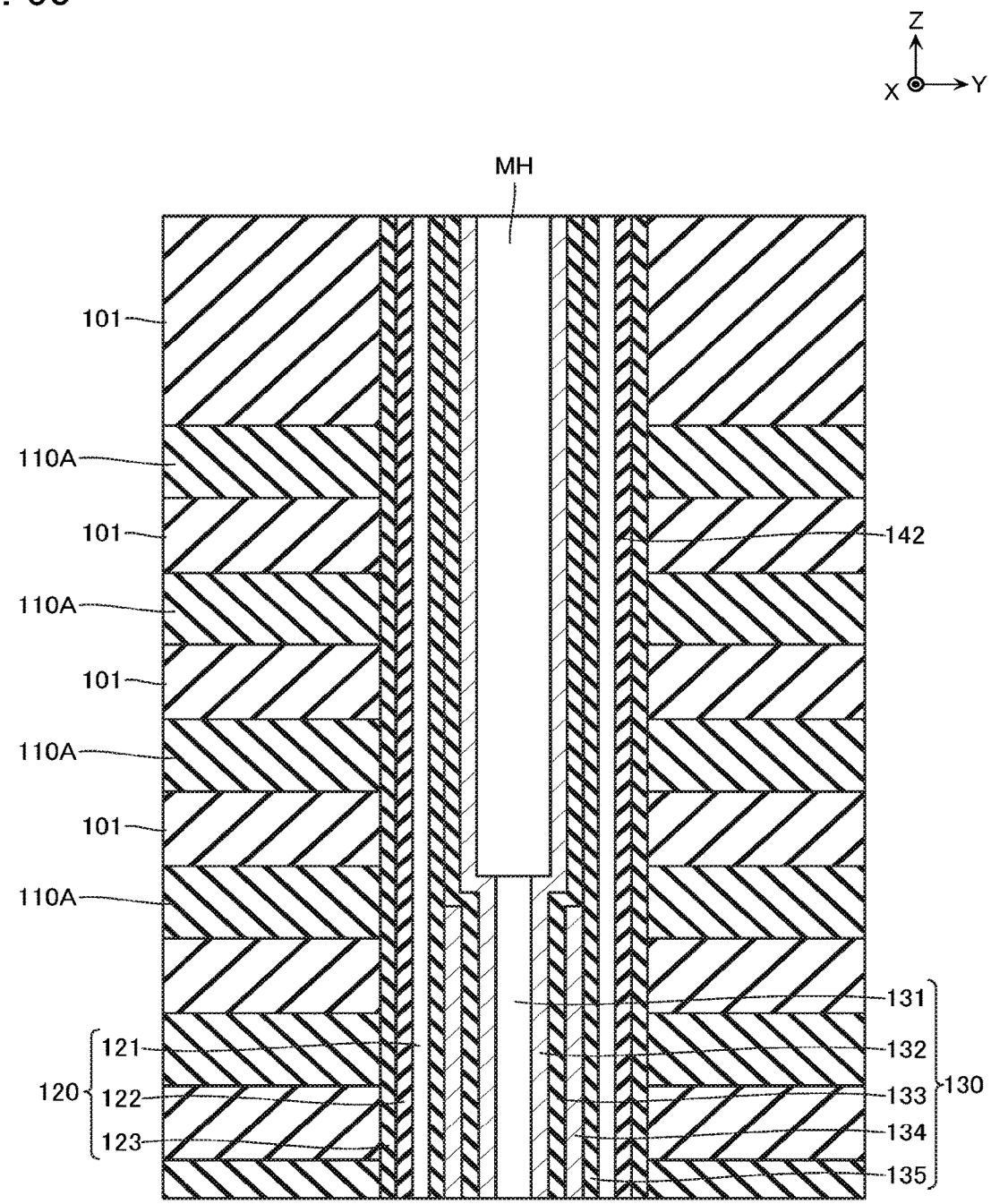
FIG. 50 is a schematic cross-sectional view describing the manufacturing method.

Next, for example, as illustrated in FIG. 50, a part of the semiconductor layer 131 is removed to expose the inner peripheral surface of the conductive layer 132 at the inside of the memory hole. For example, this process is performed by a method, such as wet etching.

Figure 51:
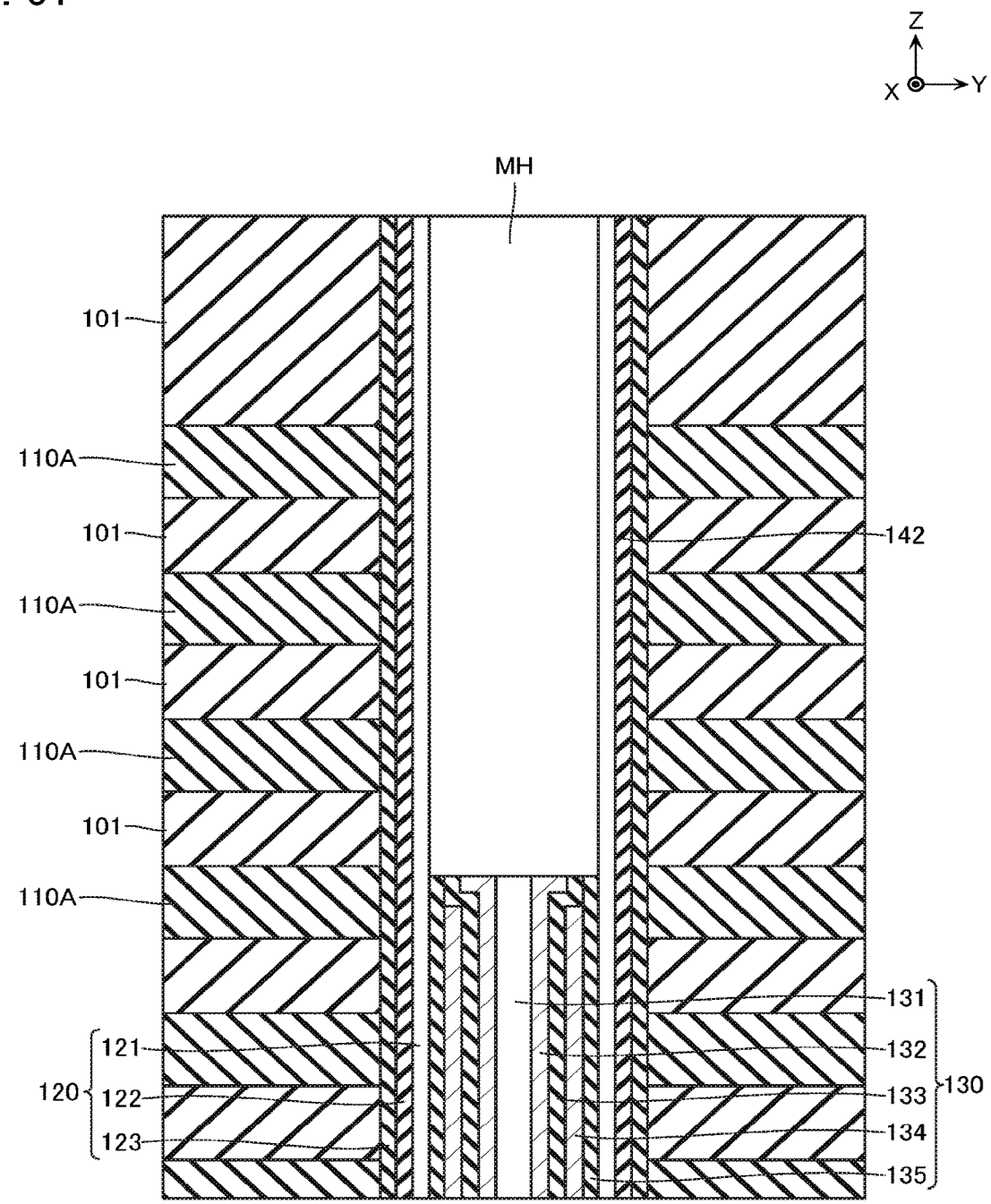
FIG. 51 is a schematic cross-sectional view describing the manufacturing method.

Next, for example, as illustrated in FIG. 51, a part of the conductive layer 132, the ferroelectric film 133, and the insulating layer 135 are removed to expose the inner peripheral surface of the semiconductor layer 121 at the inside of the memory hole. For example, this process is performed by a method, such as wet etching.

Figure 52:
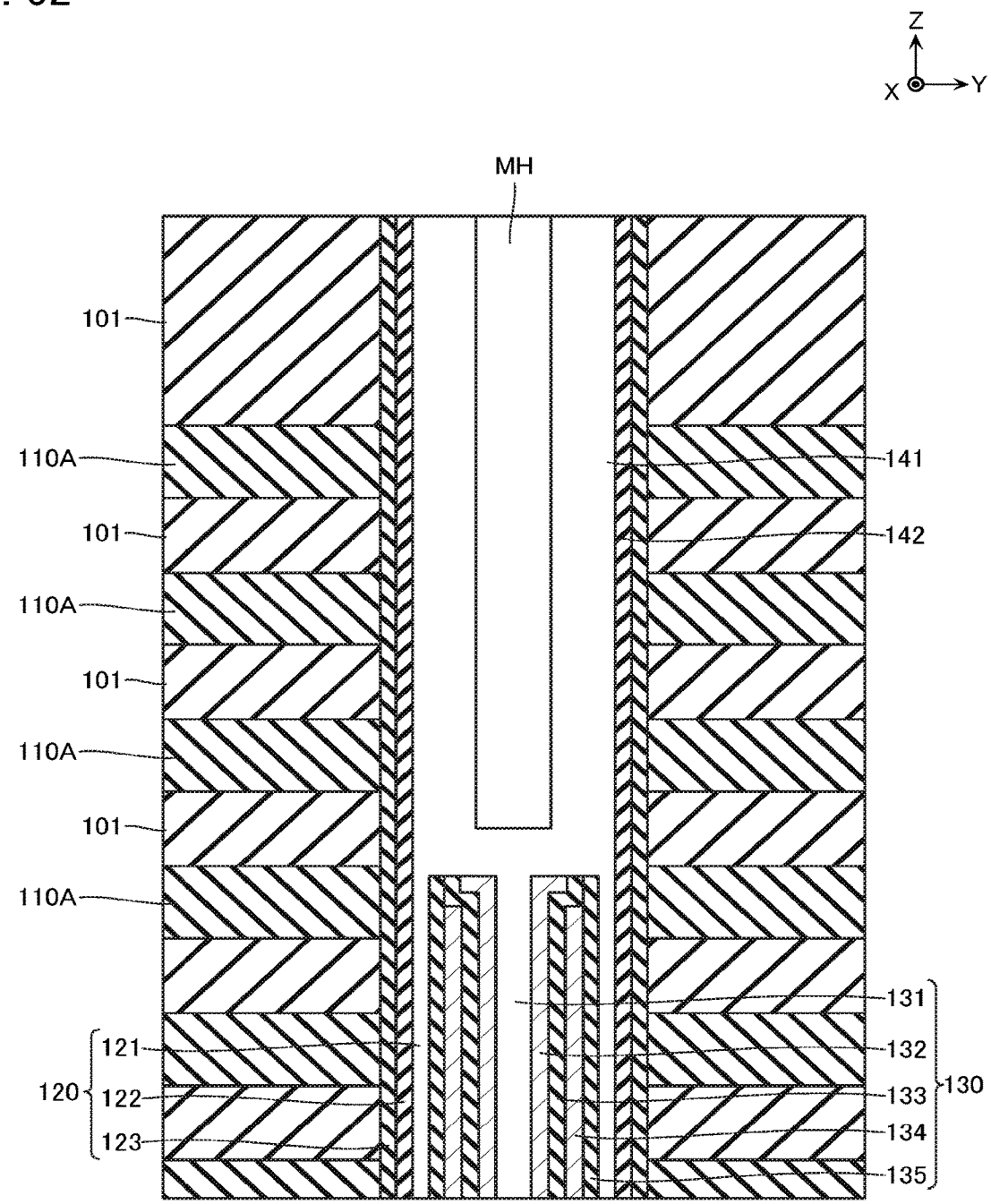
FIG. 52 is a schematic cross-sectional view describing the manufacturing method.

Next, for example, as illustrated in FIG. 52, the semiconductor layer 141 is formed at the inside of the memory hole MH. For example, this process is performed by a method, such as CVD. For example, the semiconductor layer 141 is formed to be thin to the extent that the upper end portion of the memory hole MH is not obstructed.

Figure 53:
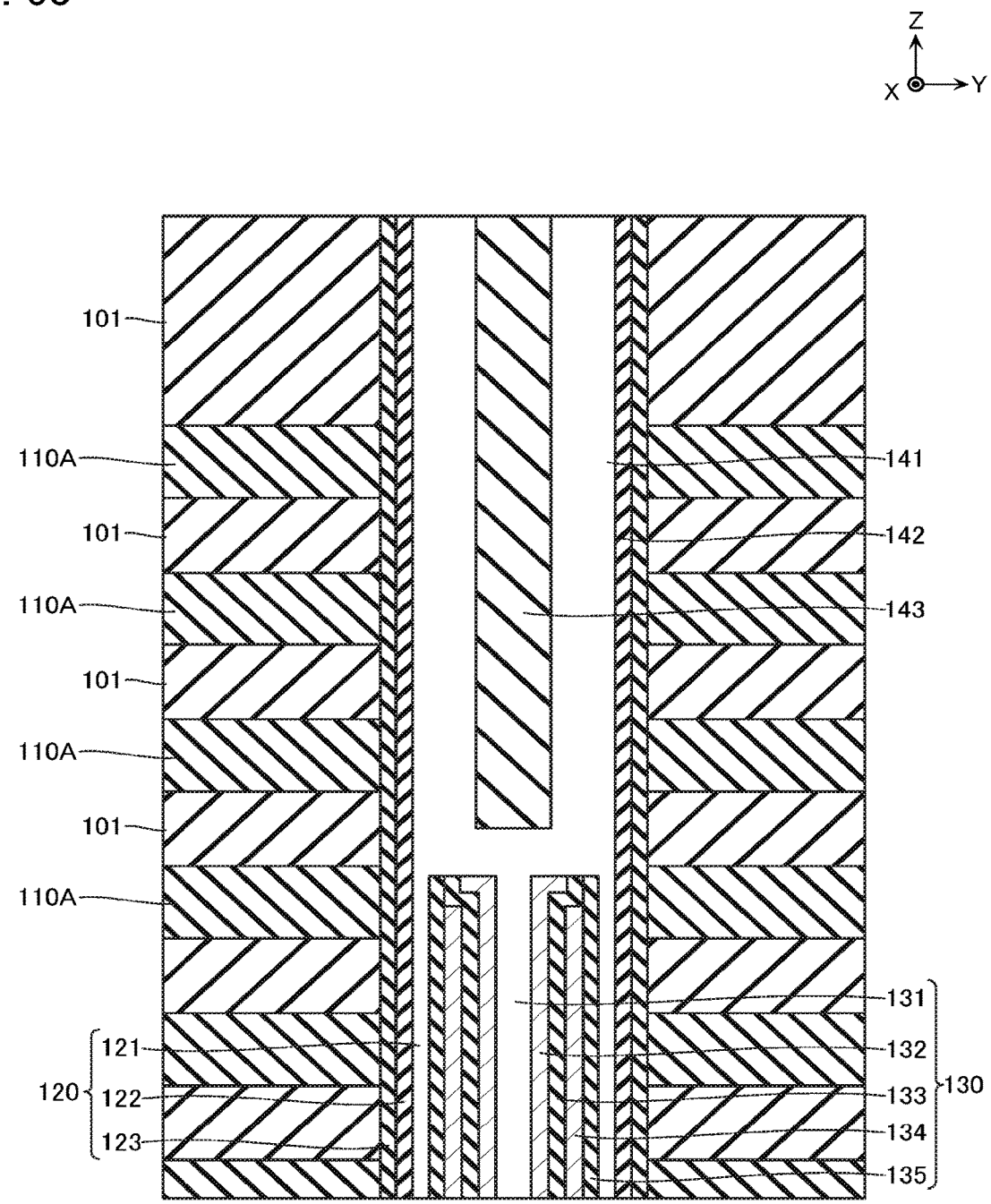
FIG. 53 is a schematic cross-sectional view describing the manufacturing method.

Next, for example, as illustrated in FIG. 53, the insulating layer 143 is formed at the inside of the memory hole MH. For example, this process is performed by a method, such as CVD.

Figure 54:
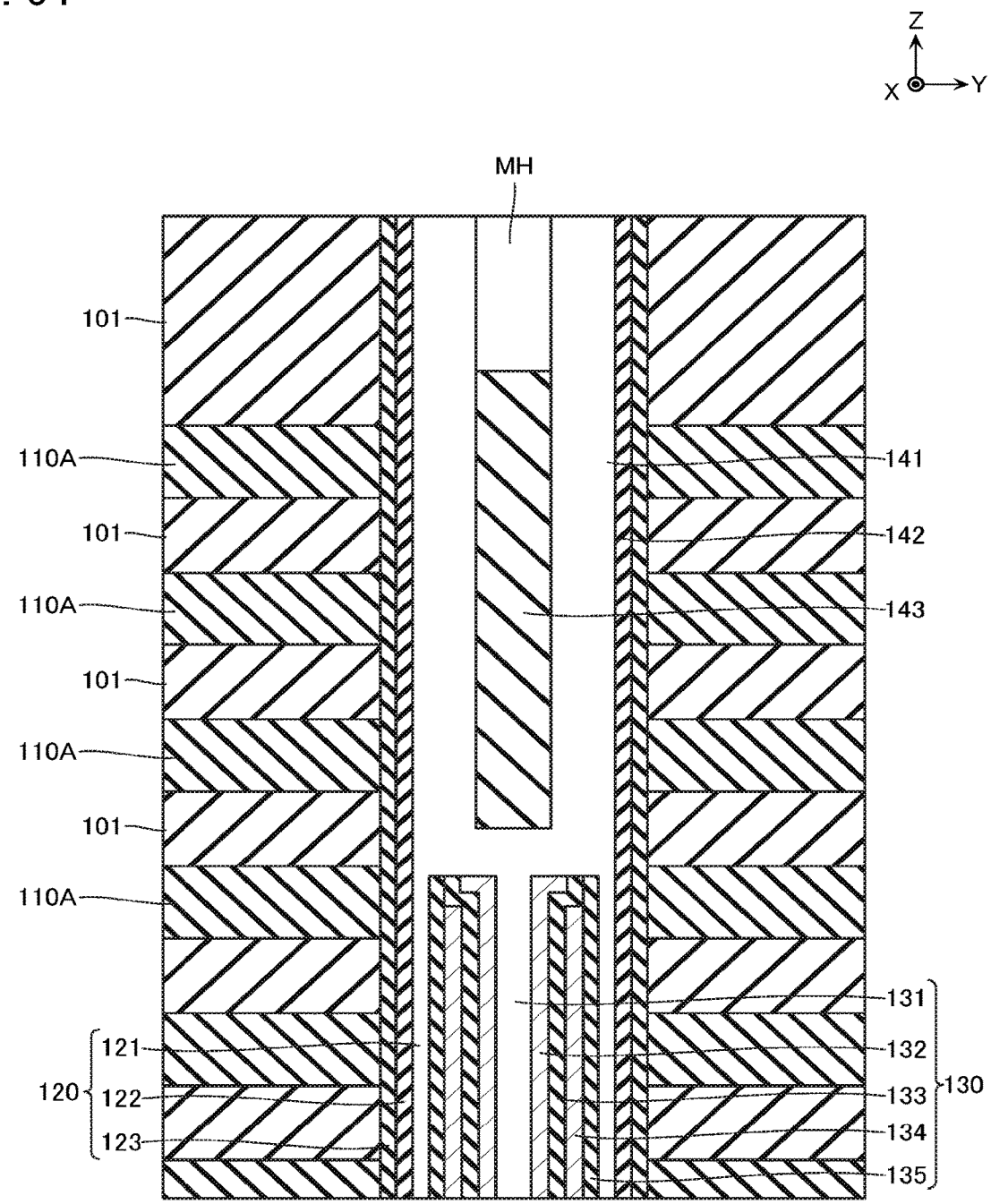
FIG. 54 is a schematic cross-sectional view describing the manufacturing method.

Next, for example, as illustrated in FIG. 54, a part of the insulating layer 143 is removed to expose the inner peripheral surface of the semiconductor layer 141 at the inside of the memory hole. For example, this process is performed by a method, such as RIE.

Figure 55:
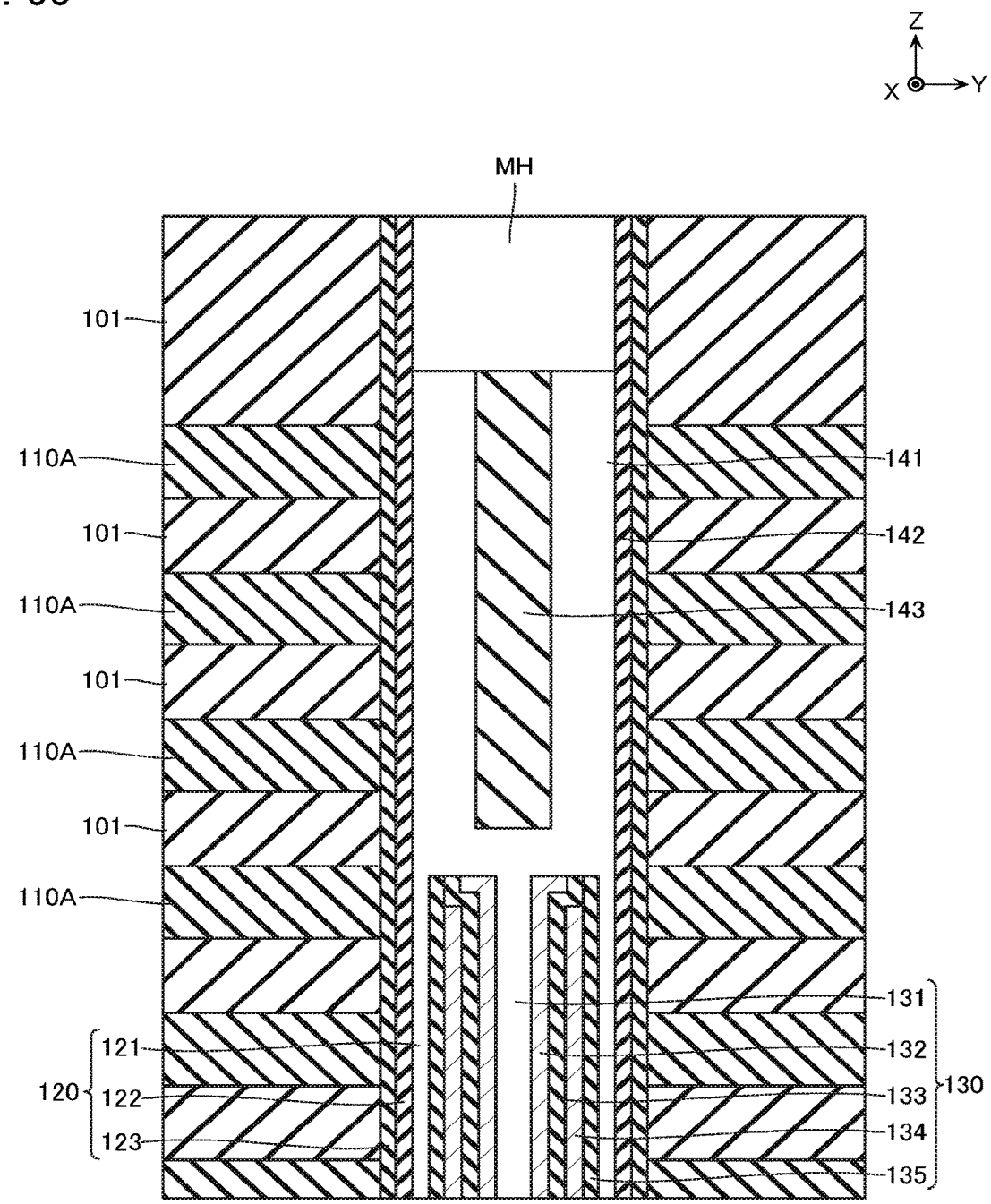
FIG. 55 is a schematic cross-sectional view describing the manufacturing method.

Next, for example, as illustrated in FIG. 55, a part of the semiconductor layer 141 is removed to expose the inner peripheral surface of the insulating layer 122 at the inside of the memory hole. For example, this process is performed by a method, such as wet etching.

Figure 56:
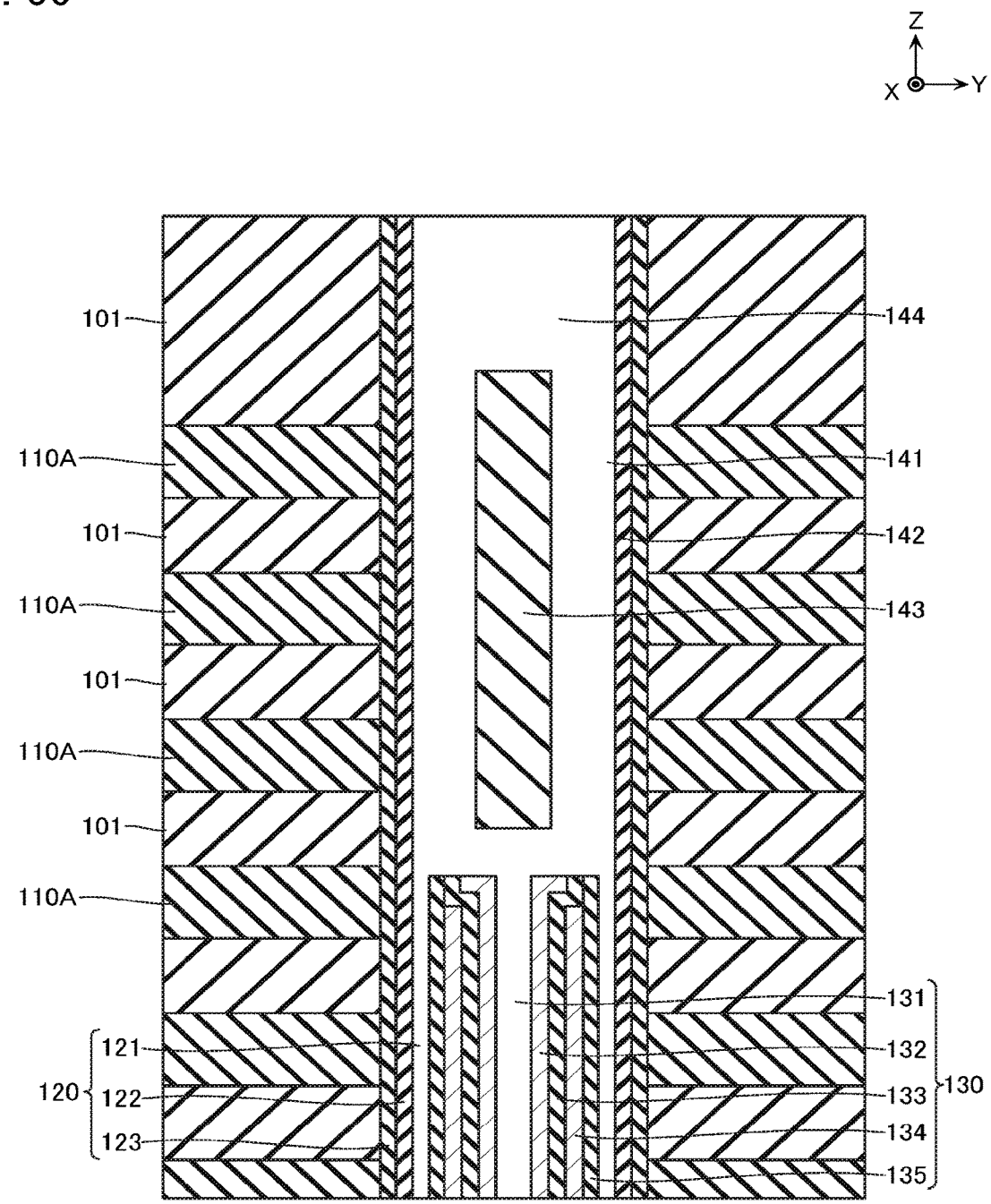
FIG. 56 is a schematic cross-sectional view describing the manufacturing method.

Next, for example, as illustrated in FIG. 56, the impurity region 144 is formed at the inside of the memory hole MH. For example, this process is performed by a method, such as CVD.

Figure 57:
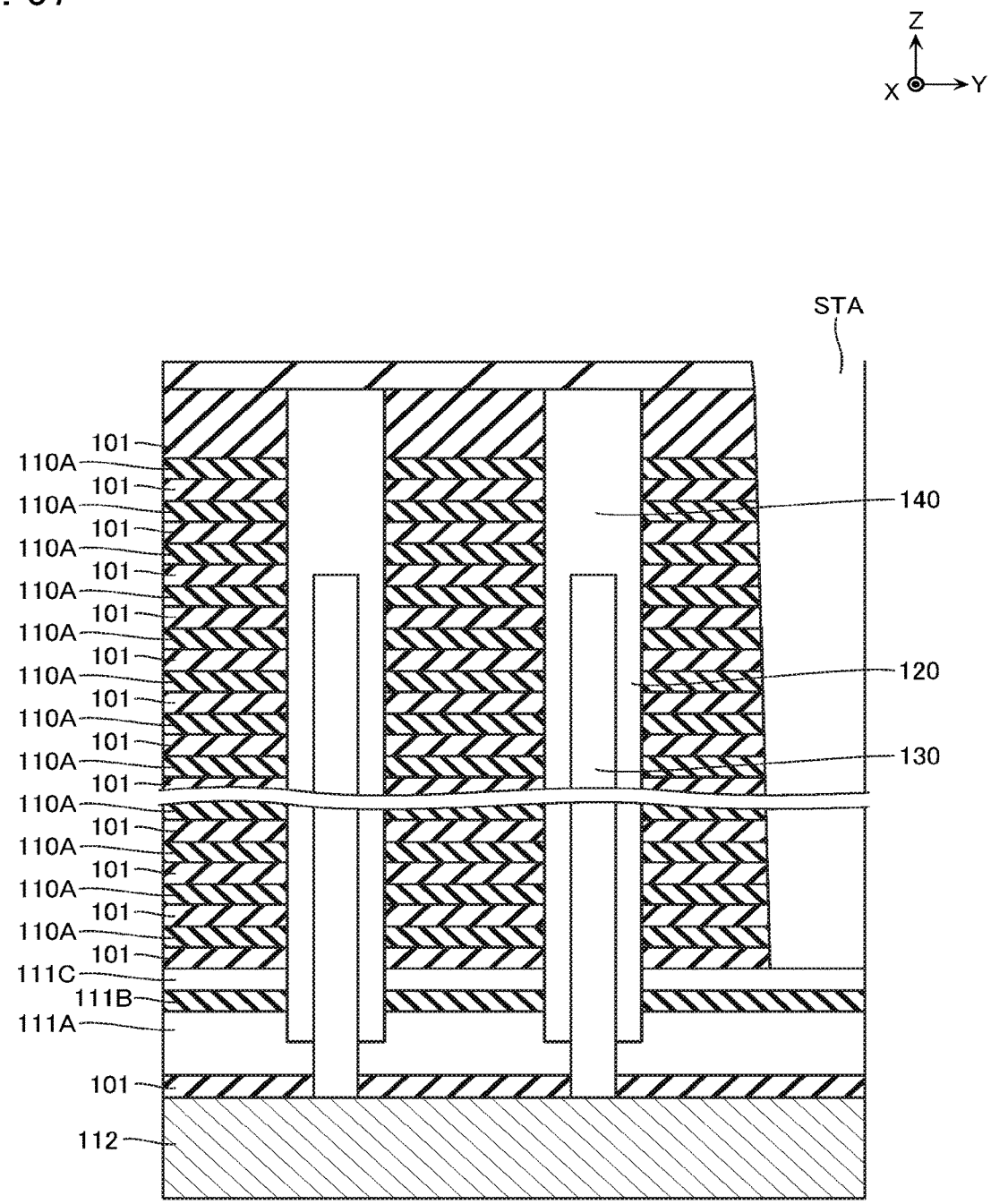
FIG. 57 is a schematic cross-sectional view describing the manufacturing method.

Next, for example, as illustrated in FIG. 57, a groove STA is formed. The groove STA is a groove that extends in the Z-direction and the X-direction, separates the insulating layer 101 and the sacrifice layers 110A in the Y-direction, and exposes the upper surface of the semiconductor layer 111C. For example, this process is performed by a method, such as RIE.

Figure 58:
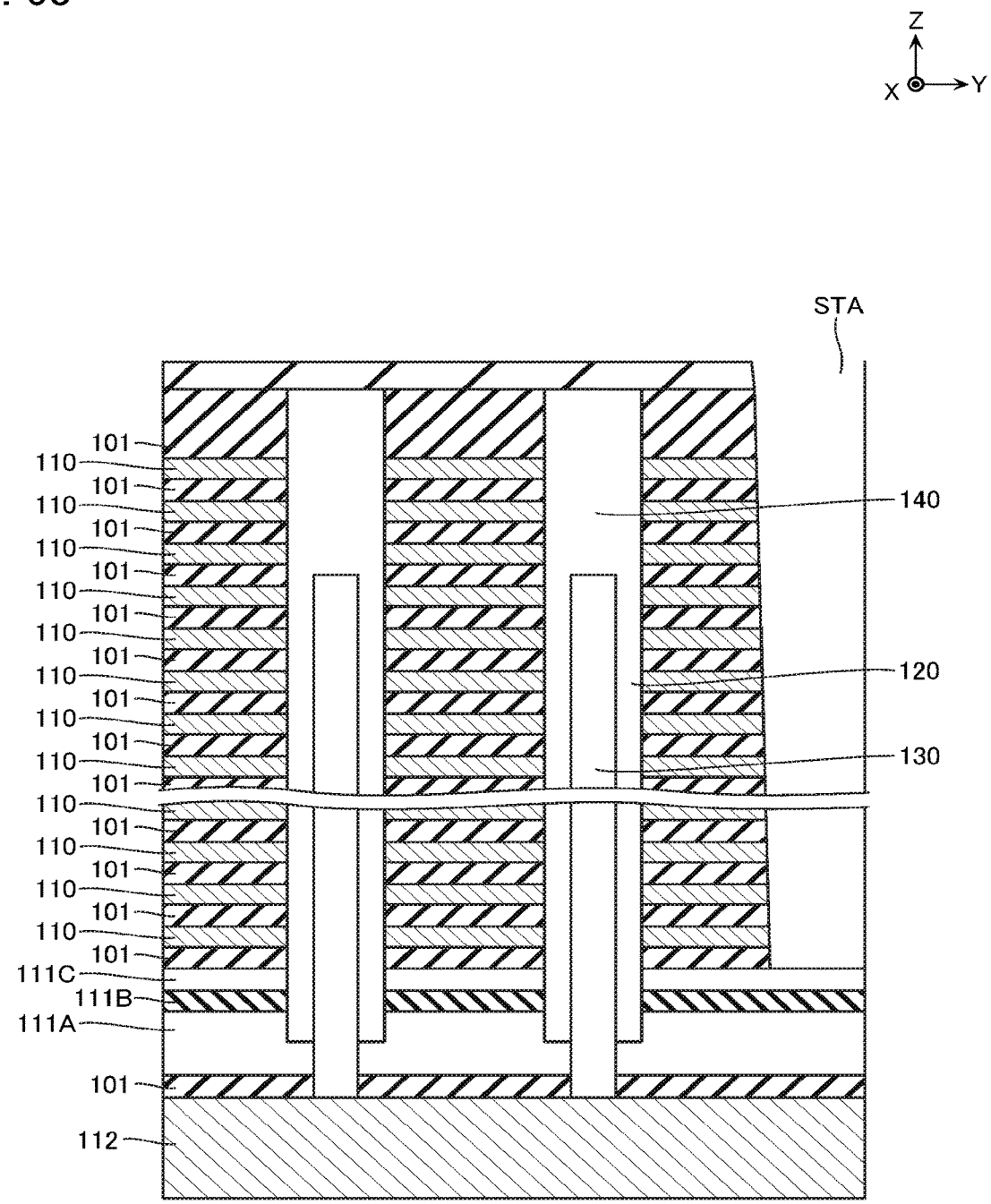
FIG. 58 is a schematic cross-sectional view describing the manufacturing method.

Next, for example, as illustrated in FIG. 58, the sacrifice layers 110A are removed via the groove STA. Thus, a hollow structure including the plurality of insulating layers 101 disposed in the Z-direction and the structure in the memory holes MH that support the insulating layers 101 are formed. For example, this process is performed by a method, such as wet etching.

For example, as illustrated in FIG. 58, the conductive layers 110 are formed. For example, this process is performed by a method, such as CVD.

Figure 59:
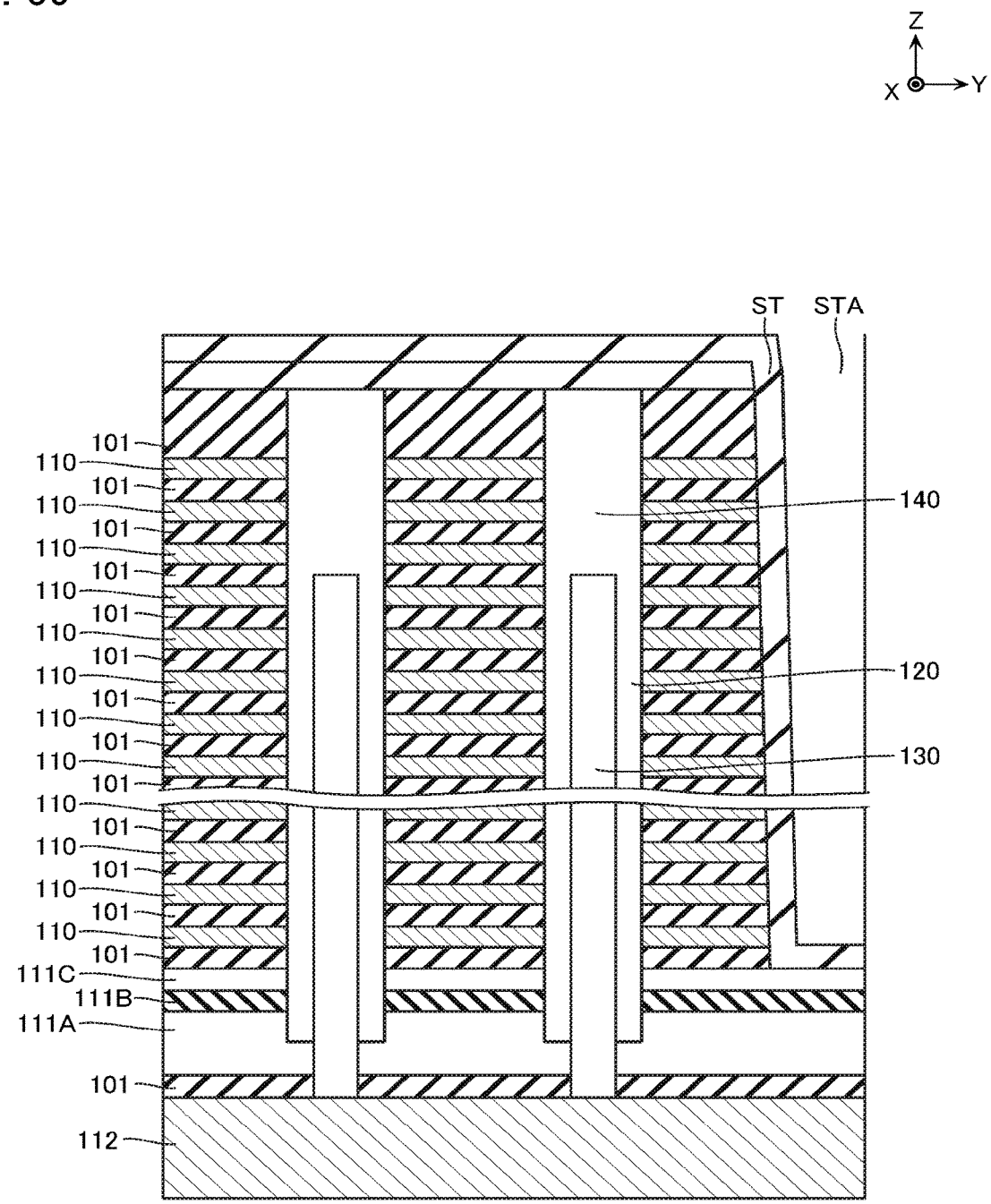
FIG. 59 is a schematic cross-sectional view describing the manufacturing method.

Next, for example, as illustrated in FIG. 59, a part of the inter-block insulating layer ST is formed on the inner wall of the groove STA. For example, this process is performed by a method, such as CVD. For example, apart of this inter-block insulating layer ST is formed to be thin to the extent that the groove STA is not obstructed.

Figure 60:
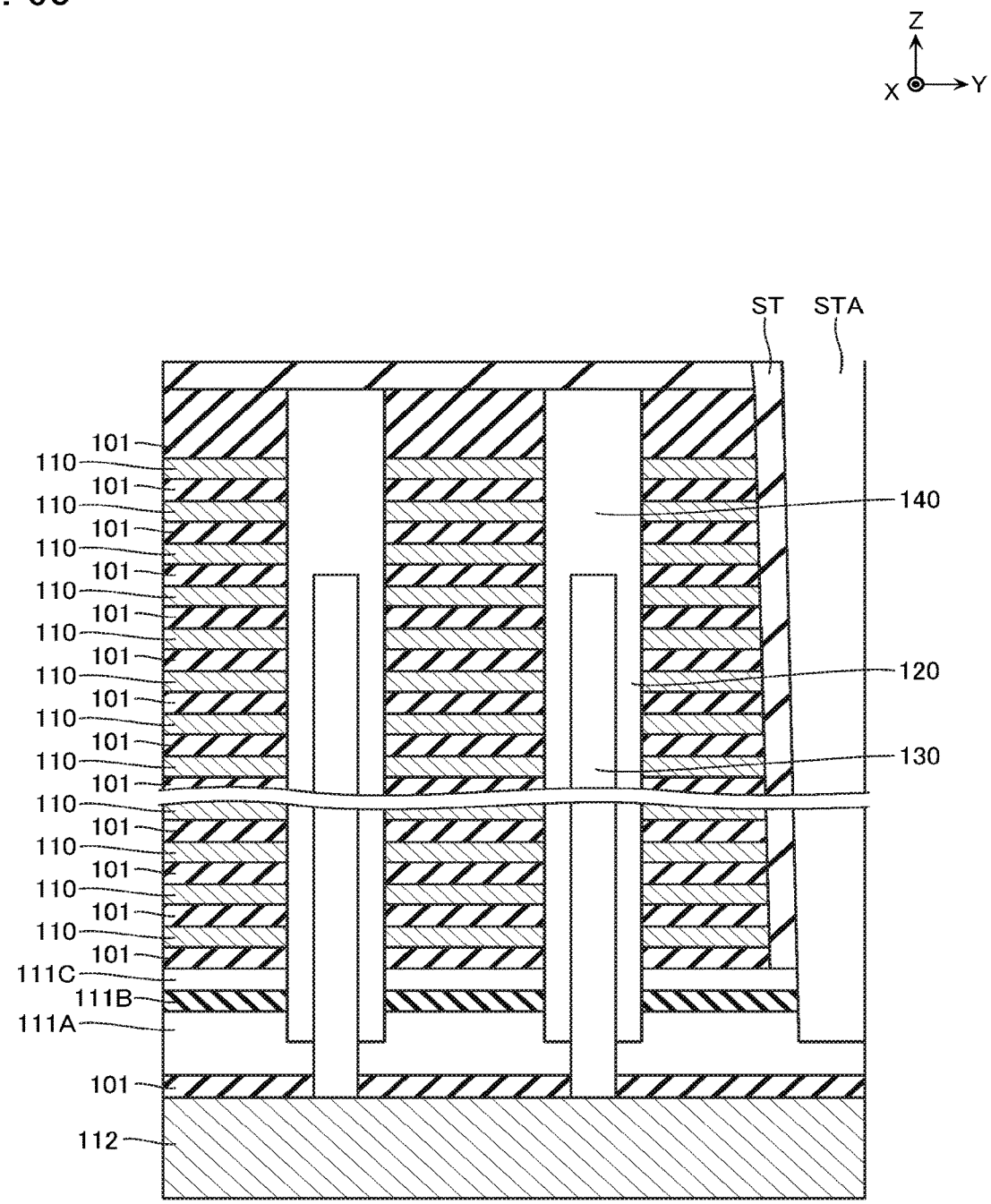
FIG. 60 is a schematic cross-sectional view describing the manufacturing method.

Next, for example, as illustrated in FIG. 60, a part of the inter-block insulating layer ST, the semiconductor layer 111C, and the sacrifice layer 111B formed on the bottom surface of the groove STA are removed to expose the upper surface of the semiconductor layer 111A. For example, this process is performed by a method, such as RIE.

Figure 61:
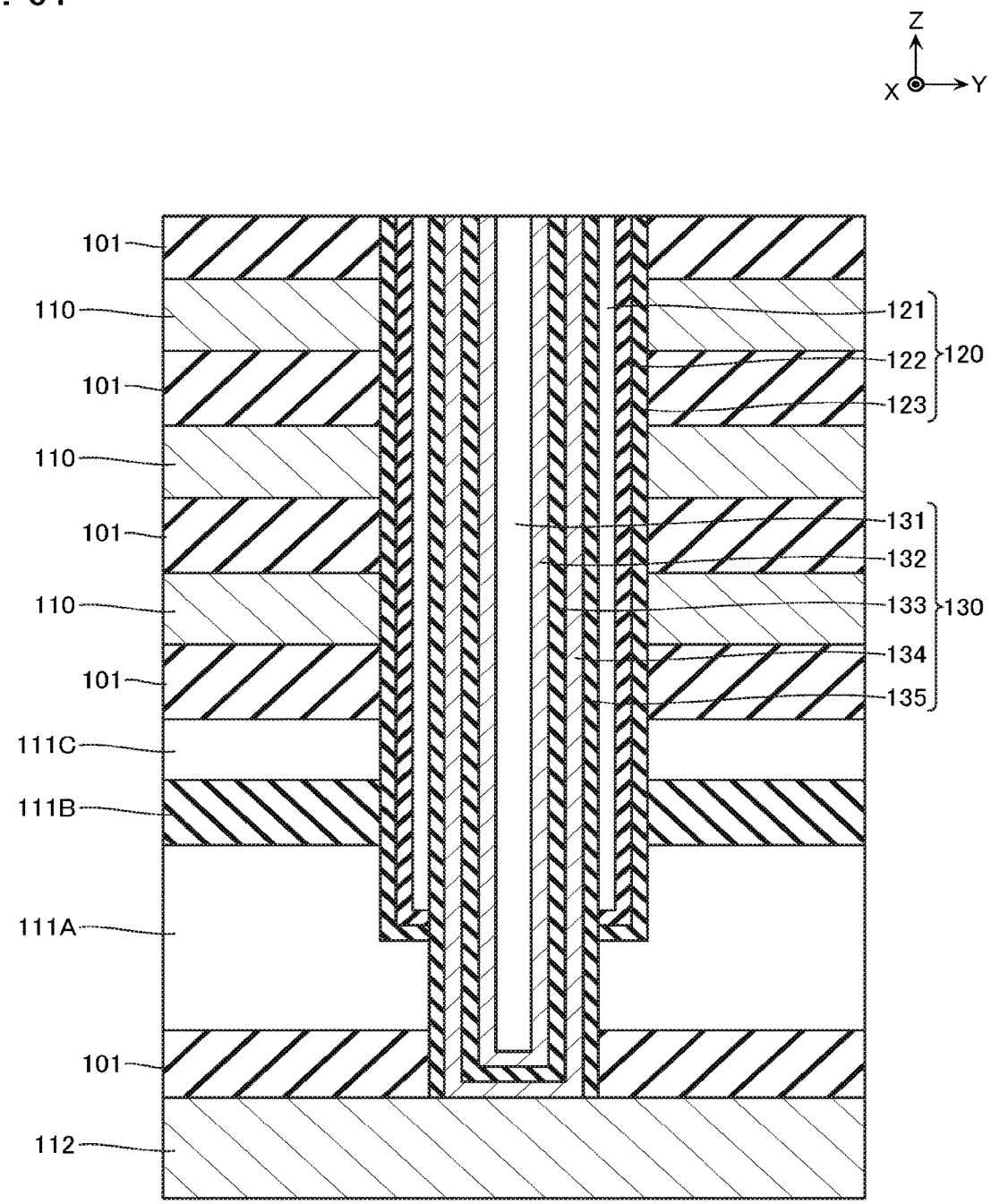
FIG. 61 is a schematic cross-sectional view describing the manufacturing method.
Figure 62:
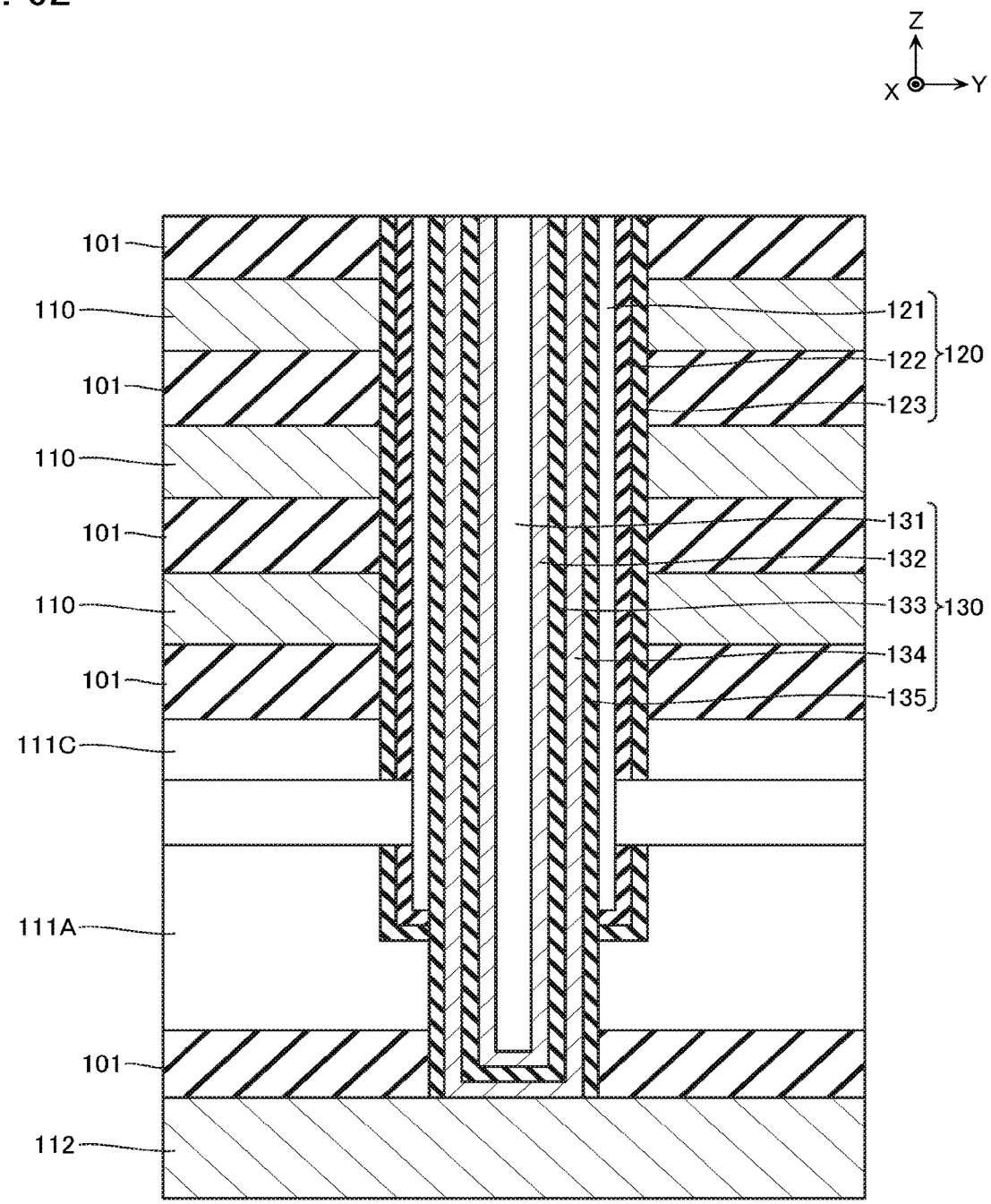
FIG. 62 is a schematic cross-sectional view describing the manufacturing method.

Next, for example, as illustrated in FIG. 61 and FIG. 62, the sacrifice layer 111B is removed. A part of the ferroelectric film 123 and the insulating layer 122 disposed near the sacrifice layer 111B are removed. For example, this process is performed by a method, such as wet etching.

Next, for example, as illustrated in FIG. 11, the conductive layer 111 is formed. For example, this process is performed by a method, such as epitaxial crystal growth.

Afterwards, the inter-block insulating layer ST is formed inside the groove STA, contacts, wirings, and the like are formed, and a wafer is separated by dicing. Thus, the memory die MD described with reference to FIG. 9 to FIG. 12 is formed.

Other Embodiments

The semiconductor memory devices according to the first embodiment to the fourth embodiment have been described above. However, the structures, the control methods, and the like described above are merely examples, and the specific aspects are appropriately adjustable.

For example, in the first embodiment to the fourth embodiment, the write sequence is performed in units of pages PG and the erase sequence is performed in units of memory blocks BLK. However, the method is merely an example, and the specific method is appropriately adjustable. For example, the write sequence may be performed by unit finer than that of the page PG, or the erase sequence may be performed by unit finer than that of the memory block BLK. Additionally, in the semiconductor memory devices according to the first embodiment to the fourth embodiment, random access may be performed. In the case, the unit smaller than the page PG may be corresponding to at least one memory cell $MC_R$ in the memory cell array $MCA_R$.

Figure 63:
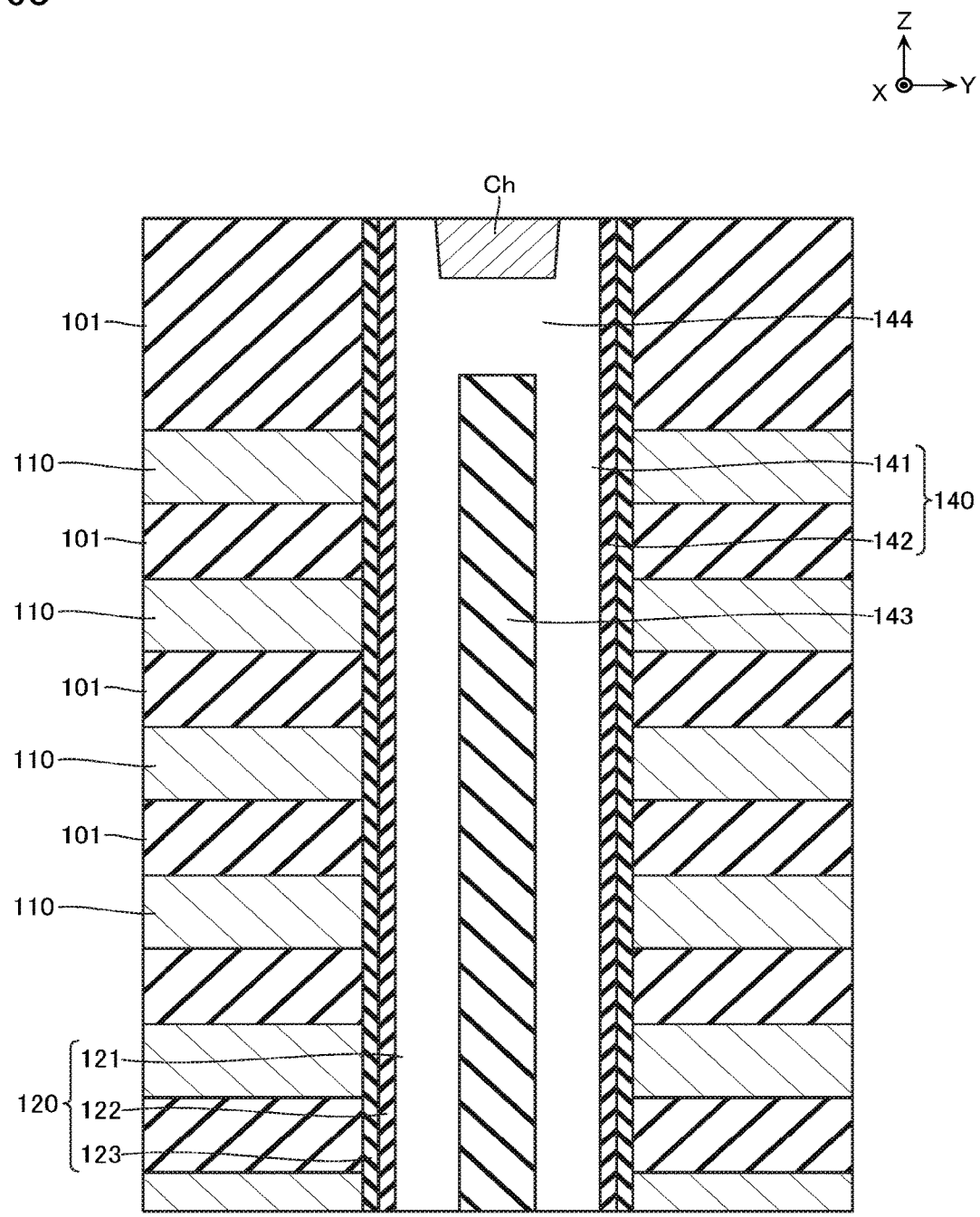
FIG. 63 is a schematic cross-sectional view describing a configuration of a semiconductor memory device according to another embodiment.

For example, in the first embodiment to the fourth embodiment, for example, as described with reference to FIG. 6 to FIG. 12, the capacitor structure 130 constituting the capacitor $C_R$ has been disposed inside the transistor structure 120 constituting the memory cell $MC_F$. However, the configuration is merely an example, and the specific configuration is appropriately adjustable. For example, as illustrated in FIG. 63, the capacitor structure 130 does not have to be provided inside the transistor structure 120.

Figure 64:
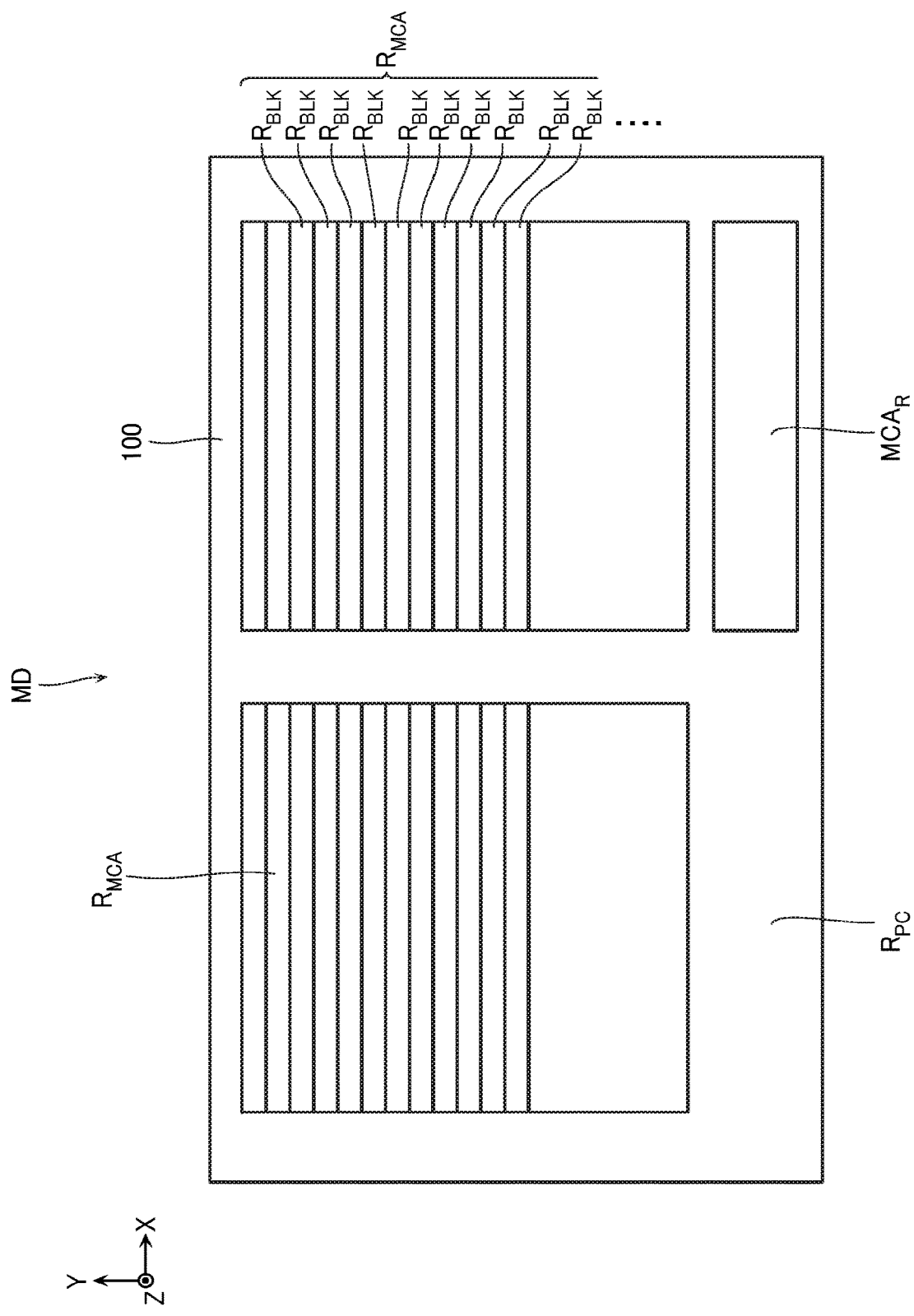
FIG. 64 is a schematic plan view describing a configuration of a semiconductor memory device according to another embodiment.

In the case, for example, as illustrated in FIG. 64, the memory cell array $MCA_R$ may be disposed in the peripheral circuit area $R_{PC}$.

Figure 65:
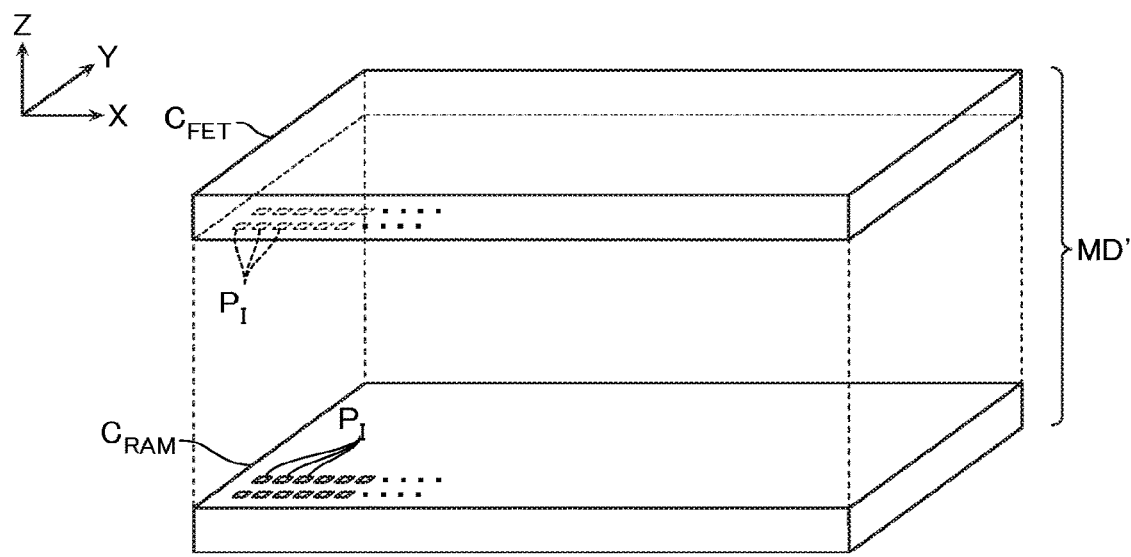
FIG. 65 is a schematic perspective view describing a configuration of a semiconductor memory device according to another embodiment.

In another case, for example, as illustrated in FIG. 65, instead of the memory die MD according to the first embodiment to the fourth embodiment, a memory die MD' that includes a chip $C_{FET}$ on which the memory cell array $MCA_F$ and the like are mounted and a chip $C_{RAM}$ on which the memory cell array $MCA_R$ and the like are mounted may be employed. Note that the chip $C_{FET}$ and the chip $C_{RAM}$ may include a plurality of bonding pad electrodes $P_I$ containing copper (Cu) or the like and may be electrically or physically connected via the plurality of bonding pad electrodes $P_I$.

Figure 66:
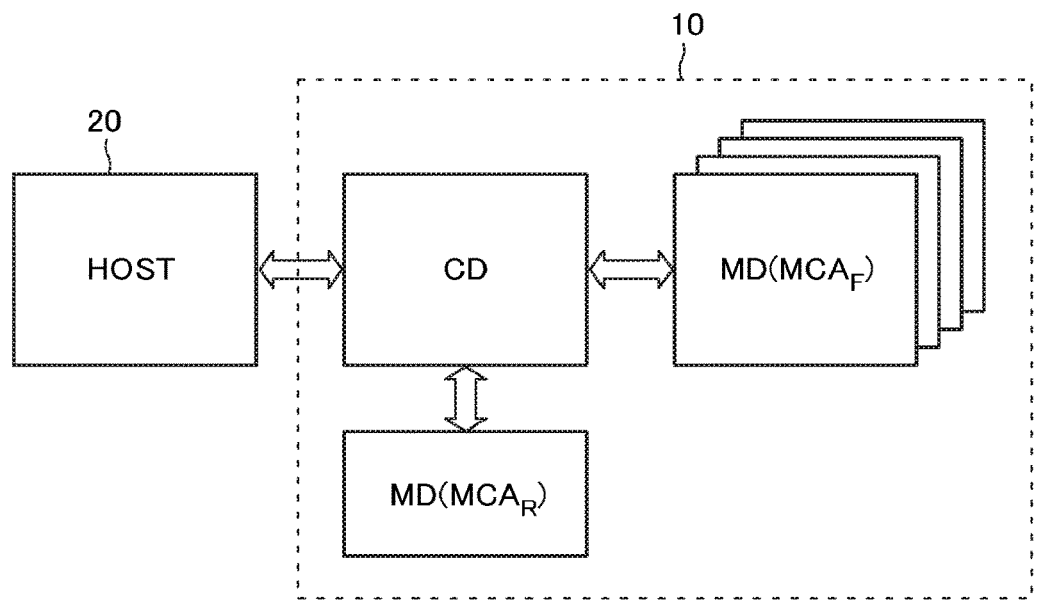
FIG. 66 is a schematic block diagram describing a configuration of a semiconductor memory device according to another embodiment.

In another case, for example, as illustrated in FIG. 66, the memory die MD ($MCA_F$) including the memory cell array $MCA_F$ and the memory die MD ($MCA_R$) including the memory cell array $MCA_R$ may be configured as different dies. In the case, the memory die MD ($MCA_F$) and the memory die MD ($MCA_R$) may be included in one package or may be included in different packages.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising
a first memory transistor, a first memory capacitor, and a control circuit connected to the first memory transistor and the first memory capacitor, wherein
the first memory transistor includes:
a first gate electrode;
a first semiconductor layer opposed to the first gate electrode; and
a first insulating film disposed between the first gate electrode and the first semiconductor layer and containing an insulating material,
the first memory capacitor includes:
a first electrode;
a second electrode opposed to the first electrode; and
a second insulating film disposed between the first electrode and the second electrode, the second insulating film containing the insulating material of the first insulating film,
the control circuit is configured to perform:
a first program operation that supplies the first gate electrode with a first program voltage;
a second program operation that supplies the first gate electrode with a second program voltage larger than the first program voltage; and
a first read operation that supplies at least one of the first electrode or the second electrode with a voltage, wherein
the control circuit performs the first program operation or the second program operation after performing the first read operation.

2. The semiconductor memory device according to claim 1, comprising:

a plurality of the first gate electrodes arranged in a first direction;

the first semiconductor layer extending in the first direction; and the first insulating film disposed between the plurality of first gate electrodes and the first semiconductor layer.

3. The semiconductor memory device according to claim 2, comprising:

the first electrode extending in the first direction, the first electrode having an outer peripheral surface covered with the first semiconductor layer; and the second electrode extending in the first direction, the second electrode having an outer peripheral surface covered with the first electrode.

4. The semiconductor memory device according to claim 1, wherein the first insulating film and the second insulating film contain oxygen (O) and hafnium (Hf).

5. The semiconductor memory device according to claim 4, wherein the first insulating film and the second insulating film contain orthorhombic crystals as a crystalline structure.

6. The semiconductor memory device according to claim 1, wherein the insulating material of the first insulating film and the second insulating film is a ferroelectric material.

* * * * *